United States Patent [19]
Kuribayashi et al.

[11] Patent Number: 6,002,650
[45] Date of Patent: Dec. 14, 1999

[54] METHOD AND APPARATUS FOR FORMING MOUNTING DATA, AND STORAGE MEDIUM USED THEREFOR, AND METHOD AND APPARATUS FOR MOUNTING COMPONENTS USING THE SAME

[75] Inventors: Takeshi Kuribayashi, Nakakoma-gun; Yasuhiro Maenishi, Kofu; Hiroyoshi Nishida, Nakakoma-gun; Nobuyuki Nakamura, Kofu, all of Japan

[73] Assignee: Matsushita Electric Co., Ltd., Osaka, Japan

[21] Appl. No.: 08/913,630

[22] PCT Filed: Jan. 23, 1997

[86] PCT No.: PCT/JP97/00139

§ 371 Date: Sep. 19, 1997

§ 102(e) Date: Sep. 19, 1997

[87] PCT Pub. No.: WO97/27522

PCT Pub. Date: Jul. 31, 1997

[30] Foreign Application Priority Data

Jan. 26, 1996 [JP] Japan ...................................... 8-11555
Jan. 26, 1996 [JP] Japan ...................................... 8-11641

[51] Int. Cl.⁶ ........................ G05B 19/4097; H05K 13/04
[52] U.S. Cl. .................... 367/468.24; 700/106; 700/114; 700/121; 395/500.1; 29/703
[58] Field of Search ..................................... 700/114, 106, 700/117, 97, 96, 121; 345/356, 357, 964, 965, 969; 29/703, 739, 740, 714; 395/500.09, 500.1, 500.11

[56] References Cited

U.S. PATENT DOCUMENTS

| | | | |
|---|---|---|---|
| 5,165,015 | 11/1992 | Coggins | 345/356 |
| 5,272,641 | 12/1993 | Ford et al. | 364/468.03 |
| 5,564,183 | 10/1996 | Satou et al. | 29/840 |
| 5,743,005 | 4/1998 | Nakao et al. | 364/468.28 X |
| 5,777,876 | 7/1998 | Beauchesne | 364/468.05 X |

FOREIGN PATENT DOCUMENTS

| | | |
|---|---|---|
| 1-145900 | 6/1989 | Japan . |
| 3-217091 | 9/1991 | Japan . |
| 5-225292 | 9/1993 | Japan . |

OTHER PUBLICATIONS

"Computer Applications In Production and Engineering", May 1995, Beijing China, pp. 579–586, XP000672868, Hashiba et al.

Elektronik, vol. 43, No. 20, Oct. 4, 1994, pp. 92–94, 96–98, XP000445340, Kroll J:"Finden Statt Suchen Multimedia-Detenbank Fur Elektronische Bauteile: Der Katalog Auf CD Feiert Premiere".

Printed Circuit Desing, vol. 12, No. 10, Oct. 1995, US, pp. 17–19, XP000672813, Clark: "edif technical center" see p. 18, column 1, line 44—column 2, line 9.

*Primary Examiner*—Paul P. Gordon
*Attorney, Agent, or Firm*—Wenderoth, Lind & Ponack, L.L.P.

[57] ABSTRACT

A method for forming mounting data, includes reading component text data corresponding to to-be-mounted components of individual mounting positions stored in a component electronic catalog, according to mounting-position data including mounting angles relating to the mounting positions formed on the to-be-mounted components, by using the component electronic catalog that has stored image data concerning various types of components including the to-be-mounted components as well as component text data necessary for component mounting including configurations and dimensions of the components. The method also includes forming mounting data for a mounter to receive components and mount them to specified mounting positions according to the mounting-position data as well as the component text data read for the individual mounting components concerning the to-be-mounted components corresponding to the mounting-position data.

33 Claims, 57 Drawing Sheets

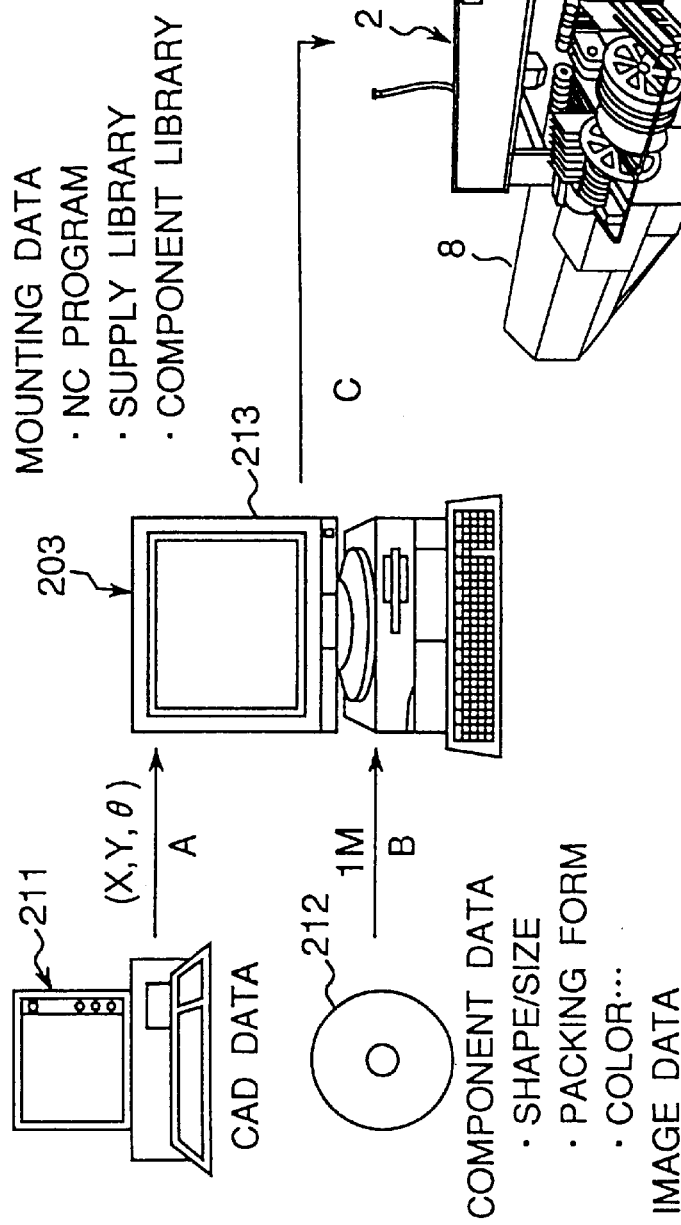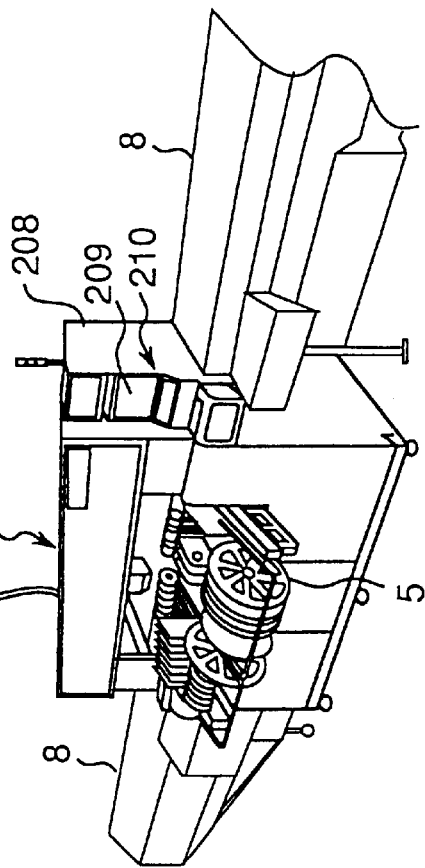

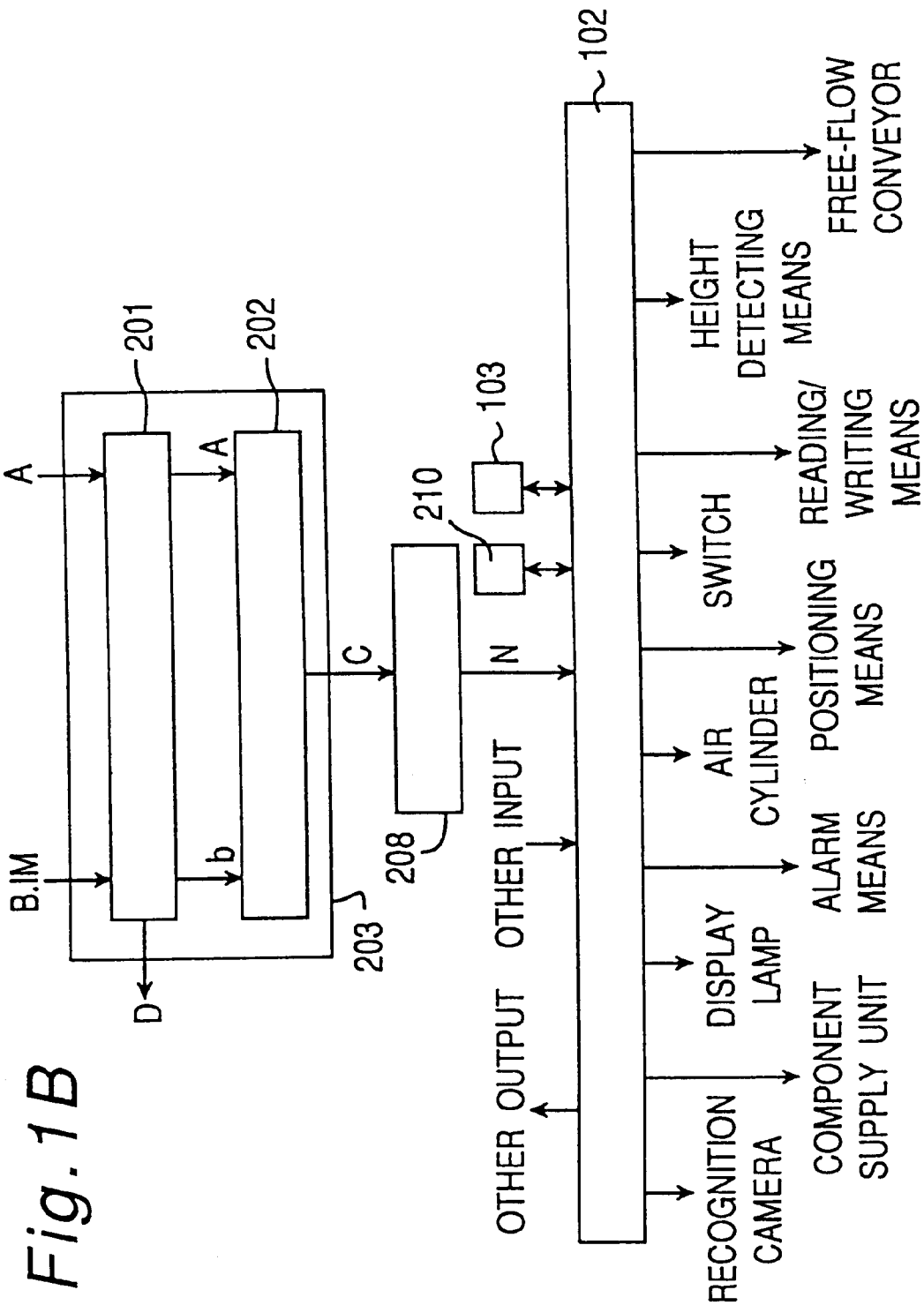

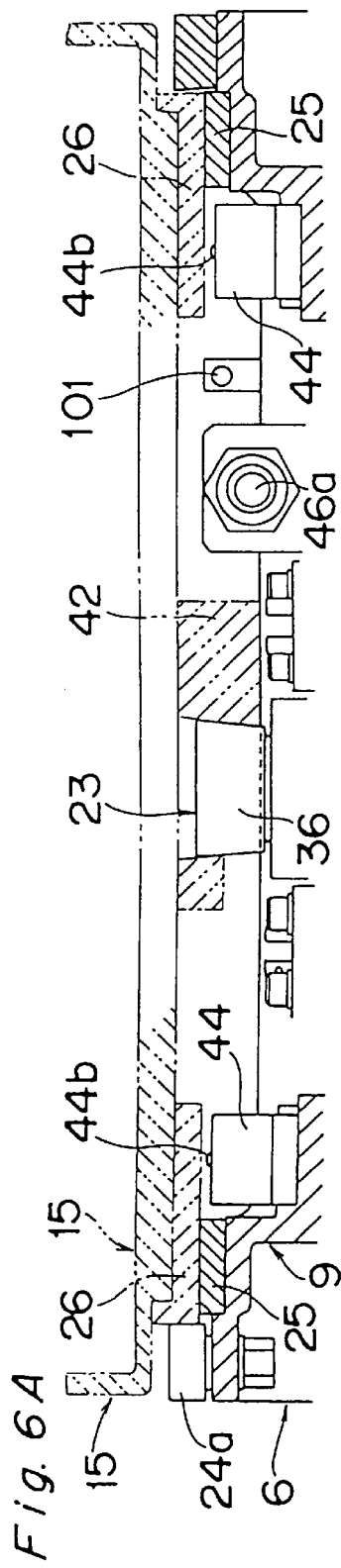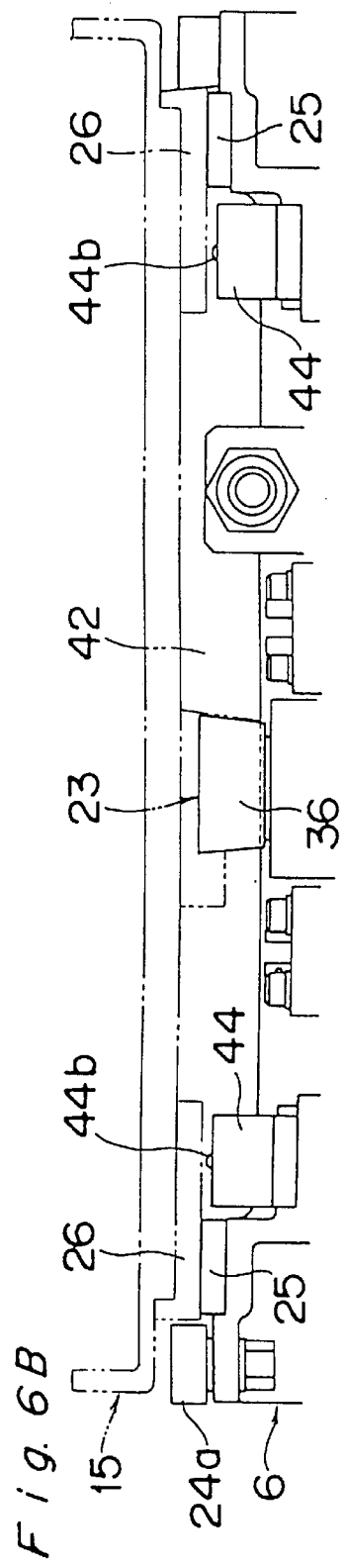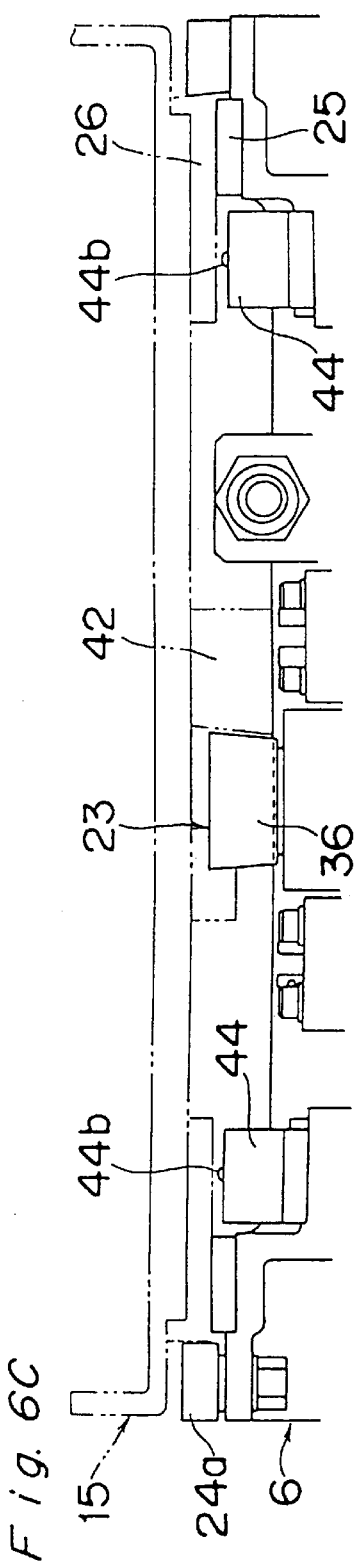

Fig.14A
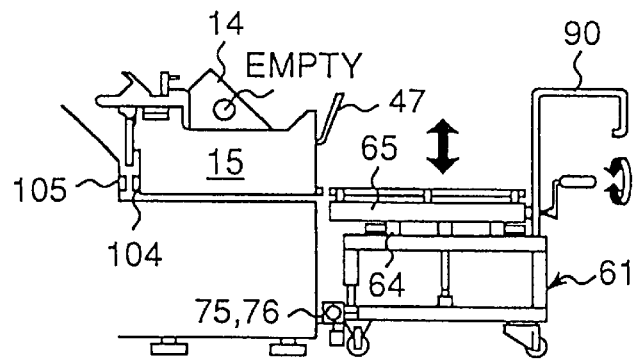
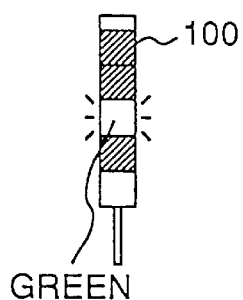
Fig.14B
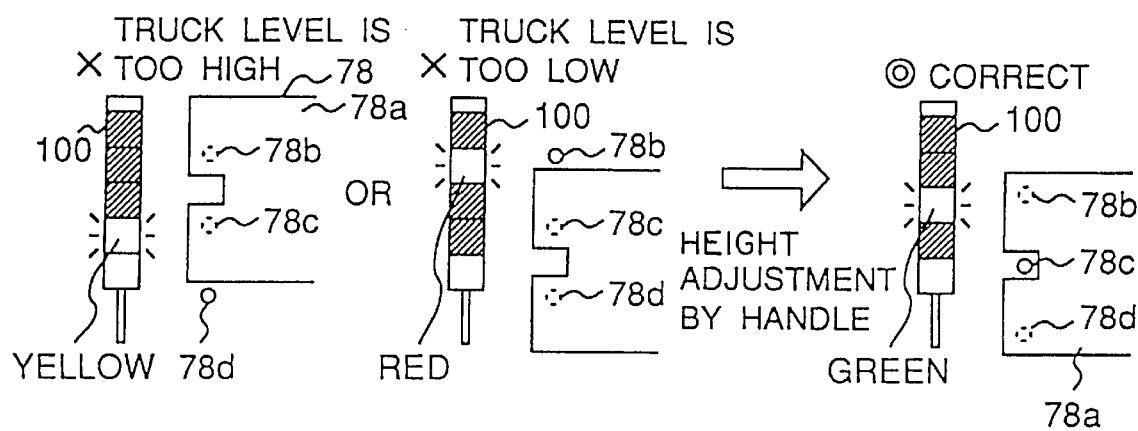

Fig. 24

| | Component id (new) | : | Component id (origin) | : | Cno. | Pnt-X: | Pnt-Y: | Angle:Form |
|---|---|---|---|---|---|---|---|---|
| 1 | | | | | | | | |
| 2 | #PC00001 | : | #PC00001 | : | 191: | 320.000: | 5.000: | 0.000:Flg |
| 3 | #PC00002 | : | #PC00002 | : | 192: | 5.000: | 5.000: | 0.000:Flg |
| 4 | #PC00003 | : | #PC00003 | : | 198: | 3.750: | 186.500: | 0.000:Flg |
| 5 | #PC00004 | : | #PC00004 | : | 199: | 321.250: | 186.500: | 0.000:Flg |
| 6 | #PC00005 | : | #PC00005 | : | 15000: | 319.000: | 10.000: | 90.000:Flg |
| 7 | #PC00006 | : | #PC00006 | : | 15000: | 6.000: | 180.000: | 90.000:Flg |
| 8 | #PC00127 | : | #PC00127 | : | 32: | 100.000: | 182.000: | 0.000:Flg |
| 9 | #PC00128 | : | #PC00128 | : | 563: | 13.000: | 185.000: | 0.000:Flg |
| 10 | #PC00132 | : | #PC00132 | : | 563: | 101.000: | 75.000: | 90.000:Flg |
| 11 | #PC00133 | : | #PC00133 | : | 35: | 13.000: | 75.000: | 0.000:Flg |
| 12 | #PC00137 | : | #PC00137 | : | 15003: | 61.500: | 79.500: | 180.000:SMD C |
| 13 | #PC00138 | : | #PC00138 | : | 15013: | 39.500: | 149.000: | 0.000:SMD C |
| 14 | #PC00139 | : | #PC00139 | : | 915: | 56.000: | 91.000: | 90.000:DIP |
| 15 | #PC00140 | : | #PC00140 | : | 910: | 62.500: | 136.000: | 90.000:DIP |
| 16 | #PC00141 | : | #PC00141 | : | 930: | 32.000: | 131.500: | 0.000:DIP |
| 17 | #PC00142 | : | #PC00142 | : | 15013: | 36.000: | 133.500: | 90.000:SMD C |
| 18 | #PC00143 | : | #PC00143 | : | 923: | 46.000: | 128.500: | 180.000:DIP |
| 19 | #PC00256 | : | #PC00256 | : | 15002: | 67.500: | 34.000: | 90.000:SMD C |
| 20 | #PC00257 | : | #PC00257 | : | 15002: | 69.500: | 34.000: | 90.000:DIP |

Fig.25

START-COMPONENT-LIBRARY;
START-HEADER-BLOCK;
MAKER:Matsushita Electronics Corporation;
VERSION:1.01;
CREATE:95/12/15;
START-PACKAGE-SYMBOL;
E=PACKAGE WIDTH;
D=PACKAGE LENGTH;
A=MOUNTING HEIGHT;
A1=STAND-OFF HEIGHT;
A2=MAIN BODY HEIGHT;
e=STRAIGHT INTERVAL OF TERMINALS;
b=TERMINAL WIDTH;
b=TERMINAL ROOT WIDTH;
c=TERMINAL THICKNESS;
x=ALLOWBLE VALUE OF CENTER POSITION OF TERMINAL;
y=UNIFORMITY OF LOWEST SURFACE OF TERMINAL;
$\theta$=ANGLE OF FLAT PART OF TERMINAL;
ZE=PACKAGE OVERHANG;
ZD=PACKAGE OVERHANG;
L=LENGTH OF FLAT PART OF TERMINAL;
L1=TERMINAL LENGTH;
L2=LENGTH OF TAKE-OUT PART OF TERMINAL;
HE=TOTAL WIDTH;
HD=TOTAL LENGTH;
END-PACKAGE-SYMBOL;
START-TAPING-SYMBOL;
W=TAPE WIDTH;
P1=TAPE FEED PITCH;
t=EMBOSS DEPTH
ROTATE=TAPING DIRECTION (ANGLE);
TOTAL=COUNT OF STORED COMPONENTS;
END-TAPING-SYMBOL;

Fig.26

[NC PROGRAM]
NC PROGRAM NAME: PPHSCPU4M-R                           COUNT OF REMANING BLOCKS: 1878    COUNT OF REMANING MARK LANDS: 191
                                                                  COUNT OF BLOCKS: 122            COUNT OF MARK LANDS: 9

PROGRAM OFFSET  : X=+119.44  Y=+75.68                                    0.00                                              DATA TYPE:ABSOLUTE

| BLOCK NO. | X COORDINATES | Y COORDINATES | Z NO. | S&R | MOUNTING ANGLE | MOUNTING PROHIBITED | SKIP BLOCK | MARK INSTRUCTION | LAND INSTRUCTION | BAD MARK | MOUNTING HEIGHT |
|---|---|---|---|---|---|---|---|---|---|---|---|
| 1 | +0.00 | +0.00 | 1 | 00 | 0 | 0 | 0 | 2 | 0 | 0 | 0.00 |
| 2 | +63.26 | +25.24 | 15 | 00 | 0 | 0 | 0 | 0 | 0 | 0 | 0.00 |
| 3 | +60.72 | +48.10 | 15 | 00 | 0 | 0 | 0 | 0 | 0 | 0 | 0.00 |
| 4 | +68.34 | +48.10 | 15 | 00 | 0 | 0 | 0 | 0 | 0 | 0 | 0.00 |
| 5 | +56.75 | +25.24 | 15 | 00 | 0 | 0 | 0 | 0 | 0 | 0 | 0.00 |

CIRCUIT NO.[            ]        COMPONENT SHAPE CODE[            ]        COMPONENT NAME CODE[            ]

PROGRAM OFFSET (X) : INPUT RANGE   -1999.99~+1999.99 (mm)

Fig.27

[COMPONENT LIBRARY]
NO.3 COMPONENT SHAPE CODE: S016E

COMPONENT LIBRARY NAME: L1
COMPONENT KIND: 52    TYPE: 0    COLOR: 0

| COMPONENT SIZE | COMPONENT THICKNESS | THICKNESS ALLOWABLE RANGE | MOUNTING NOZZLE SELECTED | HEAD SPEED | CAMERA | SUCTION | RE-SUCTION LEVEL | PRECEDING SUCTION CHECK | LEAD LEVITATION DETECTION | LEVITATION DIRECTION | SUPPLY FORM | SUPPLY NUMBER OF TIMES | F NUMBER ROTATION | ROTATION |
|---|---|---|---|---|---|---|---|---|---|---|---|---|---|---|
| U 10.45 L 5.35 | | | | | | | | | | | | | | |
| D 10.45 R 5.35 | 1.50 | 0.15 | 3 | 3 | 2 | 2 | 1 | 3 | 0 | 0 | 3 | 0 | 1 | |

| LEAD OUTER SHAPE | LEAD PITCH | LEAD ALLOWANCE | COUNT OF LEADS | LEAD OFFSET | LEVITATION ALLOWANCE | ILLUMI-NATION | ELECTRODE SIZE | | CUT | CUT | CUT | CUT | CUT |
|---|---|---|---|---|---|---|---|---|---|---|---|---|---|
| U | 10.45 | 1.27 | 0.20 | 8 | 0.00 | 0.00 | 1 | LENGTH L 0.00 DIRECTION | 1 | 1 | 2 | 3 | 4 |
| D | 8.15 | | | 8 | 0.00 | 0.00 | | WIDTH L 0.00 COUNT | 1 | 0 | 1 | 1 | 1 |
| L | | | | 0 | 0.00 | 0.00 | | LENGTH R 0.00 POSITION | 0 | 0 | 0 | 0 | 0 |
| R | | | | 0 | 0.00 | 0.00 | | WIDTH R 0.00 | 0 | 0 | 0 | 0 | 0 |

COMPONENT SHAPE CODE: ENGLISH LETTERS AND NUMERALS WITHIN 16

Fig.28

[ARRANGEMENT PROGRAM]
ARRANGEMENT PROGRAM NAME: DPHSCPU4M-R

COUNT OF CASSETTES: 32    COUNT OF TRAYS: 40

| Z NO. | COMPONENT SHAPE CODE | COMPONENT NAME | COMPONENT SUCTION POSITION X | Y | MASTER Z NO. | SUPPLY CODE | SUPPLY | DISCARD | SUCTION HEIGHT |
|---|---|---|---|---|---|---|---|---|---|
| 8 | | | +0.00 | +0.00 | 0 | | | | 0.0 |
| 9 | S016T | ZSWX0003 | −116.50 | +0.00 | 0 | | | 1 | 0.0 |
| 10 | | | +0.00 | +0.00 | 0 | | | 1 | 0.0 |
| 11 | MELG2 | ZFLB0183 | −73.50 | +0.00 | 0 | | | 1 | 0.0 |
| 12 | | | +0.00 | +0.00 | | | | 1 | 0.0 |

COMPONENT SHAPE CODE: INPUT RANGE    MAXIMUM 16 LETTERS (WITHOUT INPUT: Z NO. CONCERNED NOT USED)

Fig.29

SUPPLY POSITION LIBRARY NAME: Y1
SUPPLY CODE: S0J40
COUNT OF SUPPLIES: 100

| | FIRST SUCTION POSITION | | FINAL SUCTION POSITION | | TRAY PITCH | | COUNT OF COMPONENTS | | | TAKE-OUT SPEED | COUNT OF EMPTY TRAYS |
|---|---|---|---|---|---|---|---|---|---|---|---|
| | X | Y | X | Y | X | Y | X | Y | TOTAL | | |
| | +12.00 | +14.00 | +147.45 | +284.45 | +15.05 | +30.05 | 10 | 10 | 100 | 2 | 0 |
| | 1 | 2 | 3 | 4 | 5 | 6 | 7 | 8 | 9 | START | |
| TRAY EMPTIED POSITION | X | Y | X | Y | X | Y | X | Y | X | Y | Y |
| | 0 | 0 | 0 | 0 | 0 | 0 | 0 | 0 | 0 | 0 | 0 |

SUPPLY CODE: ENGLISH LETTERS AND NUMERALS WITHIN 8

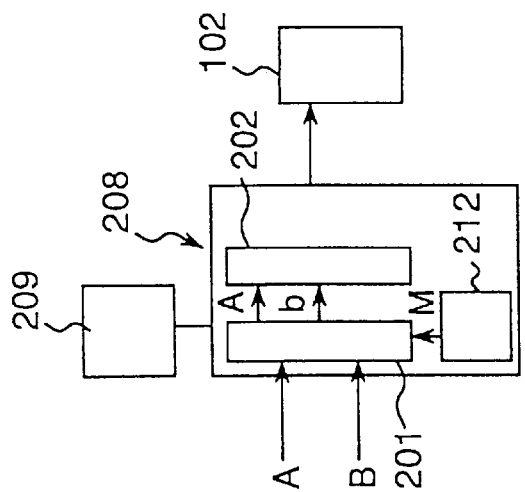
Fig.40F
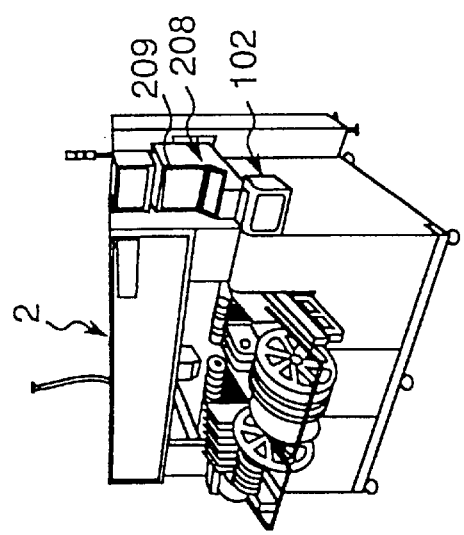
Fig.40E
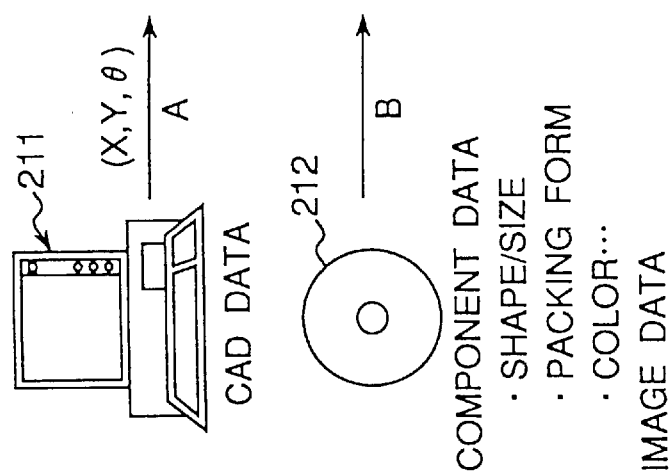

Fig. 43 PRIOR ART

| FILE(F) | SEARCH(S) | WINDOW(W) | | | | | | HELP(H) |
|---|---|---|---|---|---|---|---|---|

PRODUCT SEARCH

[SEARCH] [CLEAR] [EXPLANATION] [CANCEL]
TRANSISTORS
BIPOLAR TRANSISTORS(PNP)···2SA,2SB
[DISPLAY] [SEARCH CONDITION] [CANCEL]

1/62 CASES

| PRODUCT NAME | PACKAGE CODE | VCEO V | Ic A | Pc W | hFE(min) | hFE(max) |
|---|---|---|---|---|---|---|
| 2SA1018 | TO-92 | −200 | −0.07 | 0.75 | 60 | 220 |
| 2SA1022 | Mini3p | −20 | −0.03 | 0.2 | 70 | 220 |
| 2SA1034 | Mini3p | −35 | −0.05 | 0.2 | 180 | 700 |
| 2SA1035 | Mini3p | −55 | −0.05 | 0.2 | 180 | 700 |
| 2SA1123 | TO-92 | −150 | −0.05 | 0.75 | 130 | 450 |
| 2SA1127 | TO-92 | −55 | −0.1 | 0.4 | 180 | 700 |
| 2SA1128 | TO-92 | −20 | −0.5 | 0.6 | 90 | 220 |
| 2SA1254 | M | −20 | −0.03 | 0.4 | 70 | 220 |
| 2SA1309A | NS | −50 | −0.1 | 0.3 | 160 | 460 |
| 2SA1310 | NS | −55 | −0.1 | 0.3 | 180 | 700 |
| 2SA1323 | | | | | | |

METHOD AND APPARATUS FOR FORMING MOUNTING DATA, AND STORAGE MEDIUM USED THEREFOR, AND METHOD AND APPARATUS FOR MOUNTING COMPONENTS USING THE SAME

TECHNICAL FIELD

The present invention relates to a method and apparatus for preparing mounting data, as well as a storage medium used therefor, which makes it possible to form mounting data needed for automatic mounting mainly of electronic components onto a board with a mounter without manual input of component data needed for each component.

The present invention also relates to a component mounting method and apparatus for automatically mounting mainly electronic components to boards by a mounter.

BACKGROUND ART

There are many kinds of electronic components to be mounted to boards to produce various types of electronic circuit boards, some of which are replaceable with other kinds of components. The total number of kinds of electronic components is furthermore increased if compatible components among different manufacturers are included. In forming an electronic circuit board by mounting electronic components of various kinds to a board, it is necessary to select electronic components that meet various kinds of needs set in the design stage of the electronic circuit. In mounting the various kinds of components on boards, it is also necessary to that the mounting considerations not be mutually influenced by characteristics and durabilities of the electronic components to be mounted and other electronic components. A growing requirement these days is to correctly recognize shapes of components and highly accurately mount the components as a lead pitch is minimized in accordance with an increased density of components.

More specifically, the following factors should be taken into consideration when the electronic components are mounted to the board: the kind of nozzles and chucks for carrying the electronic components, a moving speed of a mounting head equipped with the nozzles and chucks, necessary fall positions of the nozzles and chucks when taking out the electronic components from a component supply section or mounting the components, that is, heightwise positions when the nozzles and chucks take out the electronic components or heightwise positions when the nozzles and chucks mount the electronic components to the board, a moving speed of the board which has at least one electronic component mounted thereon, particularly, an acceleration of the board and various kinds of allowances, etc.

These various kinds of electronic components are packed in tapes to be automatically supplied to the mounter or contained in trays, or handled in the form of sticks or in bulk. This component supply fashion or manner including an accommodation pitch or the like of components, i.e., packing forms of components should also be taken in mind when mounting data are to be formed.

Meanwhile, when the electronic components are mounted, whether or not the electronic components are properly selected or directed is recognized, so that improper components are exchanged or the direction of the components is corrected based on the recognition results. In order to achieve the above inspection, it is necessary to form inspection data, as the mounting data, on the basis of information related to the electronic components such as shapes, surface reflectivities, colors, hue, polarity marks, printed characters, and color codes marked on the components, etc.

Component catalog brochures have been used heretofore to form the above-described mounting data or inspection data and properly mount the selected components on boards so as to select electronic components of various kinds in conformity with the needs from the viewpoint of the circuit design and mount the selected electronic components properly. Detailed and complicated component information is edited and recorded for every kind of electronic component in the brochures according to a predetermined classification method. In some cases, electronic components have been actually measured with the use of calipers or the like to obtain necessary data.

It is difficult not only to actually measure the electronic components as above, but to search for the electronic components meeting the needs from the catalog brochures. The success of the optimum selection of required components depends on how carefully the catalog brochures are referred in detail, which consumes a large quantity of labor and time. In particular, the recent diversification of needs increases the number of kinds of electronic components which are provided, enlarging the amount of information data, thus hindering the optimum selection of components furthermore.

For solving the issue, a so-called component electronic catalog has been provided, whereby data of electronic components in the catalog brochures are handled as image data to be displayed on a screen. The image data edited and stored according to a predetermined classification method in the electronic catalog are read out and displayed on the screen by a special read device, a personal computer or the like in accordance with predetermined classification and search procedures. The electronic components can thus be rationally searched and selected in a short time while the display screen is changed through the search or look-up operation. The electronic catalog EC using a storage medium such as a CD-ROM holds the image data for displaying various data of various kinds of electronic components on the screen in an image data file IMF as shown in FIG. 41. The image data file IMF holds character data such as numerics and characters and figure data such as pictures, figures, etc. altogether in one set or in a suitably divided state.

The above-described component electronic catalog EC stores various kinds of data of shapes, dimensions, surface states, characteristics, and usage, etc. of the electronic components as the image data to be displayed on the screen in the form of photographs, drawings, tables, and graphs, and naturally includes data for forming the mounting data of the components as well.

A flow chart of FIG. 42 shows a conventionally practiced sequence to form the mounting data with the use of the electronic catalog EC. The sequence will be described below. First, the electronic catalog EC is loaded to a read device and the read device is started to read out the catalog on the screen.

Then, a command is input through manipulation of a search key and setting of conditions in accordance with predetermined classification and search procedures. A command analysis section subsequently starts searching. Commands are repeatedly input until one electronic component is selected.

FIG. 43 shows a display screen obtained by designating a rough classification group of transistors and then searching bipolar transistors (PNP) . . . 2SA, 2SB in a detailed classification group. A cursor in the screen is located to point the first component among 62 components concerned. A user can search for any component among the 62 components by moving the cursor to a column of the required component. As a result of this, one electronic component is selected, thereby to detect image data of which component should be displayed on the screen. The image data of the detected component are displayed on the screen according to predetermined procedures by the user's manipulation.

For example, supposing that the user designates a search of the component 2SA1022 on the screen of FIG. 43 and manipulates an explanation key, image data related to the rudimental description of the component 2SA1022 are displayed on the screen as shown in FIG. 44.

When a search (S) is selected on the screen of FIG. 44, a list of display items in the rough classification group selectable on the screen of FIG. 44 is window-displayed as in FIG. 45. If an outline view is selected on the screen of FIG. 45 or directly from the screen of FIG. 44, image data related to the outer shape of the component are shown on the screen as indicated in FIG. 46. If a land view is selected, image data related to the land are displayed on the screen as in FIG. 47. If a taping size is selected, image data related to the taping size appear on the screen as in FIG. 48. Meanwhile, if a reel size is selected, image data related to the reel size are shown on the screen as in FIG. 49.

FIG. 50 is a window display of image data related to a characteristic curve as the characteristic curve is selected on the initial explanation screen when an electronic component of a motor control circuit of AN6650 is subjected to search. FIG. 51 is a window display obtained when an example of an applied circuit is selected with priority on the initial explanation screen of FIG. 50, with a block diagram added.

The user can relatively easily select the electronic components fit to the needs from the viewpoint of the circuit design by searching the component data as described hereinabove and freely visually confirm various kinds of data of selected and to-be-mounted components necessary to form mounting data of the selected electronic components by the above search. At the same time, the user can freely search data correspondingly to a component mounting method by chucks or suction nozzles, or depending on whether the components are recognized or not or how the components are recognized, etc.

In order to form the mounting data based on the data visually confirmed with the use of the electronic catalog as above, the visually confirmed mounting data of components have been conventionally manually input to a special automatic data processor or an automatic data processor such as a personal computer, combined with preliminarily formed data of mounting positions of the components or the like, thereby to data-process and obtain the component mounting data and then mount the components based on the operation control of a mounter.

The above-described utilization of the conventional electronic catalog enables relatively easy selection of electronic components satisfying the needs owing to a programmed rational search system, so that various sorts of data can be efficiently visually confirmed one by one. However, the recorded data are image data intended totally for screen display and therefore cannot be directly used to automatically form the mounting data for mounting the selected electronic components. As such, the user is obliged to take the trouble to manually input the visually confirmed data to the automatic data processor while sequentially selecting the required electronic components in the search operation. In other words, it still takes a considerable amount of labor and time to form the mounting data even with the help of the conventional electronic catalog.

DISCLOSURE OF INVENTION

The purpose present invention is to solve such issues, and an object of the invention is to provide a mounting data forming method and apparatus, as well as a storage medium used therefor, which allow mounting data to be formed easily in short time without requiring manual input of data as to individual components, from mounting-position data formed on the individual to-be-mounted components as well as component text data necessary for the formation of mounting data previously set and stored in a component electronic catalog together with image data as to various types of electronic components. An object of the invention is to provide a component mounting method and apparatus which allow component mounting to be accomplished by deriving mounting data easily in short time without requiring manual input of data as to individual components, from mounting-position data formed on the individual to-be-mounted components as well as component text data necessary for the formation of mounting data previously set and stored in a component electronic catalog together with image data as to various types of electronic components.

In accomplishing these and other objects, according to a first aspect of the present invention, there is provided a method for forming mounting data, comprising:

reading component text data corresponding to to-be-mounted components of individual mounting positions stored in a component electronic catalog, according to mounting-position data including mounting angles relating to the mounting positions formed on the to-be-mounted components, by using the component electronic catalog that has stored image data concerning various types of components including the to-be-mounted components as well as component text data necessary for component mounting including configurations and dimensions of the components; and forming mounting data for a mounter to receive components and mount them to specified mounting positions according to the mounting-position data as well as the component text data read for the individual mounting components concerning the to-be-mounted components corresponding to the mounting-position data.

According to a second aspect of the present invention, there is provided a method for forming mounting data according to the first aspect, wherein the mounting data is an NC Numerical Control program relating to the mounting positions of the components, a component library relating to component recognition including configurations and dimensions of the individual to-be-mounted components, and a supply library relating to component supply states including arrangement of the components in a component supply unit.

According to a third aspect of the present invention, there is provided a method for forming mounting data according to any one of the first and second aspects, wherein the mounting data is formed by considering even characteristic data of the mounter.

According to a fourth aspect of the present invention, there is provided a method for forming mounting data according to any one of the first to third aspects, wherein the mounting data includes inspection data for accurate component mounting.

According to a fifth aspect of the present invention, there is provided a method for forming mounting data according to any one of the first to fourth aspects, wherein the component text data includes data necessary for the component mounting including packing forms and colors of the components.

According to a sixth aspect of the present invention, there is provided an apparatus for forming mounting data, comprising:

a data reading device operable to read component text data corresponding to to-be-mounted components of individual mounting positions from component text data necessary for component mounting including configurations and dimensions of the components formed beforehand together with image data and stored in a component electronic catalog as to various types of components including the to-be-mounted components, according to mounting-position data relating to mounting positions including mounting angles formed for the to-be-mounted components; and a data forming device operable to form mounting data for a mounter to receive components and mount them to specified mounting positions according to the mounting-position data as well as data including the component text data read by the data processing device as to the individual to-be-mounted components corresponding to the mounting-position data.

According to a seventh aspect of the present invention, there is provided an apparatus for forming mounting data according to the sixth aspect, wherein the data reading device reads both the component text data and the image data corresponding to various types of components stored in the component electronic catalog, in units of identical components in accordance with a search operation to display the data on the same screen and outputs the component text data to other equipment with an output operation.

According to an eighth aspect of the present invention, there is provided an apparatus for forming data according to the sixth or seventh aspect, wherein the component electronic catalog is detachably set to the apparatus.

According to a ninth aspect of the present invention, there is provided an apparatus for forming data according to the eighth aspect, wherein the component electronic catalog is designed for information transfer by communication.

According to a tenth aspect of the present invention, there is provided an apparatus for forming mounting data according to any one of the sixth to ninth aspects, wherein the data reading device and the data forming device are data processing devices of the mounter.

According to an 11th aspect of the present invention, there is provided an apparatus for forming mounting data according to any one of the sixth to tenth aspects, wherein the data forming device forms the mounting data by considering characteristic data of the mounter.

According to a 12th aspect of the present invention, there is provided an apparatus for forming data according to any one of the sixth to 11th aspects, wherein the data forming device forms even inspection data for accurate component mounting as the mounting data.

According to a 13th aspect of the present invention, there is provided an apparatus for forming mounting data according to any one of the seventh to 12th aspects, wherein the component text data includes data necessary for the component mounting including packing forms and colors of the components.

According to a 14th aspect of the present invention, there is provided a computer readable storage medium comprising as records thereof:

a data reading program for reading component text data corresponding to to-be-mounted components of individual mounting positions from component text data necessary for component mounting including configurations and dimensions of the components formed beforehand together with image data and stored in a component electronic catalog as to various types of components including the to-be-mounted components, according to mounting-position data relating to mounting positions including mounting angles formed for the to-be-mounted components; and a data forming program for forming mounting data for a mounter to receive components and mount them to specified mounting positions according to the mounting-position data as well as data including the component text data of individual components read by the data processing device as to the individual to-be-mounted components corresponding to the mounting-position data.

With the constitution of the first and sixth aspects, by taking advantage of the arrangement wherein the component electronic catalog has stored therein the image data concerning various types of components including the mounting components as well as the component text data necessary for the component mounting including configurations and dimensions of the components, the component text data for the individual to-be-mounted components of the mounting positions can be obtained by automatically reading corresponding component text data out of the component text data stored in the component electronic catalog based on to-be-mounted component information of the mounting-position data previously formed as to the individual to-be-mounted components, in addition to the screen search similar to the conventional component electronic catalog. Further, mounting data for supplying the components to a conventional mounter and mounting them to specified mounting positions can be obtained, the mounting data being exemplified by an NC program relating to the mounting positions of components, a component library relating to component recognition including configurations and dimensions of components, and a supply library relating to component supply states including arrangement of the components in the component supply unit. Thus, it is no longer necessary for persons to input various types of component text data necessary for the formation of mounting data for individual to-be-mounted components, so that the efforts and time required for forming the mounting data for components can be reduced significantly.

The invention of the third aspect is as defined in any one of the first to second aspects, wherein the mounting data can be formed by considering even characteristic data of the mounter. Therefore, in addition to the invention of the first or second aspect, more adequate component mounting can be realized because the mounting data fitting the characteristics of the mounter can be formed.

The invention of the fourth aspect is as defined in any one of the first to third aspects, wherein the mounting data can include inspection data for correct component mounting. Therefore, in addition to the invention of any one of the first to third aspects, inspection data proper for the to-be-mounted components can further be automatically obtained, so that more proper inspection of mounting components can be attained with the necessary labor and time unchanged, and that correct component mounting can be ensured.

The invention of the seventh aspect is as defined in the sixth aspect, wherein the data reading device can read both the component text data and the image data corresponding to various types of components stored in the component electronic catalog, in units of identical components in accordance with a search operation to display the data on the same screen and can output the component text data to other equipment with an output operation. Therefore, in addition to the invention of the sixth aspect, this invention can be utilized for various data processing because the search operation allows the image data and component text data for each component to be displayed as a set of data for the same component on the same screen for the search and selection from among a large number of types of components and because the component text data can be outputted to other equipment as required.

The invention of the eighth aspect is as defined in any one of the sixth to seventh aspects, wherein the component electronic catalog can be detachably set to the apparatus. Therefore, in addition to any one of the inventions of the sixth to seventh aspects, the input of various data can be done separately from and independently of the apparatus for forming mounting data so that changes and additions of data can be done readily. Moreover, the catalog can be shared among various mounters.

The invention of the ninth aspect is as defined in the eighth aspect, wherein the component electronic catalog can be designed for information transfer by communication. Therefore, in addition to the invention of the eighth aspect, there can be advantages that the use of one component electronic catalog is not limited by the place where the mounter has been installed and that the catalog can be shared among a large number of mounters. Additionally, such a catalog can be convenient for the formation, management, change, and addition of data.

The invention of the tenth aspect is as defined in any one of the inventions of the sixth to ninth aspects, wherein the data reading device and the data forming device can be data processing devices of the mounter. Therefore, in addition to any one of the inventions of the sixth to ninth aspects, a special data processing device is not needed between the data forming device for forming component mounting data and the control system of the mounter, so that the number of associated devices for forming the mounting data can be reduced and that the formation of mounting data by incorporating the characteristics of the mounter can be conveniently achieved with the mounter itself.

The invention of the 11th aspect is as defined in any one of the sixth to tenth aspects, wherein the data forming device can form the mounting data by considering characteristic data of the mounter. Therefore, in addition to any one of the inventions of the sixth to tenth aspects, the same functional effects as those unique to the invention of the third aspect can be exerted.

The invention of the 12th aspect is as defined in any one of the inventions of the sixth to 11th aspects, wherein the data forming device can form even inspection data for accurate component mounting as the mounting data. Therefore, in addition to any one of the inventions of the sixth to 11th aspects, the same functional effects as those unique to the invention of the fourth aspect can be exerted.

A computer readable storage medium according to the 14th aspect comprises as records thereof: a data reading program for reading component text data corresponding to to-be-mounted components of individual mounting positions from component text data necessary for component mounting including configurations and dimensions of the components formed beforehand together with image data and stored in a component electronic catalog as to various types of components including the to-be-mounted components, according to mounting-position data relating to mounting positions including mounting angles formed for the to-be-mounted components; and a data forming program for forming mounting data for a mounter to receive components and mount them to specified mounting positions according to the mounting-position data as well as data including the component text data of individual components read by the data processing device as to the individual to-be-mounted components corresponding to the mounting-position data.

With the storage medium, the input of various programs can be done separately from and independently of the apparatus for forming mounting data so that changes and additions of programs can be done readily. Moreover, the medium can be shared among the mounters of the same type.

According to a 15th aspect of the present invention, there is provided a method for mounting components, comprising: reading component text data corresponding to to-be-mounted components of individual mounting positions stored in a component electronic catalog, according to mounting-position data including mounting angles relating to the mounting positions formed on the to-be-mounted components, by using the component electronic catalog that has stored image data concerning various types of components including the to-be-mounted components as well as component text data necessary for component mounting including configurations, and dimensions of the components; forming mounting data for a mounter to receive supply of components and mount them to specified mounting positions according to the mounting-position data as well as the component text data read for the individual mounting components concerning the to-be-mounted components corresponding to the mounting-position data; and automatically mounting the components sequentially to the specified positions of a board by controlling operation of the mounter based on the formed mounting data.

According to a 16th aspect of the present invention, there is provided a method for mounting components according to the 15th aspect, wherein the mounting data is an NC program relating to the mounting positions of components, a component library relating to component recognition including configurations, and dimensions of the individual to-be-mounted components, and a supply library relating to component supply state including arrangement of the components in a component supply unit.

According to a 17th aspect of the present invention, there is provided a method for mounting components according to any one of the 15th and 16th aspects, wherein the mounting data includes inspection data for correct component mounting, and the components to be mounted are inspected based on this inspection data.

According to a 18th aspect of the present invention, there is provided an apparatus for mounting components, comprising: a mounter; a data reading device for reading component text data corresponding to to-be-mounted components of individual mounting positions from component text data necessary for component mounting including configurations, and dimensions of the components formed beforehand and stored in storage devices as to various types of components including the to-be-mounted components, according to mounting-position data relating to mounting positions including mounting angles formed for the to-be-mounted components; a data forming device for forming mounting data for the mounter to receive supply of components and mount them to specified mounting positions according to the mounting-position data as well as data including the component text data read by the data reading device as to the individual to-be-mounted components corresponding to the mounting-position data; and a control system for controlling operations of the mounter upon reception of the mounting data from the data forming device.

According to a 19th aspect of the present invention, there is provided an apparatus for mounting components according to the 18th aspect, wherein the control system has internal or external storage device which has stored therein substitute component data of substitute components as to equivalent components or compatible other-company components that can be substituted for the to-be-mounted components, where if a component has been decided to be inappropriate, the control system decides whether or not the component is a corresponding substitute, based on the substitute component data.

According to a 20th aspect of the present invention, there is provided an apparatus for mounting components according to any one of the 18th and 19th aspects, wherein the mounter receives supply of components from a component supply cassette having accommodated component information removably equipped, and further has a reading device for reading the accommodated component information of the component supply cassette, and wherein the control system decides appropriateness or inappropriateness as to component supply including placed components or component arrangement, according to read information derived from the reading device.

According to a 21st aspect of the present invention, there is provided an apparatus for mounting components according to the 20th aspect, wherein the component supply cassette can be replaced collectively in units of a specified number of component supply cassettes, and wherein a transfer rack that treats collectively the specified number of component supply cassettes has the accommodated component information as to the individual component supply cassettes placed on the transfer rack.

According to a 22nd aspect of the present invention, there is provided an apparatus for mounting components according to any one of the 20th and 21st aspects, further comprising a detector for detecting a loading or unloading of the component supply cassette, wherein when it is decided from a detection of the loading or unloading of the component supply cassette that a component replacement has occurred, the control system reads the accommodated component information of the newly loaded component supply cassette and decides whether or not the components are appropriate or inappropriate.

According to a 23rd aspect of the present invention, there is provided an apparatus for mounting components according to the 22nd aspect, wherein the component supply cassette is replaced collectively in units of a specified number of component supply cassettes, and the reading of the accommodated component information is made on all the component supply cassettes of the collective replacement unit that have been newly loaded after a replacement.

According to a 24th aspect of the present invention, there is provided an apparatus for mounting components according to any one of the 20th to 23rd aspects, wherein the accommodated component information is indicated by bar codes.

According to a 25th aspect of the present invention, there is provided an apparatus for mounting components according to any one of the 20th to 23rd aspects, wherein the accommodated component information is one stored in a readable/writable storage medium.

According to a 26th aspect of the present invention, there is provided an apparatus for mounting components according to any one of the 20th to 23rd and 25th aspects, wherein the storage medium is an optical memory that can be read by infrared communication.

According to a 27th aspect of the present invention, there is provided an apparatus for mounting components according to any one of the 24th to 26th aspects, wherein the accommodated component information is carried by a carrier that can be loaded to and unloaded from the component supply cassettes.

According to a 28th aspect of the present invention, there is provided an apparatus for mounting components according to any one of the 25th and 26th aspects, further comprising a writing device operable to write various types of information into the storage medium or updating written contents thereof, wherein the control system manages various types of mounting-component information as to mounting components including number of used components mounted by the mounter, amount of remaining components, and conformity or inconformity of components, as well as component mounting information as to the component mounting including a component holding rate and a to-board mounting rate by a chuck or suction nozzle with respect to a total number of components to be supplied, and makes the writing device work prior to a removal of a component supply cassette to write the mounting-component information or the component mounting information into the storage device or to update the written contents at a time point of the removal of the component supply cassette.

According to a 29th aspect of the present invention, there is provided an apparatus for mounting components according to any one of the 18th to 28th aspects, wherein the component text data includes temperature characteristics of the components, and the data forming device automatically forms a condition program that sets an optimum temperature profile for reflow-soldering the to-be-mounted components, from the temperature characteristics as to the individual to-be-mounted components.

With the constitution of the method and apparatus for mounting components according to the 15th or 18th aspect, by taking advantage of the arrangement wherein the component electronic catalog has stored therein image data concerning various types of components including the mounting components as well as component text data necessary for component mounting, such as configurations, and dimensions of the components, component text data for the individual to-be-mounted components of the mounting positions can be obtained by automatically reading corresponding component text data out of the component text data stored in the component electronic catalog based on to-be-mounted component information of the mounting-position data previously formed as to the individual to-be-mounted components, in addition to the screen search similar to the conventional a component electronic catalog. Further, various types of components can be automatically mounted by forming, through automatic data processing, mounting data for supplying the components to a conventional mounter and mounting them to specified mounting positions, the mounting data being exemplified by an NC program relating to the mounting positions of components, a component library relating to component recognition such as configurations and dimensions of components, and a supply library relating to component supply state such as arrangement of the components in a supply unit, and by using the resulting mounting data for operation control of the mounter. Thus, it is no longer necessary for persons to input various types of component text data necessary for the formation of mounting data for individual to-be-mounted components each time new circuit boards are fabricated, so that product type changes can be achieved in quite short time and that the productivity can be improved.

The invention of the 17th aspect is as defined in any one of the 15th and 16th aspects, wherein the mounting data can include inspection data for correct component mounting. Therefore, in addition to the invention of any one of the 15th and 16th aspects, inspection data proper for the to-be-mounted components can further be automatically obtained, so that more proper inspection of mounting components can be attained with the necessary labor and time unchanged, and that correct component mounting can be ensured.

The invention of the 19th aspect is as defined in the 18th aspect, wherein the control system can have internal or external storage devices which have stored therein substitute component data of substitute components as to equivalent components or compatible other-company components that can be substituted for the to-be-mounted components, where if a component has been decided to be inappropriate, the control system can decide whether or not the component is a corresponding substitute, based on the substitute component data. Therefore, in addition to the invention of the 18th aspect, even when a substitute component is used at an exhaustion of components, the decision as to whether or not the mounting component is appropriate can properly be made automatically responsive to this. Thus, it becomes possible to prevent such trouble that use of a substitute component may be decided as an improper component.

The invention of the 20th aspect is as defined in any one of the 18th and 19th aspects, wherein the mounter can receive supply of components from a component supply cassette having accommodated component information removably equipped, and further can have a reading device for reading the accommodated component information of the component supply cassette, and wherein the control system can decide appropriateness or inappropriateness as to component supply such as placed components or component arrangement, according to read information derived from the reading device. Therefore, in addition to any one of the inventions of the 18th and 19th aspects, the accommodated component information carried by the individual component supply cassettes equipped to the mounter can be automatically read by the reading device, and the control system can automatically decide whether or not component-side conditions such as the components to be supplied by these component supply cassettes as well as their arrangement, comply with the component conditions set in the mounting data. Thus, it is enabled to prevent such occurrences that the mounter continues operating even with the components mis-placed, resulting in a trouble, that time and mounting operation are wasted, or that produced electronic circuit boards are faulty so as to be repaired or abolished, which would cause a production loss.

The invention of the 21st aspect is as defined in the 20th aspect, wherein the component supply cassette can be replaced collectively in units of a specified number of component supply cassettes, and wherein a transfer rack that treats collectively the specified number of component supply cassettes can have the accommodated component information as to the individual component supply cassettes placed on the transfer rack. Therefore, in addition to the invention of the 20th aspect, the component supply cassettes can be treated and loaded/unloaded by the transfer rack collectively in the units of the specified number of component supply cassettes, giving a convenience for the replacement and resupply of components. Besides, the accommodated component information as to the individual component supply cassettes can be collectively provided in the transfer rack and can be read at one place, so that the reading takes not much time, contributing to an improvement in the productivity.

The invention of the 22nd aspect, is as defined in any one of the 20th and 21st aspects, which can further comprise the detector for detecting a loading or unloading of the component supply cassette, wherein when it is decided from a detection of the loading or unloading of the component supply cassette that a component replacement has occurred, the control system can read the accommodated component information of the newly loaded component supply cassette and can decide whether or not the components are appropriate or inappropriate. Therefore, in addition to any one of the inventions of the 20th and 21st aspects, when a loading/unloading of replaced component supply cassettes is detected by the detector, the control system can decide based on the detection whether or not the component supply cassette has been replaced with another, where if it has been replaced, the accommodated component information on the newly loaded component supply cassette can be read. Thus, it is enabled to prevent such occurrences that the mounter re-operates as components have been mis-exchanged, resulting in a trouble, or that time and mounting operation are wasted.

The invention of the 23rd aspect is as defined in the 22nd aspect, wherein the component supply cassette can be replaced collectively in units of a specified number of component supply cassettes, and the reading of the accommodated component information can be made on all the component supply cassettes of the collective replacement unit that have been newly loaded after a replacement. Therefore, in addition to the invention of the 22nd aspect, when the component supply cassettes have been collectively replaced in the units of a specified number, the accommodated component information on all the component supply cassettes that have been collectively replaced can be read. Thus, it is enabled to simply cope with all the cases, without discriminating which component supply cassettes have been replaced out of those that have been collectively replaced.

The invention of the 24th aspect is as defined in any one of the 20th to 23rd aspects, wherein the accommodated component information can be indicated by bar codes. Therefore, in addition to any one of the inventions of the 20th to 23rd aspects, each time a component supply cassette is accommodated, a bar code corresponding to the component can be provided to the component supply cassette. Thus, proper accommodated component information can be given to the component supply cassette simply without requiring any special device.

The invention of the 25th aspect is as defined in any one of the 20th to 23rd aspects, wherein the accommodated component information can be one stored in a readable/writable storage medium. Therefore, in addition to any one of the inventions of the 20th to 23rd aspects, even if the components to be accommodated in the component supply cassette are replaced, the accommodated component information stored in the storage device may be rewritten responsive to newly loaded components. Thus, it is unnecessary to replace the device for carrying accommodated component information each time, conveniently.

The invention of the 26th aspect is as defined in any one of the 20th to 23rd and 25th aspects, wherein the storage medium can be an optical memory that can be read by infrared communication. Therefore, in addition to any one of the inventions of the 21st and 22nd aspects, the storage contents of the optical memory carried by the component supply cassette loaded to the mounter can be read sequentially by the infrared communication device located at one place. Thus, it is unnecessary to move either the reading device or the individual component supply cassettes, so that the reading can be accomplished in short time, contributing to an improvement in the productive efficiency.

The invention of the 27th aspect is as defined in any one of the 24th to 26th aspects, wherein the accommodated component information can be carried by a carrier that can be loaded to and unloaded from the component supply cassettes. Therefore, in addition to any one of the inventions of the 24th to 26th aspects, by controlling various replenishment components as well as various types of carriers carrying accommodated component information corresponding to the replenishment components, each time components are accommodated in a component supply cassette, the carrier carrying component information corresponding to these components can be attached to the component supply cassette, so that changes of accommodated components or the like can be treated simply and reliably.

The invention of the 28th aspect is as defined in any one of the 25th and 26th aspects, which can further comprise a writing device for writing various types of information into the storage medium or updating written contents thereof, wherein the control system can manage various types of mounting-component information as to mounting components such as number of used components mounted by the mounter, amount of remaining components, and conformity or inconformity of components, as well as component mounting information as to the component mounting such as a component holding rate and a to-board mounting rate by a chuck or suction nozzle with respect to a total number of components to be supplied, and can make the writing device work prior to a removal of a component supply cassette to write the mounting-component information or the component mounting information into the storage device or to update the written contents at a time point of the removal of the component supply cassette. Therefore, in addition to any one of the inventions of the 25th to 26th aspects, the control system can control various types of mounting-component information as to mounting components such as number of used components mounted by the mounter, amount of remaining components, and conformity or inconformity of components, as well as component mounting information as to the component mounting such as a component holding rate and a to-board mounting rate by a chuck or suction nozzle with respect to a total number of components to be supplied, and can make the writing device work prior to a removal of a component supply cassette to write the mounting-component information or the component mounting information into the storage device or to update written contents at a time point of the removal of the component supply cassette. Thus, the component supply cassette can be made to carry various types of component information as to to-be-mounted components such as the number of used components, amount of remaining components, and conformity or inconformity of components, as well as various types of information as to the component mounting such as a component holding rate and a to-board mounting rate by a chuck or suction nozzle with respect to the total number of supplied components. Then it becomes possible to lend the various types of information to the next component mounting in determining any differences between catalog data and actual dimensions of components and the like so that more proper component supplying can be achieved, or to correct or change mounting conditions so that more proper component supplying can be achieved, allowing comprehensive control of to-be-mounted components as well as their mounted state conveniently.

The invention of the 29th aspect is as defined in any one of the 18th to 28th aspects, wherein the component text data can include temperature characteristics of the components, and the data forming means can automatically form a condition program that sets an optimum temperature profile for reflow-soldering the to-be-mounted components, from the temperature characteristics as to the individual to-be-mounted components. Therefore, in addition to any one of the inventions of the 18th to 28th aspects, a condition program that sets an optimum temperature profile for reflow-soldering the to-be-mounted components can be formed with the data processing function of the data processor, only by including temperature characteristic data of various components in the component text data as to the to-be-mounted components. Thus, in such a case where reflow-soldering is involved in the component mounting, labor and time required to specially form the temperature files for the reflow-soldering work can be saved, and moreover any causes of trouble due to mis-input of data or the like in such separate formation of the profiles can be avoided.

BRIEF DESCRIPTION OF DRAWINGS

These and other aspects and features of the present invention will become clear from the following description taken in conjunction with the preferred embodiments thereof with reference to the accompanying drawings, in which:

FIGS. 1A and 1B are schematic arrangement diagrams showing a component mounter to which a component mounting method is applied in a first embodiment according to the present invention;

FIGS. 6A, 6B, and 6C are sectional views showing a sequence of operations of positioning and releasing the transfer rack on the transport stand shown in FIG. 2;

FIGS. 14A and 14B are a side view and an explanatory view showing a working stage of adjusting in height a transfer rack support section at the truck positioned from the state shown in FIG. 13 and a detection state of a height detecting means (detector) in this stage;

FIG. 24 is an example of data of mounting positions of components used to form a component mounting data;

FIG. 25 is an example of a component text data to be used to form the component mounting data;

FIG. 26 is an example of an NC program as a part of the component mounting data;

FIG. 27 is an example of a component library as a part of the component mounting data;

FIG. 28 is an example of an arrangement program as a part of a supply library of the component mounting data;

FIG. 29 is an example of a supply position library as a part of the supply library in the component mounting date;

FIGS. 40E and 40F show diagrams of a control system according to a sixth embodiment of the present invention and a data processor thereof;

FIG. 43 is a screen in the middle of the search for electronic components meeting needs by a rough classification and a detailed classification in accordance with the flow chart of FIG. 42;

BEST MODE FOR CARRYING OUT THE INVENTION

Figure 2:
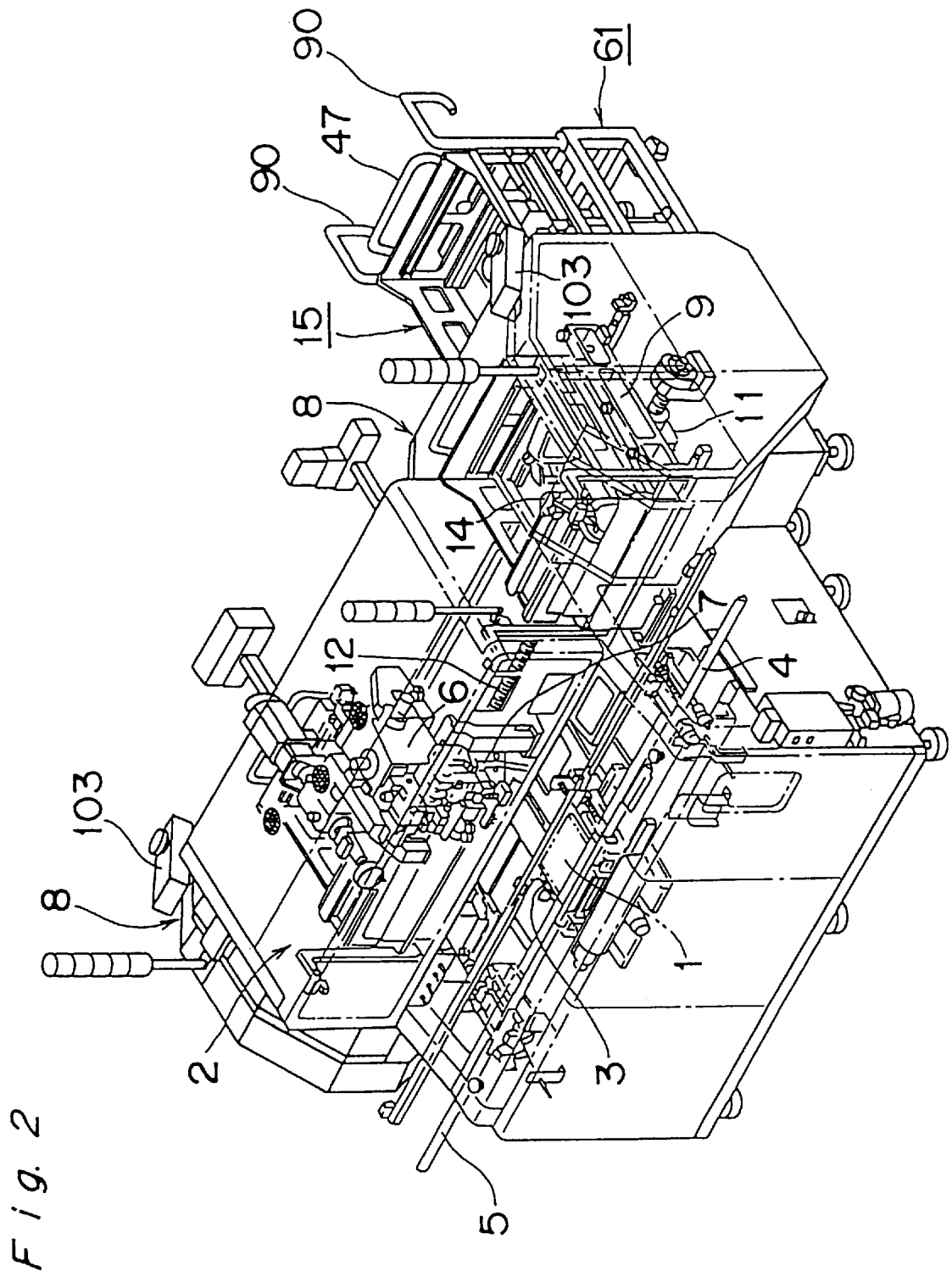
FIG. 2 is a schematic perspective view of a mounter for mounting electronic components onto a board to which the method and apparatus for collectively changing components at a component supply section and a truck thereof is applied in the first embodiment of the present invention.

Before the description of the present invention proceeds, it is to be noted that like parts are designated by like reference numerals throughout the accompanying drawings.

Hereinbelow, methods and apparatuses for forming mounting data as well as storage mediums used therefor, and methods and apparatuses for mounting components as embodiments of the present invention are described with reference to the accompanying drawings.

(First Embodiment)

According to a first embodiment of the present invention, as shown in FIG. 1A, a storage medium (computer readable medium) 212 which is a CD-ROM is used as the component electronic catalog. A data processor 203 separate from a mounter 2 forms mounting data for the components and the components are mounted on boards based on the operation control of the mounter 2. The data processor 203 has, as its internal function, a data reading (reading-processing) device 201 and a data forming (forming-processing) device 202 as shown in FIG. 1B. Although a personal computer is preferred as the data processor 203, a special device may be used or, a data processor or a control system of the mounter 2 can be used depending on the situation.

A required number of component supply cassettes 14 storing taped components is loaded in the mounter 2. Every time a necessary electronic component is supplied from the supply cassettes 14 to the mounter 2, the mounter 2 checks whether or not the component is correct through recognition and takes measures, such as correction of the component, if the component is not correct, thereby correctly and highly accurately mounting the component to a board automatically. A data processor 208 is installed in the mounter 2, apart from a control system 102 provided for controlling of the above automatic mounting.

The data processor 208 equipped with a display 209 forms an operation control program, as control data N to be used at the control system 102, to control actual supplying of components and mount the supplied components to predetermined positions, with reference to an NC program as mounting position data for every component to be mounted, a supply library related to supplied states of components, e.g., arrangement of components at a component supply section, and a component library for correctly and surely recognizing and mounting the supplied components to predetermined positions, etc. A mounting data C is formed based on requirements from the functional level of the mounter 2 or supplied states of components, etc., in other words, correspondingly to the nature of the mounter 2. Specific contents of the mounting data can be set freely. The control system 102 is implemented by a microcomputer as shown in FIG. 1B. However, it is not limited to this.

The data reading device 201 reads out, through automatic data processing, a component text data b of every component to be mounted at the respective mounting position from a component text data B of FIG. 25 based on a position data A of FIG. 24 related to mounting positions of the components to be mounted. The component text data B is related to shapes, dimensions, packing forms, colors the like, of components. The components text data B is and necessary for mounting of components and is formed beforehand together with an image data IM of various kinds of components including components to be mounted and is stored in the storage medium 212 as the component electronic catalog. The data forming device 202 automatically data-processes the mounting position data A and data including the component text data b of every to-be-mounted component at each mounting position read out by the reading device 201, thereby to form the mounting data C for the mounter 2 to mount the supplied components at the predetermined mounting positions of a board. Based on the formed mounting data C, the mounter 2 is controlled for its operation, by which the electronic components are automatically and sequentially mounted to the specified positions on the board 1.

The mounting data C is, for instance, an NC program, a component library, an arrangement program as a supply library, and a supply position library, etc. as shown in FIGS. 26–29. The supply position library relates to conditions of take-out positions when the components are to be taken out and supplied by trays.

Figure 30:
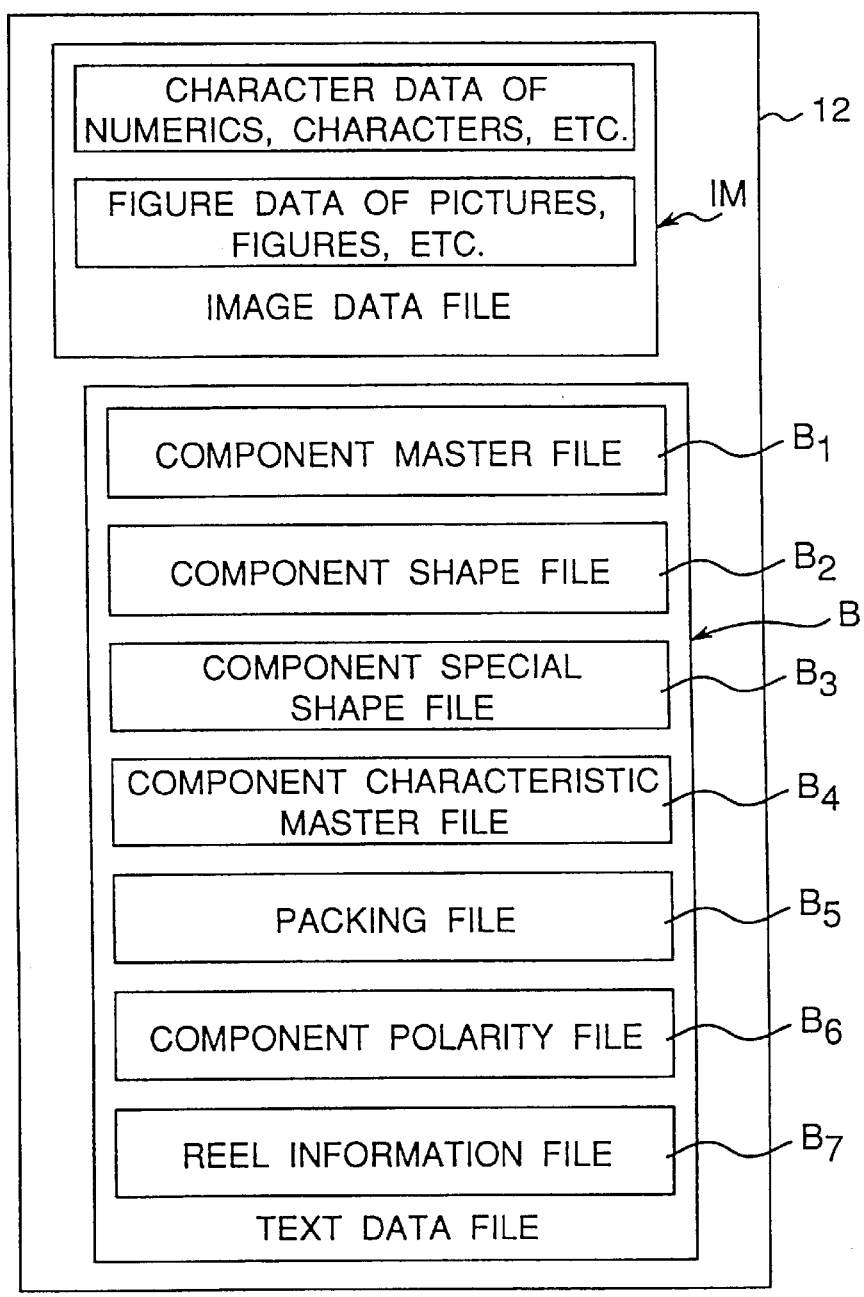
FIG. 30 is a block diagram showing an example of contents stored in a storage medium as the component electronic catalog.

The mounting position data A can be formed, e.g., by a device for CAD 211 and input to the data processor 203 every time each piece of mounting position data is formed, or total pieces of mounting position data may be once stored and transferred to the data processor 203. Alternatively, a storage medium storing the mounting position data A may be loaded to the data processor 203 for its utilization. The storage medium 212 providing the component text data B stores therein, as shown in FIG. 30, the image data IM of various kinds of components including components to be mounted and the component text data B of necessary information for mounting of components, e.g., shapes, dimensions, packing forms, colors and the like of components. Both data are stored in the storage medium 212 after being edited in accordance with a predetermined classification method. Therefore, by using both the image data IM and the component text data B, various kinds of data on the electronic components can be displayed on the screen according to predetermined procedures and search operations, to be utilized as a component electronic catalog, similar to the conventional art. An interface for this purpose may be provided at either side of the storage medium 212 and the data processor 203. It is also possible to make a required screen display of various kinds of electronic components only by the image data IM.

Any storage medium or storage device other than a CD-ROM is utilizable as the storage medium 212, not to mention a flexible disk, an optical disk, etc. A read/write memory is most preferable for post-treatments, that is, to add, delete, and correct data afterwards. To write data may be achieved by a specialized device or a general-purpose personal computer. On the other hand, to add, delete, or correct data may be automatically performed in accordance with the mounting history by the mounter 2.

In the first embodiment, the storage medium 212 works as the component electronic catalog storing the component text data B of necessary information for mounting of components such as shapes, dimensions, packing forms, colors, etc. of the components as well as the image data IM of various kinds of components including components to be mounted, thus realizing the search on the screen in the same manner as in the conventional art. In addition to the above function, the first embodiment automatically reads out corresponding data from the component text data B stored together with the image data IM in the storage medium 212, on the basis of the data of the components to be mounted in the mounting position data A preliminarily formed for each to-be-mounted component, and obtains the component text data b for every component to be mounted at each mounting position. Therefore, the mounting data C, i.e., the NC program related to the mounting positions of components required by the conventional mounter 2, the component library related to the recognition of electronic components, e.g., shapes, dimensions, colors, etc. of components and, the supply library related to the supplied states of components such as the arrangement of components at the component supply section can be formed through the same automatic data processing as in the conventional art with the use of the mounting position data A and the data including the component text data b of every component to be mounted at the mounting position. That is, the mounting data C for supplying and mounting each component to a predetermined mounting position in the conventional mounter 2 can be formed through the automatic data processing. Then these data are used for the operation control of the mounter 2. Thus, it is no longer necessary for persons to input various types of component data necessary for the formation of the mounting data C for individual to-be-mounted components each time new circuit boards are fabricated, so that product type changes can be achieved in quite short time and that the productivity is improved.

Since the necessity to manually input data of various components necessary for forming the mounting data C of every component to be mounted is eliminated, the time and labor for forming the mounting data are greatly reduced.

Needless to say, the mounting data C should be formed correspondingly depending on the type or control level of the mounter 2. If the mounting data C is formed with characteristic data of the mounter 2 taken into consideration, the mounting data C obtained fits the characteristics of the mounter 2, in other words, the mounting time is rendered shortest and handling of components becomes easy and ready without failures, with the effect of more proper mounting. The mounting data C may be arranged to include inspection data for correct mounting of components. The inspection data to detect whether components held by nozzles or chucks are directed properly and, exchange improper components to proper ones or correct a component improperly directed is generated by the component text data b formed for every component. Therefore, the inspection data suitable for the components to be mounted can be obtained automatically. The components can be inspected more properly with the same amount of labor and time and consequently, accurate component mounting can be assured.

As shown in FIGS. 1A and 2, in order to mount electronic components in required portions of the board 1, the present mounter 2 of the first embodiment receives and places the board 1 on its X-Y table 3 which moves in two directions of X and Y that are perpendicular to each other at its fore part, and successively moves an electronic component to its component mounting position to allow the electronic components to be mounted.

At both lateral sides of the X-Y table 3 are provided a loading mechanism 4 and an unloading mechanism 5 for loading the board 1 prior to the electronic component mounting process onto the X-Y table 3 and unloading the board 1 mounted with the electronic components on the X-Y table 3.

Behind the X-Y table 3 is provided a component mounting head 6 for mounting electronic components on the board 1. The component mounting head 6 is equipped, for example, with a plurality of suction nozzles 7 or chucks on a turntable (not shown). With the suction nozzle 7 the component mounting head 6 sucks each electronic component supplied at the component supply section 8 provided further behind the component mounting head 6 to hold it, and mounts it in a specified position defined as the component mounting position of the board 1 on the X-Y table 3 located at the fore part in accordance with the NC program.

Figure 3:
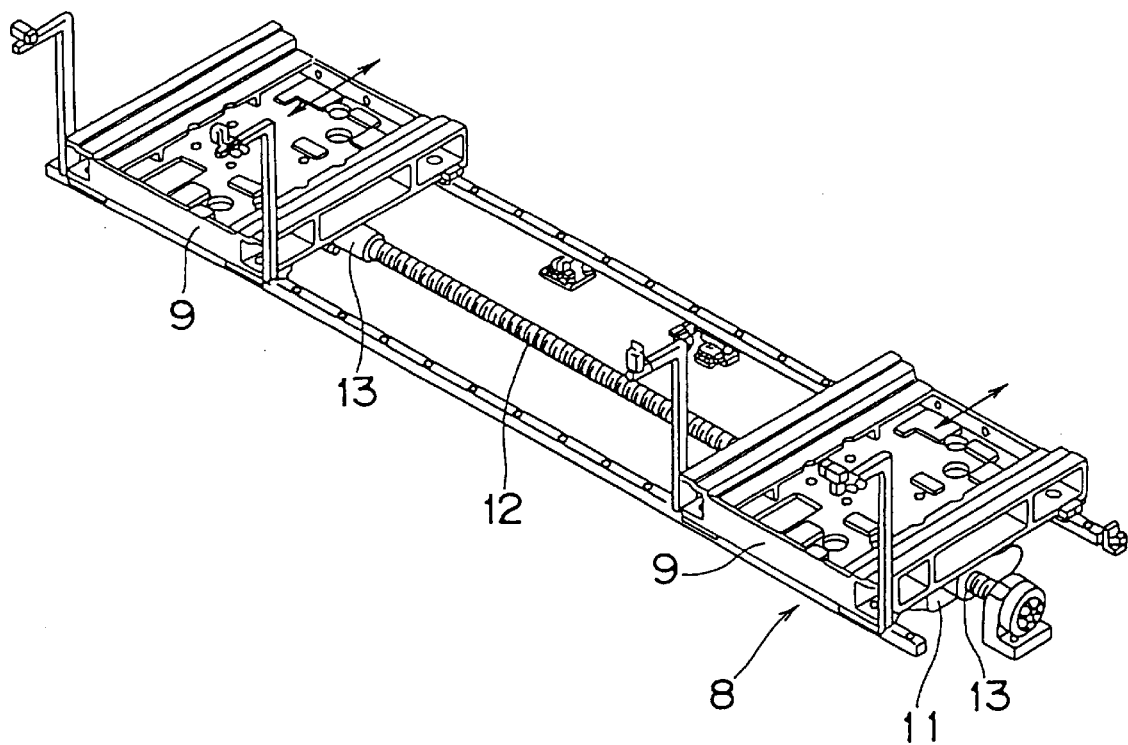
FIG. 3 is a perspective view showing a transport stand section for performing selective supply of components at two component supply sections provided at the mounter shown in FIG. 2.
Figure 4:
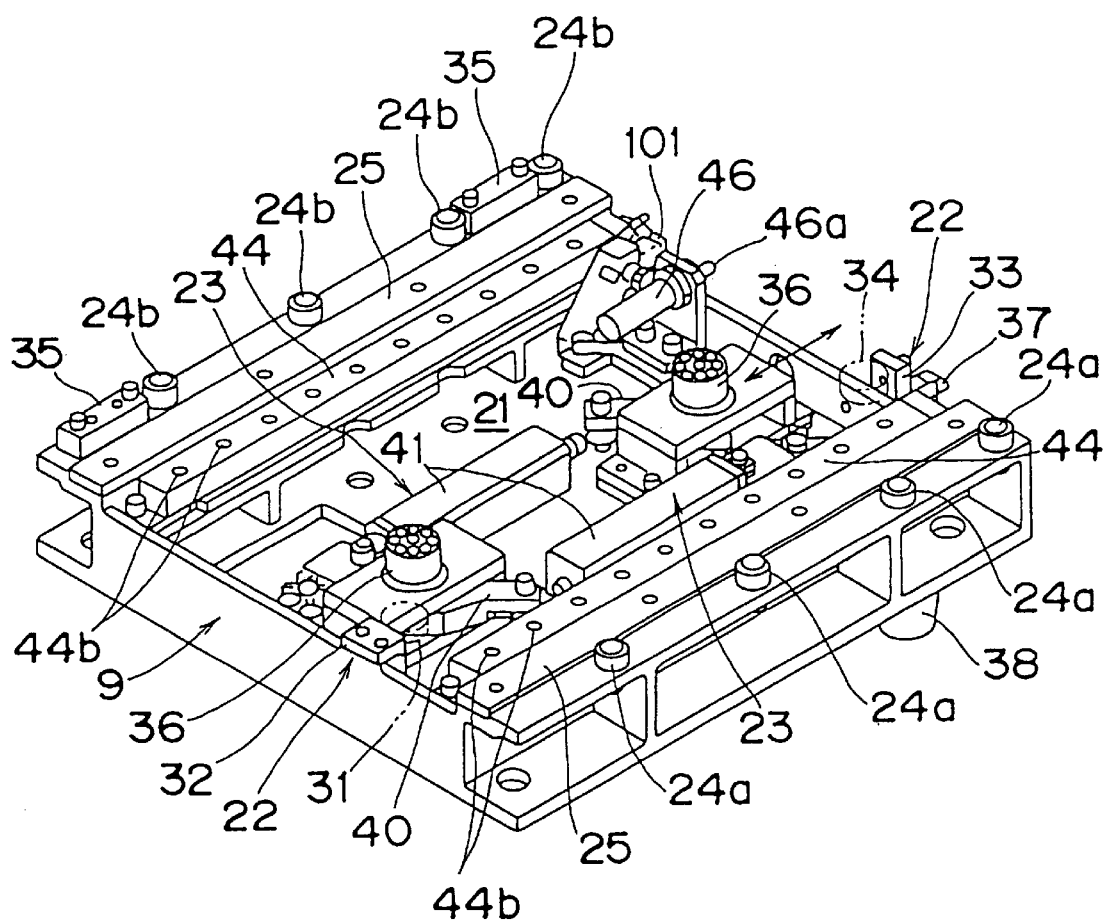
FIG. 4 is a detailed perspective view of the transport stand section shown in FIG. 3.
Figure 5:
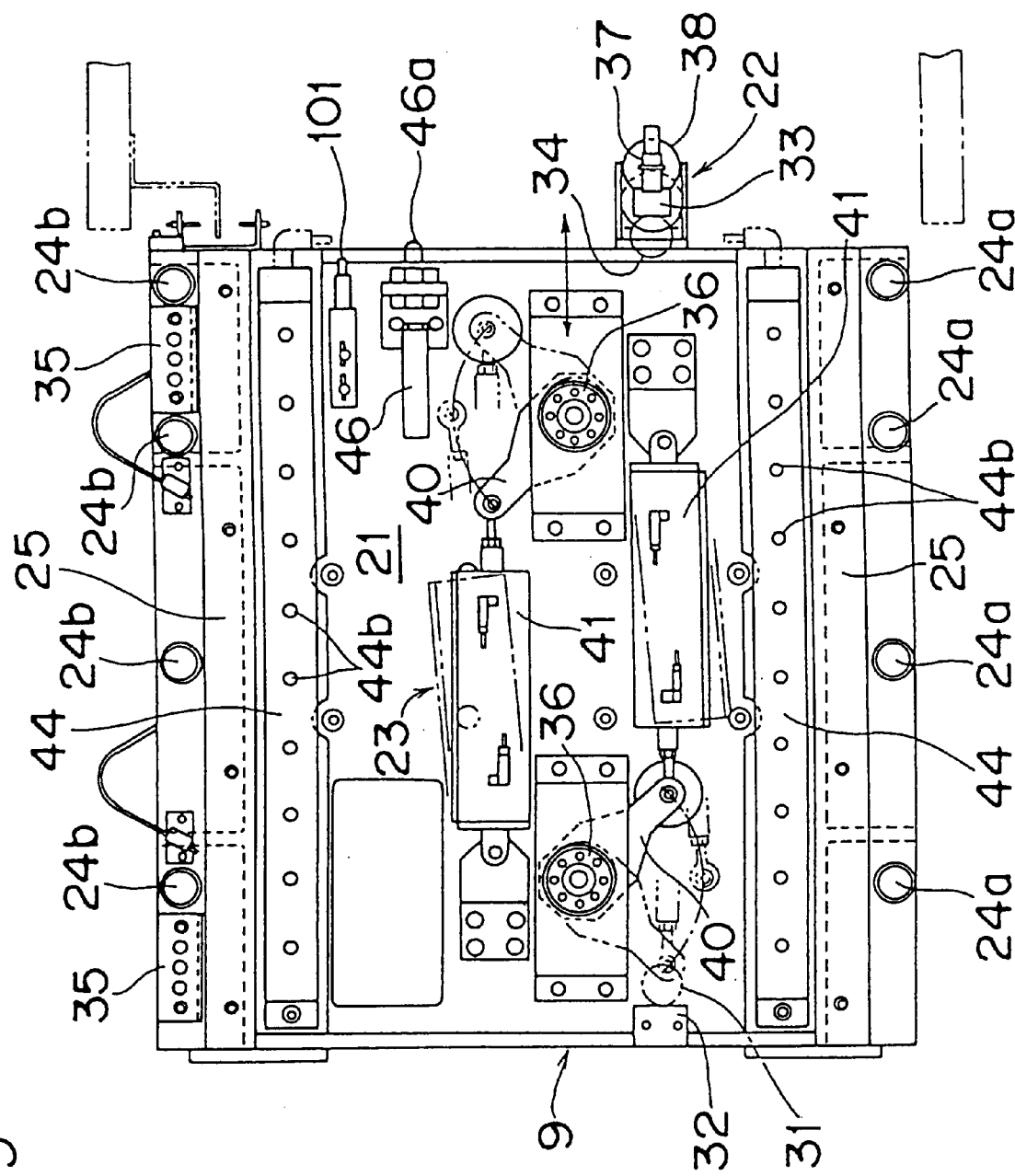
FIG. 5 is a detailed plan view of the transport stand section shown in FIG. 3.
Figure 7:
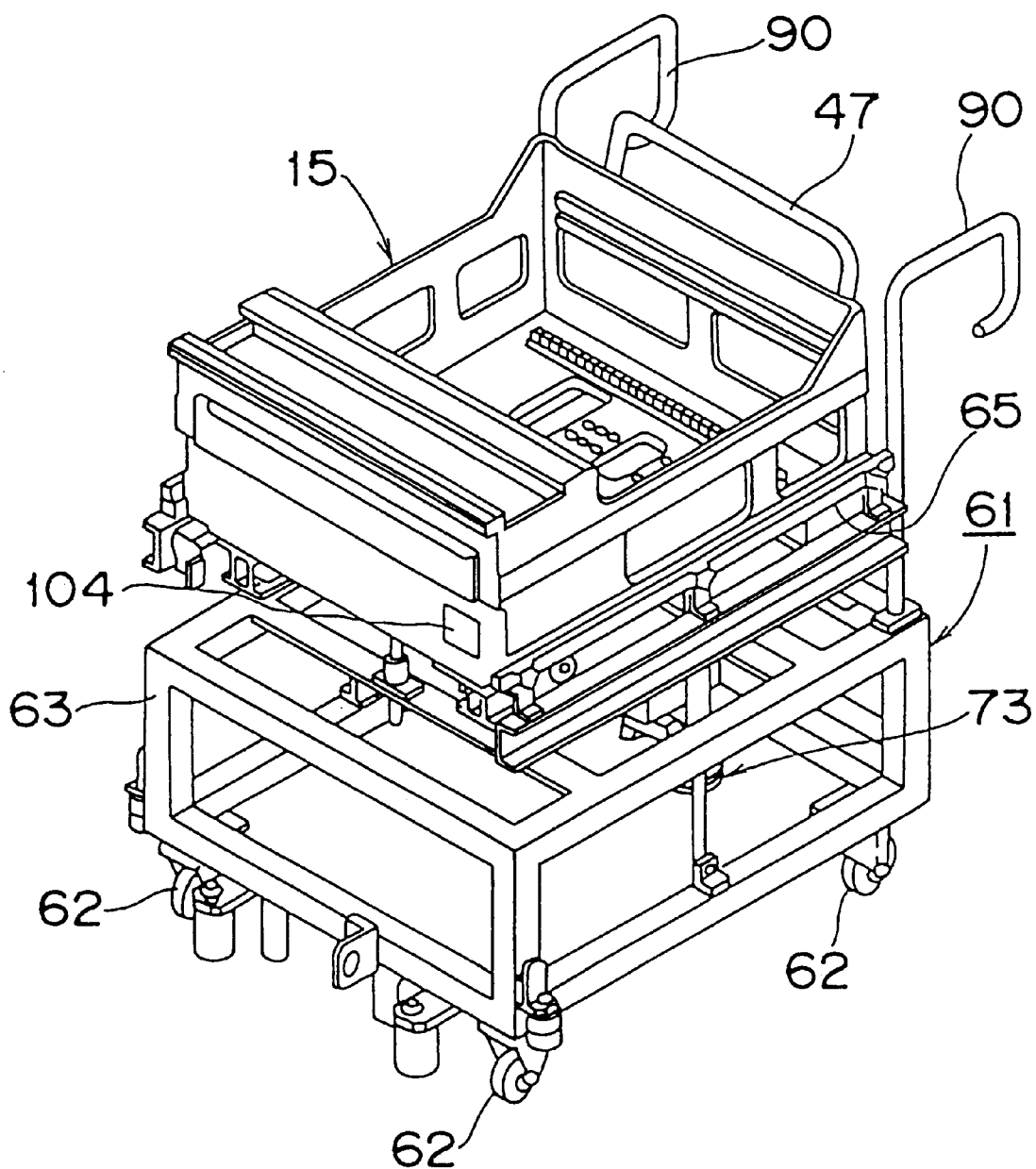
FIG. 7 is a perspective view of the truck shown in FIG. 2 and the transfer rack that is supported as carried thereon.
Figure 8:
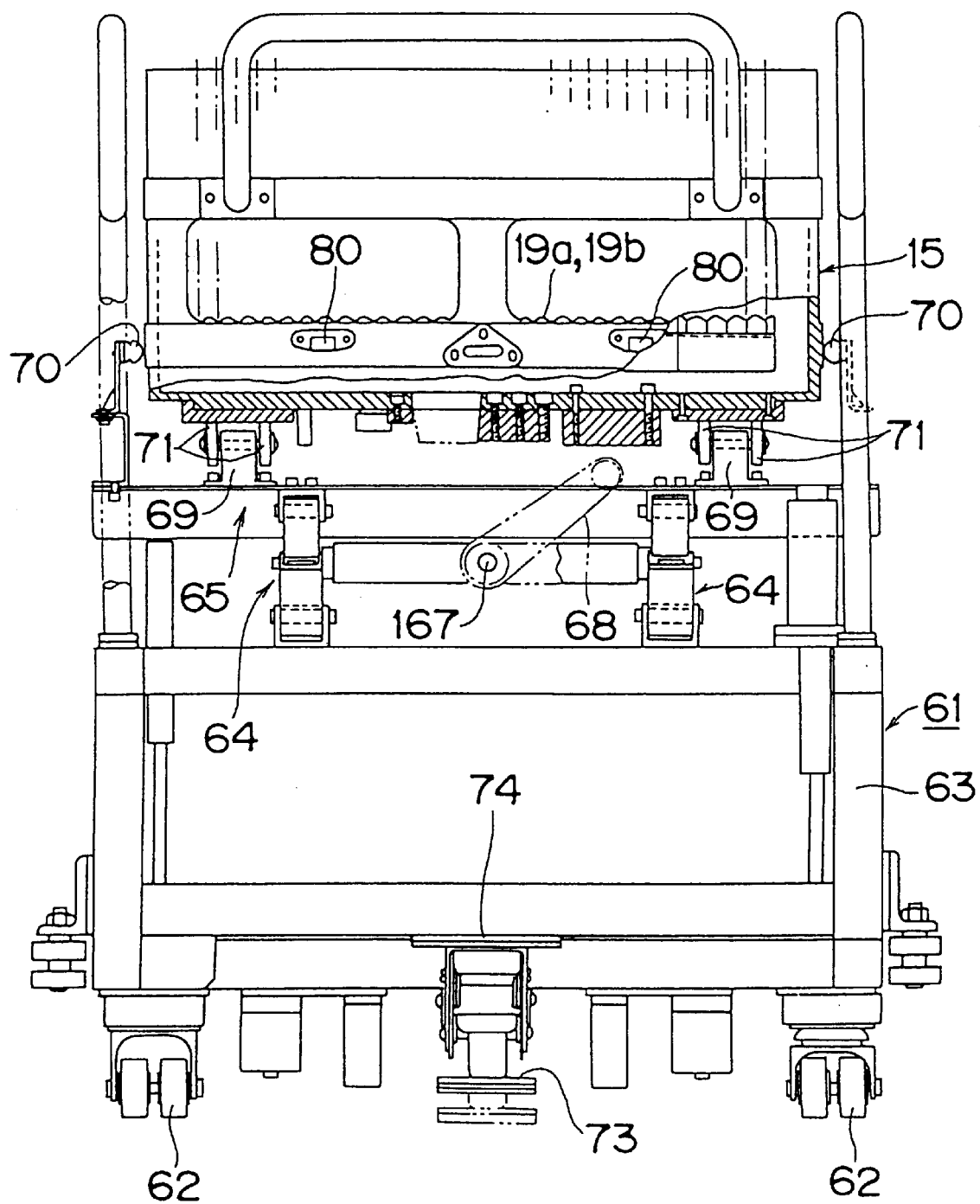
FIG. 8 is a rear view of the truck and the transfer rack shown in FIG. 7.

In the first embodiment, the component supply section 8 is provided laterally in two places, and when one is put in a component supply operation state, the other can be put in a standby state. Each component supply section 8 has a transport stand 9 having a rectangular plan configuration as shown in FIGS. 3 through 5 and a hollow servomotor 11 fixed to it. By rotatively driving a hollow motor shaft 13 engaged with a ball thread shaft 12 of the servomotor 11, the transport stand 9 is moved laterally along the ball thread shaft 12. The servomotor 11 of the component supply section 8 on the operative side supplies the components, while the servomotor 11 of the component supply section 8 on the inoperative side is kept in the standby state.

In order to supply the electronic components to the mounter 2, the transport stand 9 uses a transfer rack 15 as shown in FIGS. 1, and 7 through 11B, and it is equipped with a required number of conventionally known component supply cassettes 14 (FIGS. 9A, 9B) which supply electronic components one by one, while being able to be positioned, loaded and unloaded. The transfer rack 15 is provided with a Z-table structure that has been owned by the conventional component supply section, i.e., a structure for seriately supporting a number of component supply cassettes 14 in the sidewise direction so that the cassettes can be positioned, loaded and unloaded.

According to the first embodiment, in compliance with use of the component supply cassette 14 for taping components, the transfer rack 15 has a box-shaped main body frame 16 as shown in FIGS. 7 through 11B. Above the fore part of the main body frame 16 is received a component supplying section 14a of the component supply cassette 14 by support rails 18a and 18b provided depthwise in two places as regulated at an appropriate height, and the depthwise and lateral positional relations are regulated by engaging its positioning hole 20a with a positioning pin 20b of the component supply cassette 14. Further, the component supply cassette 14 is supported by corrugated guides 19a and 19b at depthwise two portions of its reel setting section 14b provided at a hind part, thereby preventing the possible transverse vibration.

Figure 9A:
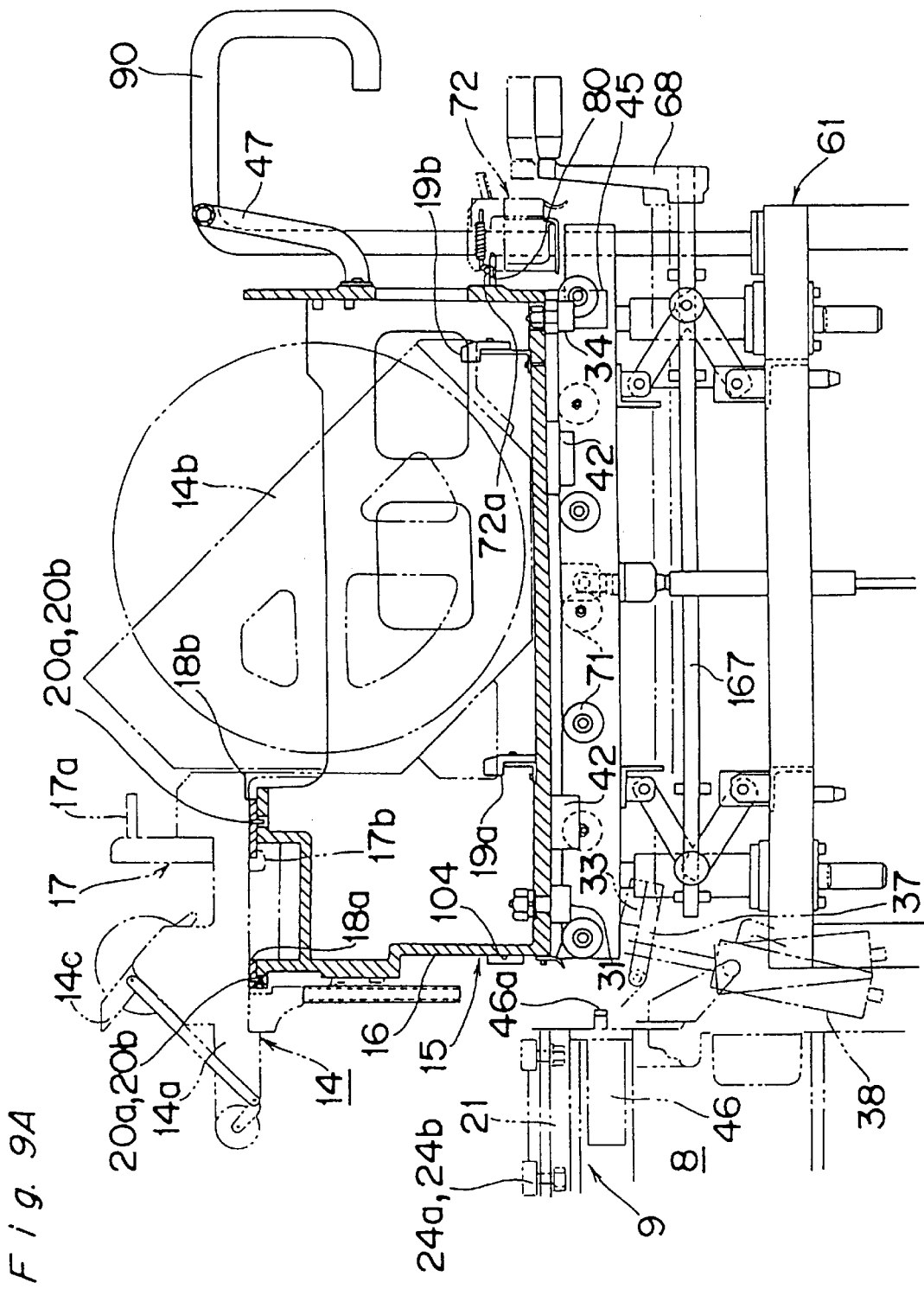
FIG. 9A is a sectional view showing a support section of the truck for supporting the transfer rack shown in FIG. 7.
Figure 9B:
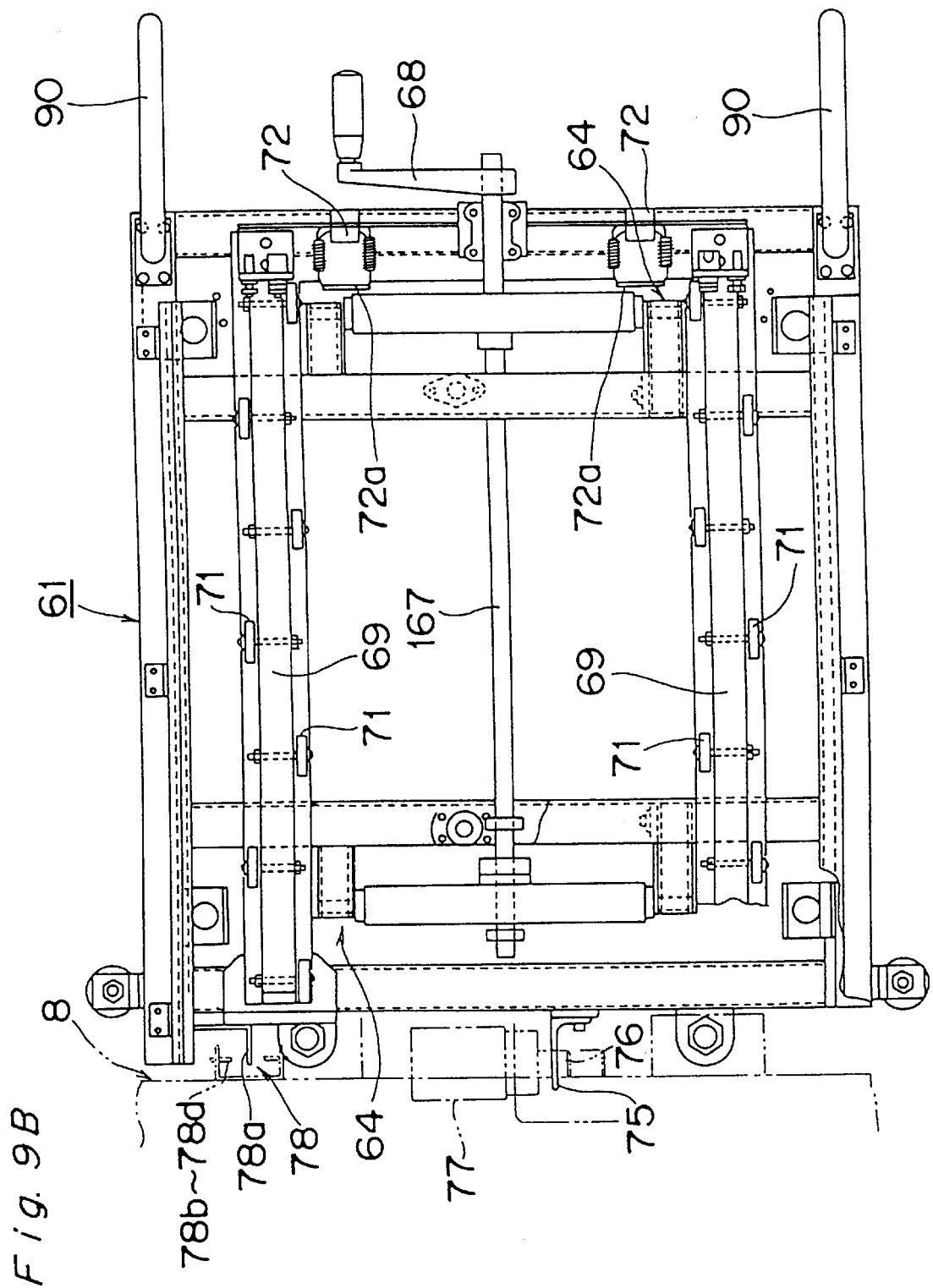
FIG. 9B is a plan view of the truck.
Figure 10:
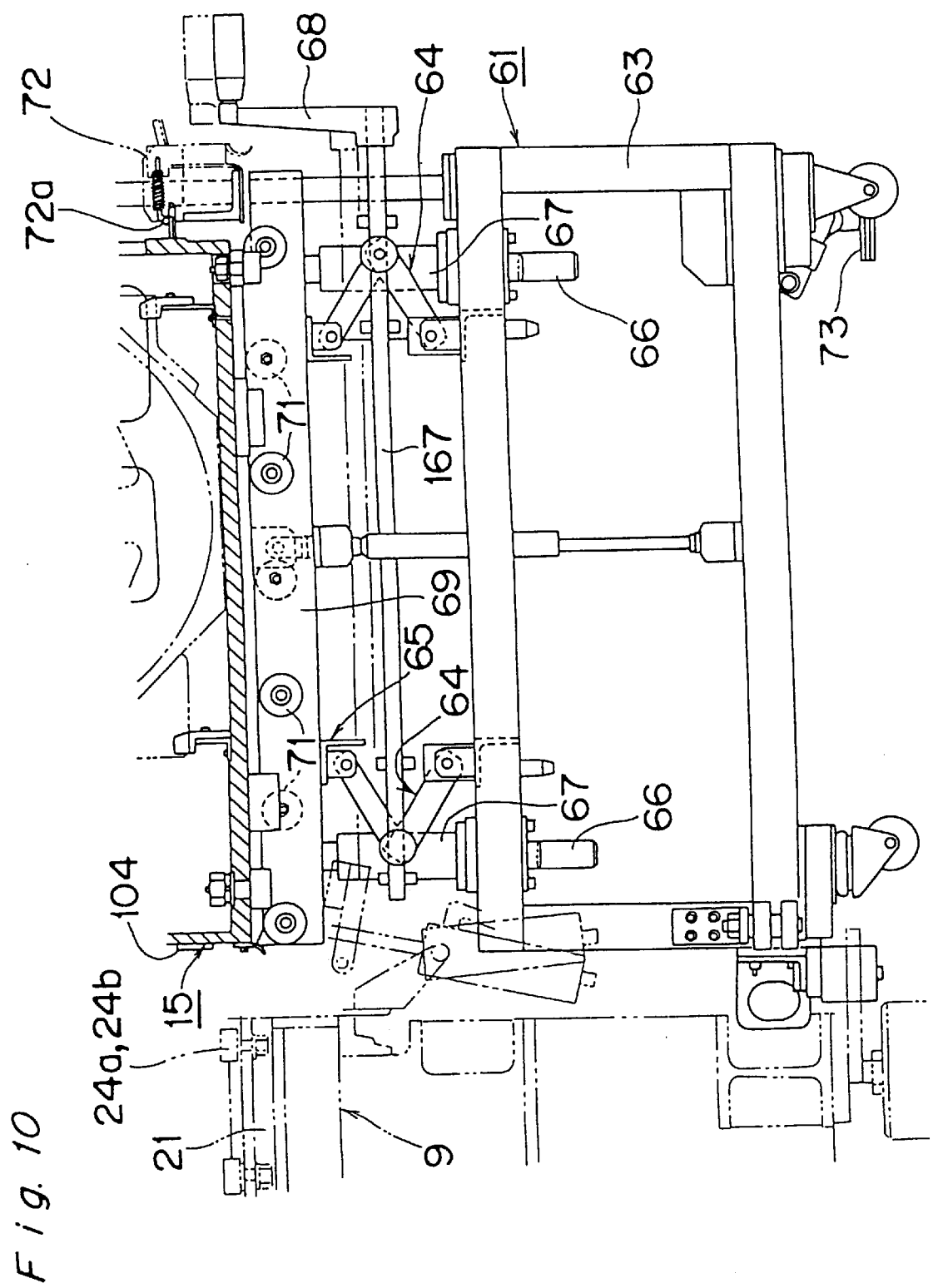
FIG. 10 is a side view of the truck shown in FIG. 7.
Figure 11A:
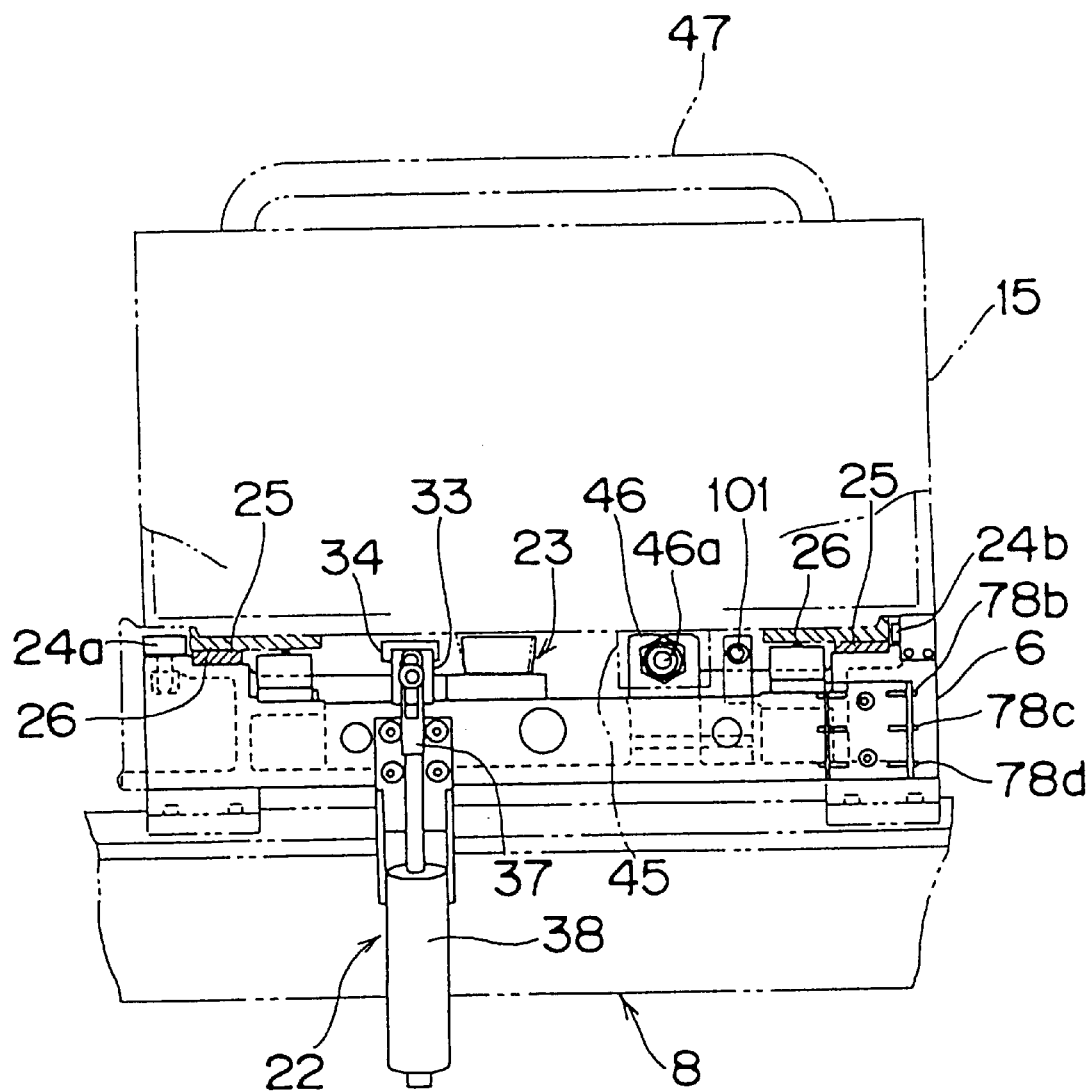
FIG. 11A is a front view of a transfer rack positioned on the transport stand shown in FIG. 2.
Figure 11B:
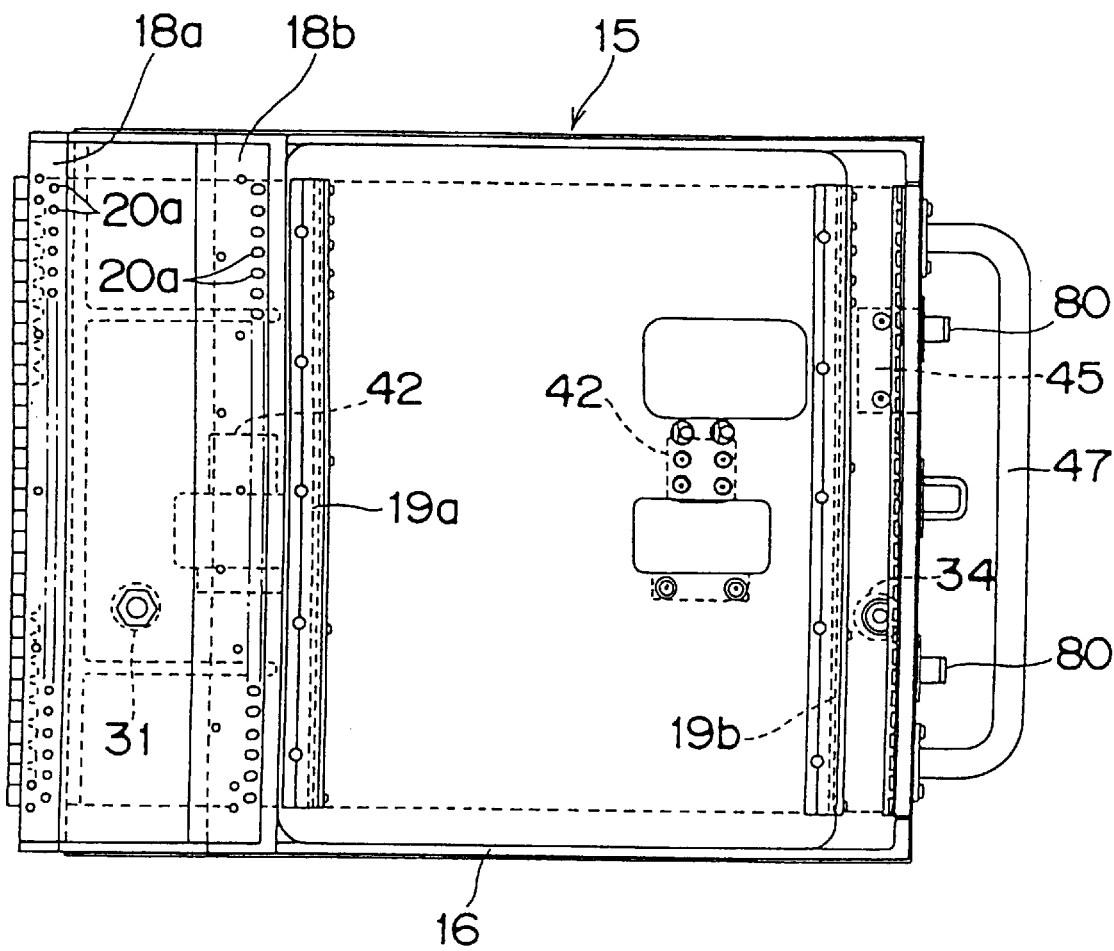
FIG. 11B is a plan view of a truck used in combination with the mounter shown in FIG. 2.

Such a positioning and retaining state can be securely retained by engaging a clamp hook 17b with the support rail 18b by operating a clamping lever 17a of a clamp mechanism 17 shown in FIGS. 9A, 9B. By releasing the above engagement, the positioning and retaining of the component supply cassette 14 is released to allow individual component supply cassette 14 to be removed. Therefore, each component supply cassette 14 can be changed at the transfer rack 15.

The first embodiment is equipped with, for example, seriated 60 component supply cassettes 14 required for supplying components to the mounter 2, or the objective working machine at the component supply section 8 so that the cassettes 14 can be positioned, loaded and unloaded.

The transport stand 9 receives the transfer rack 15 that is loaded with the component supply cassettes 14 so that the cassettes 14 can be individually positioned, loaded and unloaded in such a manner that it can be totally positioned as made removable, with which the electronic components can be selectively supplied from the component supply cassette 14 to the mounter 2. For the selective supply of the electronic components, the transport stand 9 at the component supply section 8 in the operating state is moved laterally by a servomotor 11, so that the component supply cassette 14 that can supply the required electronic components is moved to the component supply position of the component mounting head 6.

The component mounting head 6 operates the component supply cassette 14 to receive one electronic component every time it presses an operating lever 14c of the component supply cassette 14 on its own initiative in a known manner, sucks and holds it by the corresponding suction nozzle 7 and mounts it on the board 1.

In regard to each component supply cassette 14 positioned and retained individually at the transfer rack 15, the required one must be positioned correctly in the component supply position by the lateral movement of the transport stand 9, and it is also required to correctly position the transfer rack 15 on the transport stand 9. Therefore, in a loading/unloading path 21 of the transport stand 9 where the transfer rack 15 is loaded and unloaded as shown in FIGS. 3 through 5, a first positioning system 22 operating in the direction in which the transfer rack is loaded and unloaded and a second positioning system 23 operating in a direction perpendicular to the direction in which the transfer rack is loaded and unloaded are provided. Aside from the positioning systems 22 and 23, a plurality of guide rollers 24a and 24b for guiding the transfer rack 15 on the lateral sides are provided to facilitate a smooth loading and unloading of the transfer rack 15 without twisting or hitching the transfer rack.

Further, dimensional adjustment and positioning are performed with high accuracy so that the support height of the transfer rack 15 is correct, and rail members 25, each made of a material having an excellent abrasive resistance, are provided to receive rail members 26 provided likewise at the transfer rack 15 as shown in FIGS. 6A and 6C. The transfer rack 15 is also guided on the lateral sides by guide rollers 24a and 24b at the rail members 26, so that it can be smoothly loaded and unloaded.

As shown in FIGS. 4, 5, 10 and 11A, 11B, the first positioning system 22 is comprised of a receiving block 32 for receiving at a specified receiving position a positioning roller 31 (FIGS. 4, 10, and 11A, 11B) provided at the front end portion of the delivered transfer rack 15 and a pressure block 33 for positioning the transfer rack 15 in the direction in which the transfer rack 15 is loaded and unloaded by pressing the transfer rack 15 against the receiving block 32 from behind via a positioning roller 34 provided at the hind portion of the transfer rack 15 to hold the transfer rack 15 between them.

The pressure block 33 is supported by a combination lever mechanism 37. By advancing and retreating it by an air cylinder 38, the pressure block 33 is put in either a position in which it protrudes in the loading/unloading path 21 as shown in FIG. 3 to perform the positioning or a position in which it retreats below the loading/unloading path 21 as indicated by imaginary lines in FIGS. 9A, 9B, and 10 to release the positioning and does not disturb the loading and unloading of the transfer rack 15 in the loading/unloading path 21.

As shown in FIGS. 4 through 6, the second positioning system 23 is comprised of one-side receiving blocks 35 which receive the transfer rack 15 in a specified position at a side of the loading/unloading path 21 and roller type eccentric shafts 36 which press the transfer rack 15 against the one-side receiving blocks 35 at the other side to hold the transfer rack 15 between them to position the transfer rack 15 in a direction perpendicular to the direction in which the transfer rack 15 is loaded and unloaded. The eccentric shafts 36 are provided laterally in two places approximately at the center of the loading/unloading path 21 in FIG. 5 as pivotally driven via levers 40 by air cylinders 41 provided specially for them, and operates to press aligning blocks 42 provided on a bottom lower surface of the transfer rack 15 and release the pressure, thereby performing the positioning and releasing the positioning.

The guide rollers 24a and 24b guide the transfer rack 15 that is loaded or unloaded laterally with a slight play, where the one located on the one-side receiving block 35 side is positioned slightly outwardly of the block, so that it does not disturb the positioning of the transfer rack 15 by the second positioning system 23 using the one-side receiving block 35.

The eccentric shaft 36 is protruding in the loading/unloading path 21, however, it is allowed to have such a structure that the bottom lower surface of the transfer rack 15 does not interfere with it in the loading or unloading operation in the loading/unloading path 21. The aligning block 42 is correctly positioned and excellent in abrasive resistance so that the positioning can be correctly achieved.

If the transfer rack 15 is loaded and unloaded with the rail members 25 of the transport stand 9 put in contact with the rail members 26 of the transfer rack 15, their abrasion resistances operate to hinder smooth loading and unloading of the transfer rack 15, also causing abrasion of the rail members 25 and 26 in an early stage. Therefore, in order to avoid these troubles, the present embodiment is provided with free flow conveyors 44 arranged inside the rail members 25 in parallel with them, as shown in FIGS. 4, 5, and 6.

The free flow conveyor 44 is laterally, in FIG. 4, provided with a plurality of guide protrusions 44b which are made to protrude and retreat by an air operation on its upper surface. When the guide protrusions 44b protrude upward, they push up the rail members 26 of the transfer rack 15 to lift them above a rail member 43. By receiving the transfer rack 15 in an air-cushion like light contact state at the upper ends of a number of guide protrusions 44b, the transfer rack 15 can be loaded and unloaded smoothly and silently with reduced abrasive resistance.

The transport stand 9 is further provided with an air cushion cylinder 46 which abuts against a block 45 fixed to the transfer rack 15 immediately before the transfer rack 15 is delivered to a specified position and received by the receiving block 32 as abutted against it (FIGS. 4, 5, 6, and 9A, 9B) and operates to alleviate an impact when the transfer rack 15 is delivered via an actuator 46a. At a hind part of the transfer rack 15 is provided a handle 47 for loading and unloading it.

In order to change the transfer rack 15 loaded with a number of the component supply cassettes 14 at the transport stand 9 of the component supply section 8, a truck 61 as shown in FIGS. 7 through 10 is used. This truck 61 has a frame-shaped main body 63 having running wheels 62, and the main body 63 is provided with a transfer rack support section 65 that is adjusted in height by toggle mechanisms 64. The height adjustment is performed with the transfer rack 15 retained in the transfer rack support section 65 to perform level adjustment with the transport stand 9 of the component supply section 8, thereby allowing the transfer rack 15 to be securely passed without hitching or the like.

The transfer rack support section 65 is supported and guided so that guide rods 66 provided depthwise in two places can be moved up and down by guide pipes 67 provided at a fore part and a hind part of the main body 63. The toggle mechanism 64 is provided between the main body 63 and the transfer rack support section 65, and the toggle mechanism 64 is extended or contracted by turning a screw shaft 167 by a handle 68 to move the transfer rack 65 up and down. Therefore, by extending and contracting the toggle mechanism 64 by the handle 68, the transfer rack 15 can be adjusted in height.

As shown in FIGS. 7 through 9B, the transfer rack support section 65 has a frame-like shape and is provided with guide rollers 71, on the both sides' frames 69, which receive the transfer rack 15 from below at the rail members 26 to facilitate the loading and unloading of the transfer rack 15. However, it retains the transfer rack 15 in a specified position by connecting buckles 72a of retainers 72 with metal hooks 80 of the transfer rack 15, so that the transfer rack 15 is prevented from falling off. With this arrangement, the truck 61 can be freely moved with the transfer rack 15 carried thereon. Furthermore, the transfer rack support section 65 has side guides 70 that are made of a material such as synthetic resin having a good sliding performance and operate to guide the transfer rack 15 put on them, with which the possible rattling of the transfer rack 15 when the truck 61 is moving can be sufficiently prevented.

Furthermore, in order to change the transfer rack 15 at the transport stand 9 of the component supply section 8, it is required to stabilize the transfer rack 15 in a specified position. In order to satisfy this requirement, a stand stopper 73 is provided at a portion of the main body 63 to be moved up and down by a foot pedal 74. When the stand stopper 73 is lowered, it abuts against the floor surface to stretch between the main body 63 and the floor surface, thereby preventing the main body 63 from moving with the running wheels 62. When the stand stopper 73 is raised, the stretch between the main body 63 and the floor surface is released to allow the main body 63 to freely move with the running wheels 62. The truck 61 is provided with handles 90 for the movement.

Furthermore, the truck 61 and the component supply section 8 are provided respectively with a connecting bracket 75 and a connecting rod 76 which connect together when the truck 61 is put in a specified positional relation with the transport stand 9 of the component supply section 8. The connecting rod 76 is made to advance and retreat by an air cylinder 77 to effect the connection and release of the connection.

Furthermore, whether or not the transfer rack support section 65 and the transport stand 9 of the component supply section 8 coincide with each other in support height with respect to the transfer rack 15 is important because it determines whether or not the passing of the transfer rack 15 between them can be performed smoothly without hitching nor twisting. Therefore, the present embodiment is provided with a height detecting device 78 for deciding whether the transfer rack support height of the transfer rack support section 65 of the truck 61 is equal to, higher than, or lower than the support height of the transfer rack 15 at the transport stand 9 between the truck 61 and the component supply section 8. With this arrangement, the height adjustment of the transfer rack support section 65 by the toggle mechanisms 64 can be achieved properly in a short time.

As shown in FIGS. 8–11B, the height detecting device 78 is comprised of a slit plate 78a provided at the transfer rack support section 65 and photocouplers 78b through 78d which detect whether the height of the slit plate 78a is higher than, lower than or at the set height in three steps.

An example of a procedure or executing the collective change of the component supply cassettes 14 at the component supply section 8 will be described below.

Figure 12:
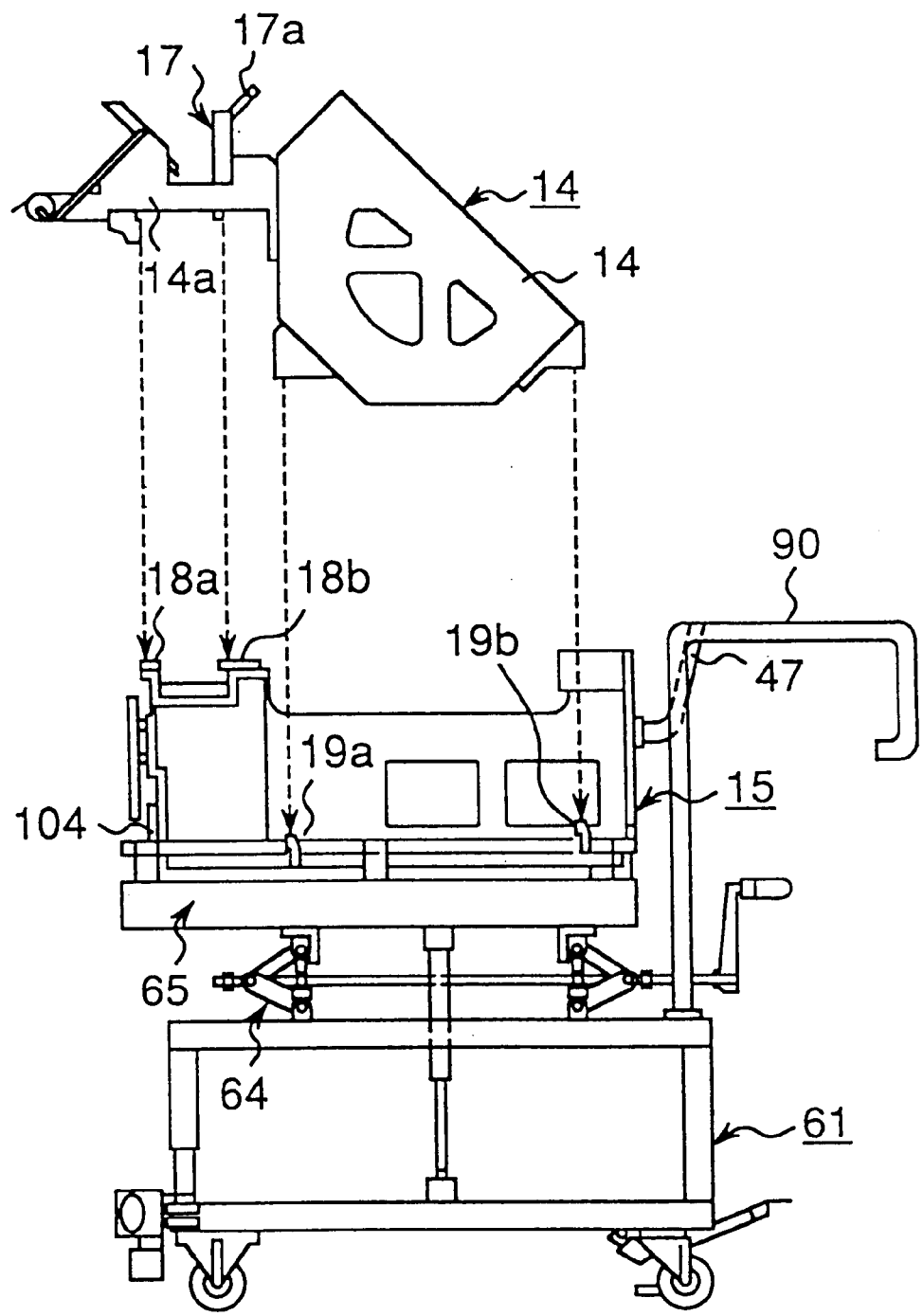
FIG. 12 is a side view showing a working stage of positioning and supporting a component supply cassette on the transfer rack on the truck.

First, in parallel with supply of components at the component supply section 8 of the mounter 2 shown in FIGS. 1A–2, the transfer rack 15 put on the truck 61 as shown in FIG. 12 is loaded with a required number of component supply cassettes 14 so that the cassettes can be individually positioned, loaded and unloaded to form for the subsequent component change. Therefore, to supply depleted components, a component supply cassette 14 storing therein the same component as the component that is currently supplied at the component supply section 8 is to be loaded. To change the type of the components, a component supply cassette 14 storing therein new components for the change is to be loaded.

In the present embodiment, while one of two component supply sections 8 is supplying components, the other is in the standby state. Therefore, in the case where the component supply section 8 to be put in the standby state when the component supply cassette 14 is depleted at the transfer rack 15 loaded in the component supply section 8 or when the component to be supplied in the subsequent component supply stage is to be changed is put in the standby state and requirement of supply or change of the components is detected and displayed, the transfer rack 15 at the component supply section 8 put in the standby state is taken out and replaced by a transfer rack 15 loaded with new component supply cassettes 14, thereby executing the collective change of the components. The collective change by the transfer rack 15 at the component supply section 8 can be detected by a microswitch 101 as shown in FIGS. 4–6, and 7 provided at the transport stand 9, and based on this detection, the propriety of the components after the collective change is automatically decided. It is to be noted that the decision can be executed on the components loaded initially collectively in the transfer rack 15.

When the transfer rack 15 is delivered to the transport stand 9 and loaded, the microswitch 101 is pressed by this to be turned on to detect the loading of the transfer rack 15. When the transfer rack 15 is withdrawn from the transport stand 9 to be removed, the pressure from the transfer rack 15 is released to be turned off to detect the removal of the transfer rack 15. With the change of the state of the microswitch 101 from the non-detection state to the detection state in regard to the transfer rack 15, the occurrence of the loading of the transfer rack 15 can be decided. With a shift of the state of the transfer rack 15 from the detection state via the non-detection state to the detection state again, the occurrence of the collective change of components by the transfer rack 15 can be decided.

Such a decision is executed, for example, by a control system 102 as shown in FIGS. 1A, 1B for controlling the operations of the mounter 2 and the component supply section 8. Therefore, to the control system 102 are inputted an operating signal from a console panel 103 specially provided for the component supply section 8, detection signals from the photocouplers 78b through 78d of the height detecting device 78, and a variety of detection signals representing operation states as well as an ON/OFF signal from the microswitch 101. When occasion demands, the console panel 103 can be commonly used with the console panel of the mounter 2.

Furthermore, for the decision of the propriety of the components for change, a memory 104 is provided at the transfer rack 15 as shown in FIGS. 13–21, and information of each component stored in each component supply cassette 14 loaded on the transfer rack 15 is stored. If the storage is effected every time the transfer rack 15 is loaded with each component supply cassette 14 as shown in FIG. 12, error is reduced, preferably. However, the present invention is not limited to this, and the storage may be effected at another point of time such as a point of time when the required component supply cassette 14 has been loaded.

Figure 13:
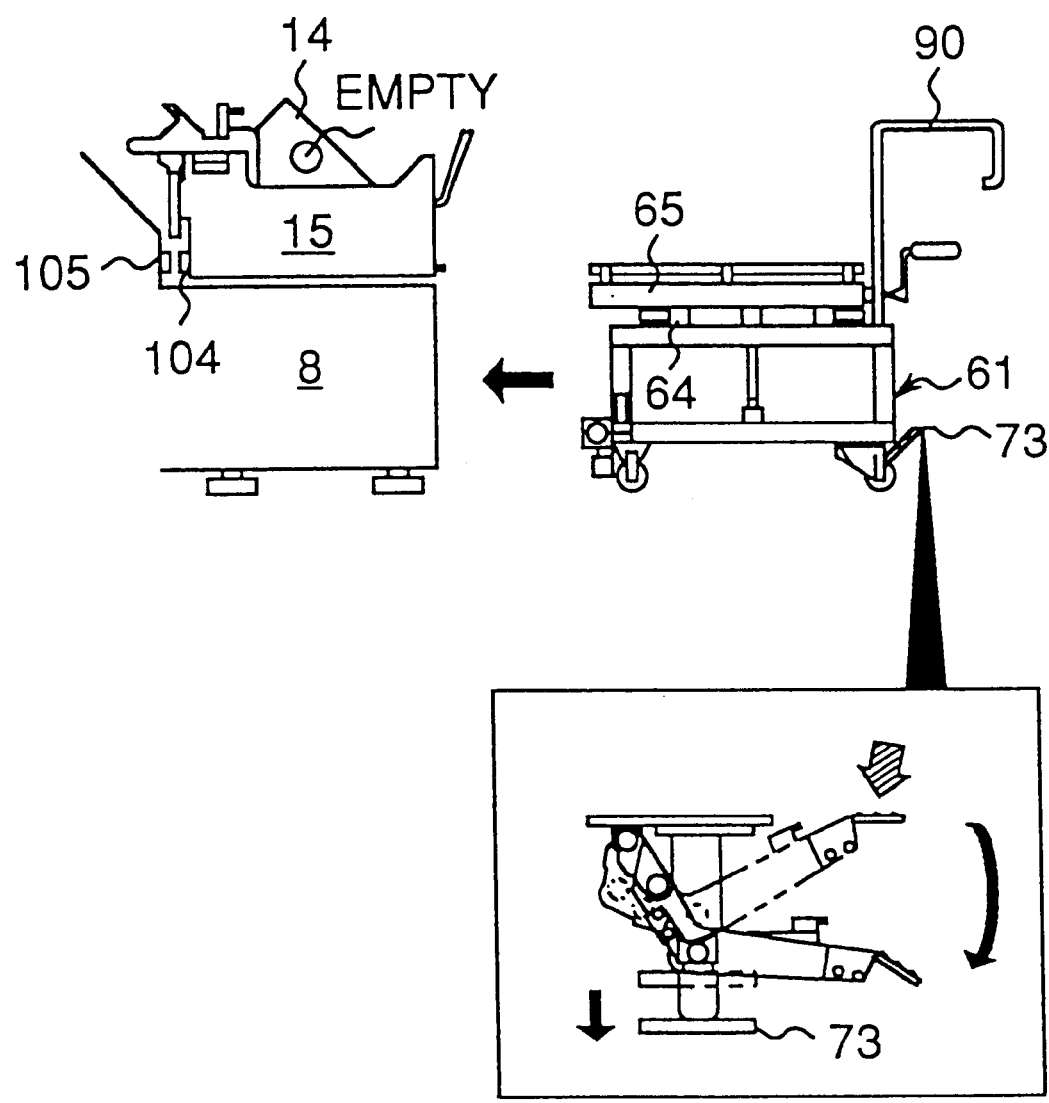
FIG. 13 illustrates side views showing a working stage of preparing an empty truck for removing the cassette in changing a depleted component supply cassette at a component supply section.

The memory 104 is implemented as a memory capable of reading and writing. In correspondence with this, a reading/writing device 105 for reading and writing component information at the memory 104 as shown in FIGS. 13 and 14 is provided at the component supply section 8, and this is also connected to an input/output port of the control system 102. The component information is the number of components stored in each component supply cassette 14 and the like other than the type of components. In regard to the number of components, the numbers of used ones and remaining ones are recorded according to the supply of components, and it can be used for another purpose such as decision of the depletion of components.

It is to be noted that the memory 104 may be a read-only memory. In this case, it is proper to use a reading device instead of the reading/writing device 105, so that the construction and control can be made simple.

The control system 102 is connected at its output side to an indicating lamp 100 for indicating the proprieties of the states of the mounter 2 and the component supply section 8 and various operations, a warning device 106 comprised of a letter indication, a buzzer, an indicating lamp, or an appropriate combination of them for giving a warning on the console panel 103 when the result of deciding the component is improper, the air cylinder 77, the first and second positioning systems 22 and 23, the free flow conveyor 44, and the like, and operates to control their operations. The indicating lamp 100 can be commonly used as the warning device 106.

The control system 102 manages the number of remaining components in each component supply cassette 14 loaded in the component supply section 8. When component depletion occurs, the control system 102 displays it by the indicating lamp 100 or the console panel 103 and informs the operator of it at need by issuing an alarm sound.

FIG. 13 shows an initial work of the procedure for withdrawing the transfer rack 15 loaded with the depleted component supply cassette 14 from the component supply section 8 in the standby state. As shown in FIG. 14A, an empty truck 61 is arranged opposite to the component supply section 8 in the standby state to put them in the correct positional relation. In the above state, the air cylinder 77 is operated by operating a truck lock key and the like on the console panel 103, so that the connecting rod 76 is engaged with the connecting bracket 75 as shown in FIG. 14A to connect and fix the truck 61 in the position. In the above state, the stand stopper 73 is operated as shown in FIG. 14B to prevent the main body 63 from vainly moving from the connecting position.

Subsequently, the height adjustment of the transfer rack support section 65 on the truck 61 and the component supply section 8 is performed by the toggle mechanisms 64. The height adjustment is performed so that the indicating lamp 100 emits green light for indicating the propriety in accordance with the detection of the height detecting device 78 as shown in FIG. 14B.

When the height adjustment is completed, the automatic first and second positioning systems 22 and 23 are made to automatically enter into a positioning release state by a positioning key and the like on the console panel 103, and thereafter the free flow conveyor 44 is moved upward by a free flow key and the like on the console panel 103 to complete the formation.

Figure 15:
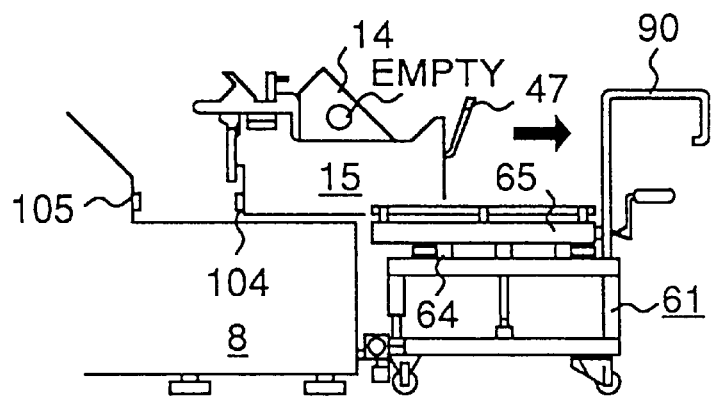
FIG. 15 is a side view of a working stage of unloading a depleted component supply cassette at the component supply section by the truck after the height adjustment in FIGS. 14A and 14B.
Figure 16A:
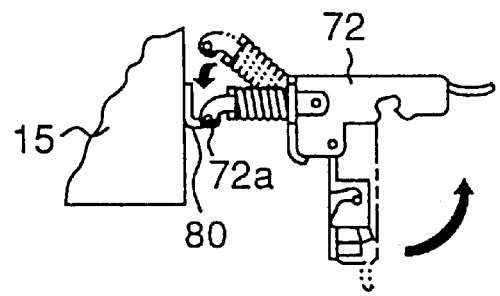
FIGS. 16A and 16B are side views showing a state of a position retaining work exhibiting a working stage of retaining the depleted component supply cassette at a point of time when it is unloaded to a specified position.
Figure 16B:
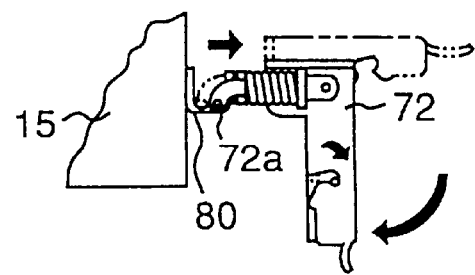

With this formation completion, the transfer rack 15 on the component supply section 8 is passed to the truck 61 as shown in FIG. 15 to draw out the transfer rack 15 onto the transfer rack support section 65. The removal of the transfer rack 15 from the transport stand 9 in this stage is detected by the microswitch 101. When the transfer rack 15 is placed in a specified position on the truck 61, the transfer rack is held on the truck 61 by engaging the buckles 72a of the retainers 72 with the metal hook 80 according to a procedure as shown in FIGS. 16A and 16B.

Then, by operating again the truck lock key, the connection of the connecting bracket 75 with the connecting rod 76 between the truck 61 and the component supply section 8 is released, and the stand stopper 73 is raised to release the movement preventing state effected by it.

Figure 17:
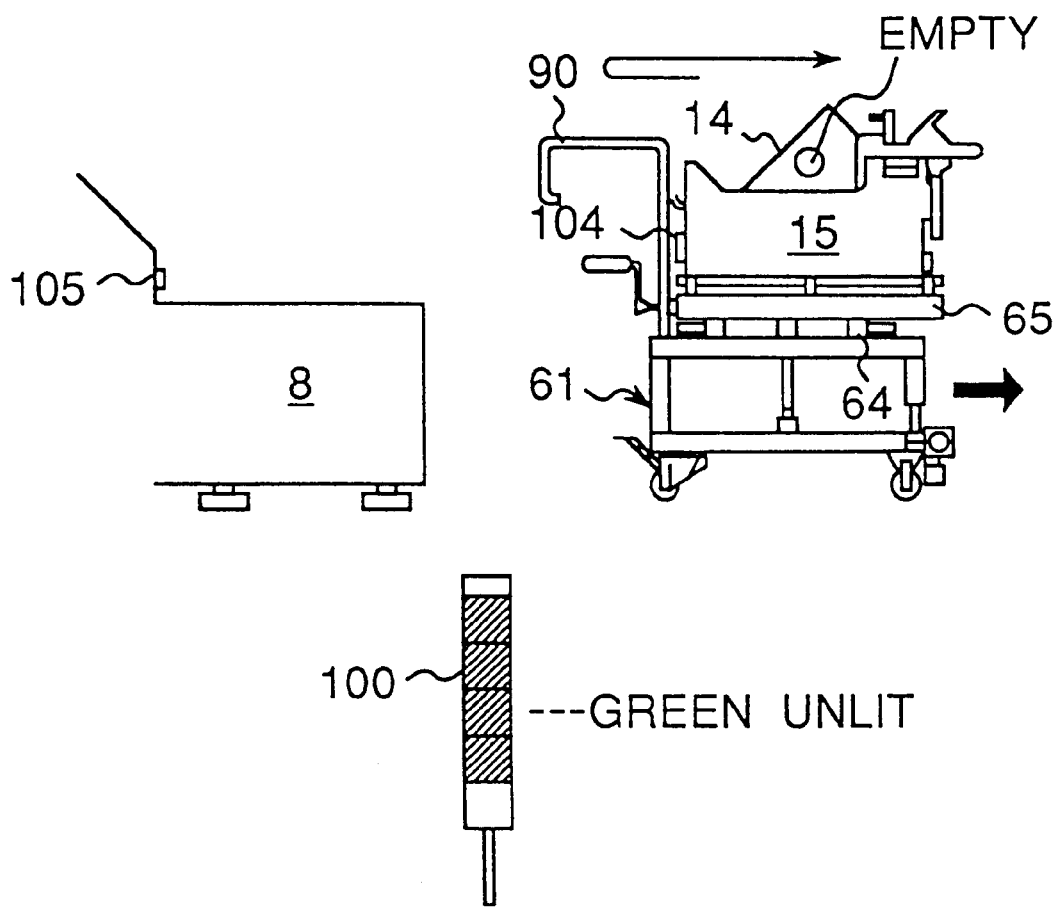
FIG. 17 is a side view showing a working stage of carrying the transfer rack by the truck with the transfer rack retained in position.
Figure 18:
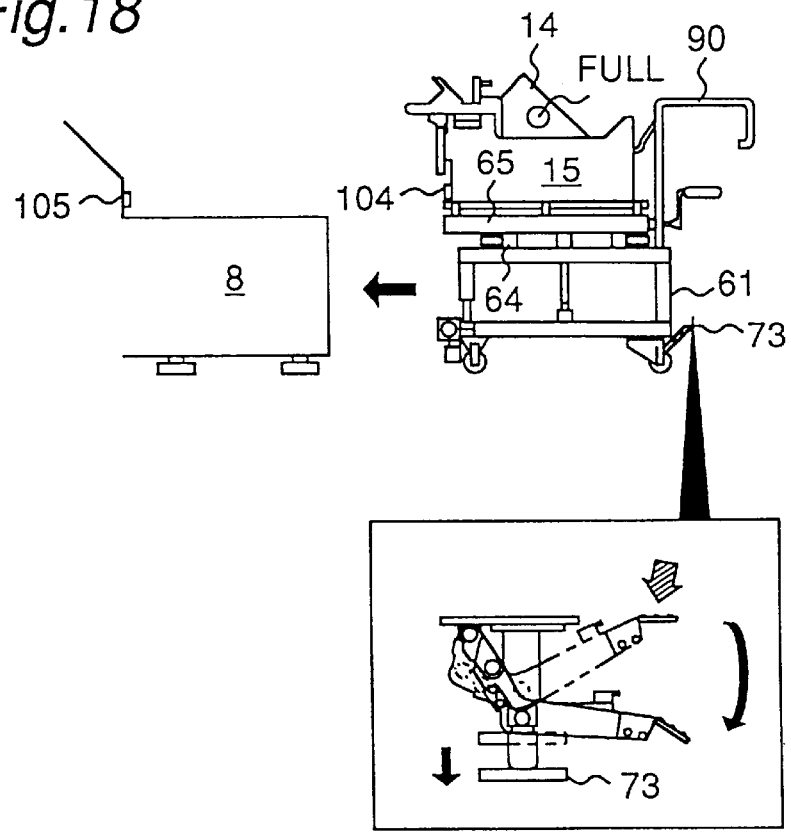
FIG. 18 is a side view showing a working stage of carrying a transfer rack loaded with a new component supply cassette by the truck to the component supply section and positioning it.

Subsequently, the truck 61 is moved to a specified working position as shown in FIG. 17. The movement of the truck 61 from the component supply section 8 is decided by the control system 102 upon the non-interrupted state of the photocouplers 78b through 78d of the height detecting device 78, and the indicating lamp 100 is unlit. The working position is the position where a work of newly storing components in the depleted component supply cassette 14 or a work of changing the cassette for a component supply cassette 14 that is storing components to be subsequently required is performed.

Figure 19:
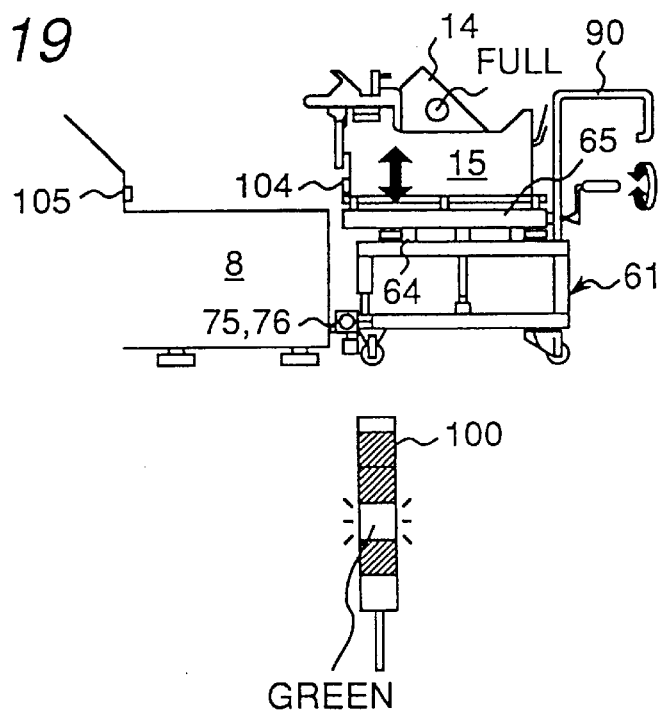
FIG. 19 is a side view showing a working stage of adjusting in height the transfer rack loaded with the new component supply cassette on the truck relative to the component supply section.

In the component supply section 8 from which the truck 61 has been removed, a previously formed or newly formed truck 61 equipped with a transfer rack 15 loaded with each component supply cassette 14 accommodating therein a required amount of necessary components is moved from the above-mentioned working position as shown in FIG. 19. When they are put in the specified positional relation, by operating the truck lock key, the truck 61 is connected to the component supply section 8. Further, by operating the stand stopper 73 in the same manner as described above, the movement of the truck 61 is prevented and the height adjustment of the transfer rack 15 is performed.

Figure 20:
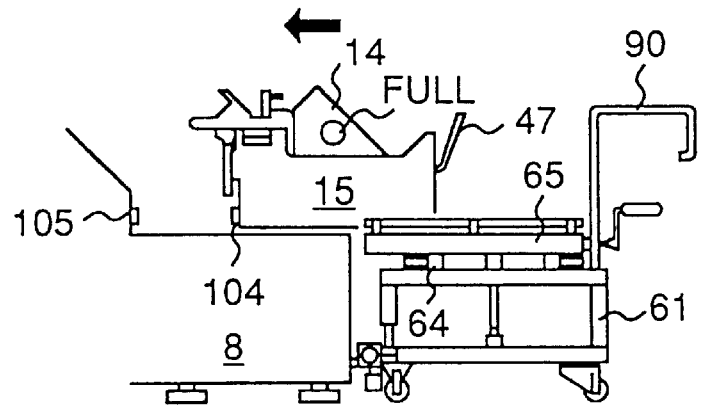
FIG. 20 is a side view showing a working stage of delivering the transfer rack after the height adjustment from on the truck onto the component supply section.

When the above operation is completed, the transfer rack 15 on the truck 61 is passed to the component supply section 8 as shown in FIG. 20 to deliver the transfer rack 15 from the truck 61 onto the component supply section 8, thereby performing the collective change. Subsequently, the free flow key and the like are operated on the console panel 103 to move down the free flow conveyor 44, and thereafter the automatic first and second positioning systems 22 and 23 are operated by the positioning key and the like to position the transfer rack 15 on the transport stand 9.

Figure 21:
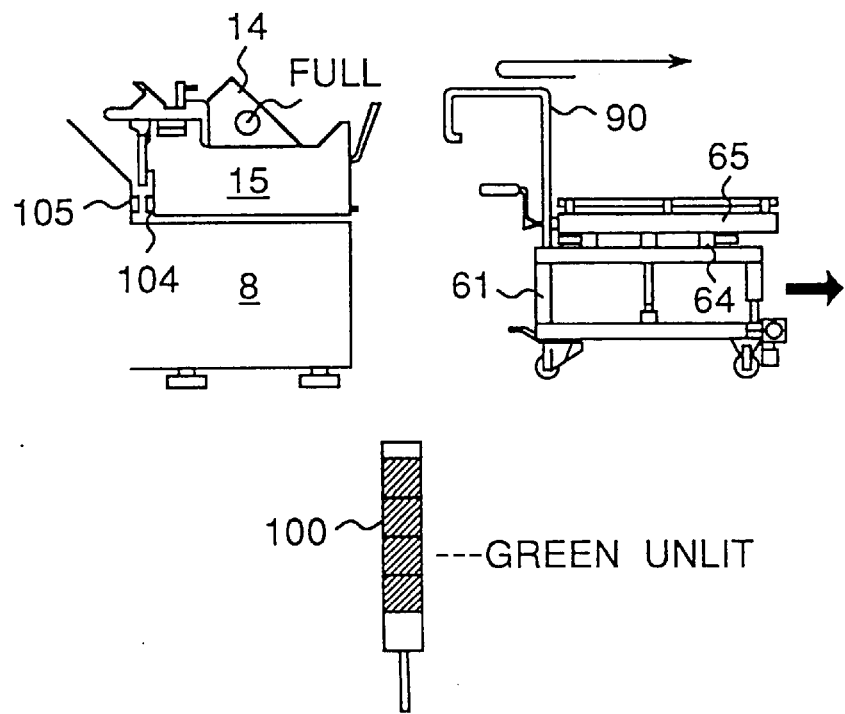
FIG. 21 is a side view showing a working stage of moving the truck to a specified position after the transfer rack has been delivered to the component supply section.

It is noted that the cart 61 that has become empty can be moved again to the working position as shown in FIG. 21 so as to be ready for the next task.

Figure 22:
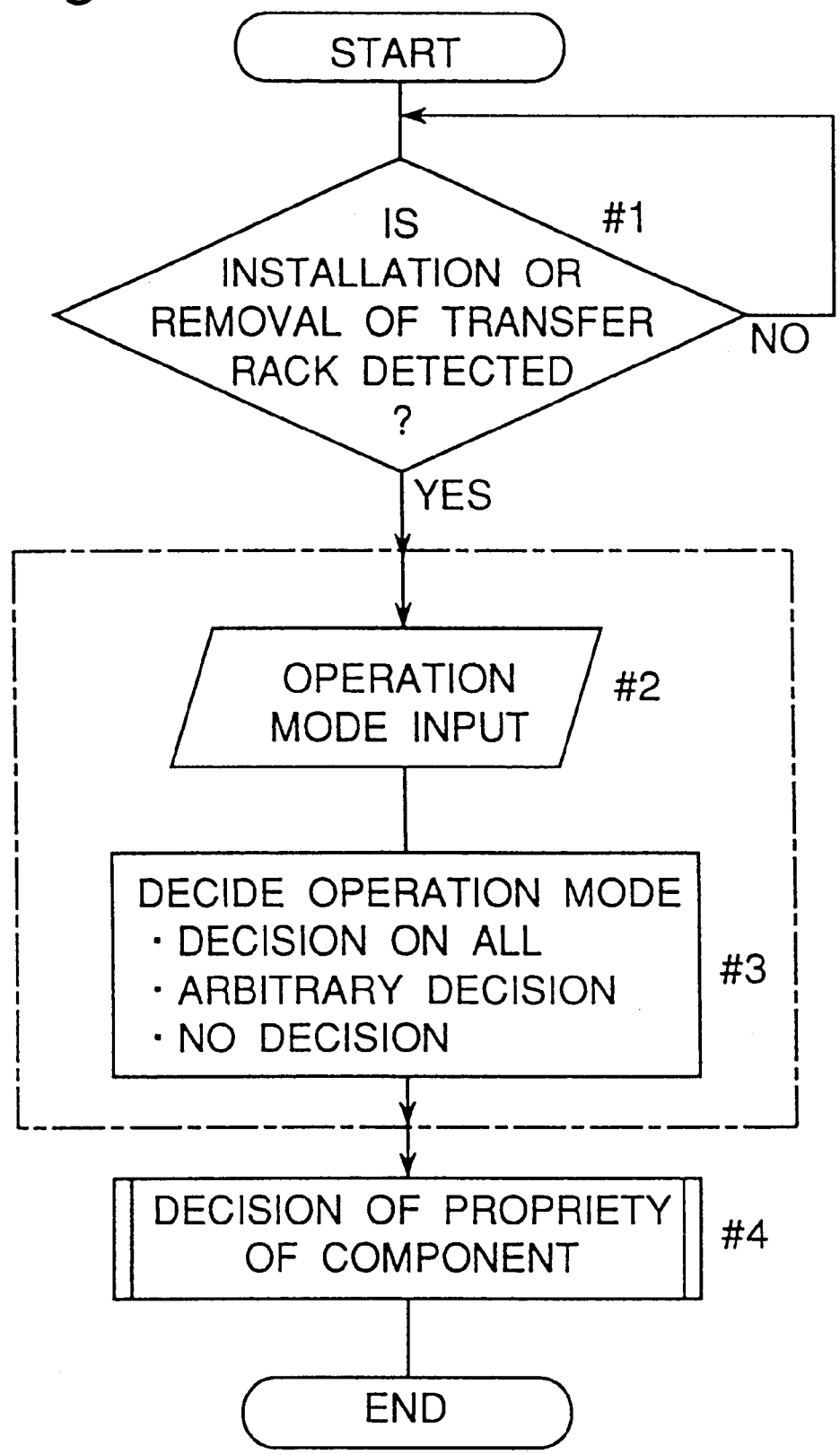
FIG. 22 is the main flow of component decision.

The control system 102 executes a component decision processing control on the collectively changed components according to a flowchart as shown in FIG. 22. Only when the occurrence of the loading or unloading of the transfer rack 15 is decided by an ON/OFF history of the microswitch 101 in step #1, are the component decision control in step #2 and the subsequent steps executed. In step #2, selection of an operation mode by a mode selecting key on the console panel 103 is accepted.

The operation mode to be selected is any of the operation mode of executing no decision on, for example, the propriety of the component, the operation mode of executing decision on all ones and the operation mode of executing decision on only the required one. The component to be determined as one to be subjected to decision is, for example, a component depleted, a component subject to change due to alteration of the product type or the like, and such a component can be inputted by operating the console panel 103 or automatically designated by the control system 102.

It is also acceptable to execute the component propriety decision always on all component supply cassettes 14 without performing the operation mode setting as above.

Figure 23:
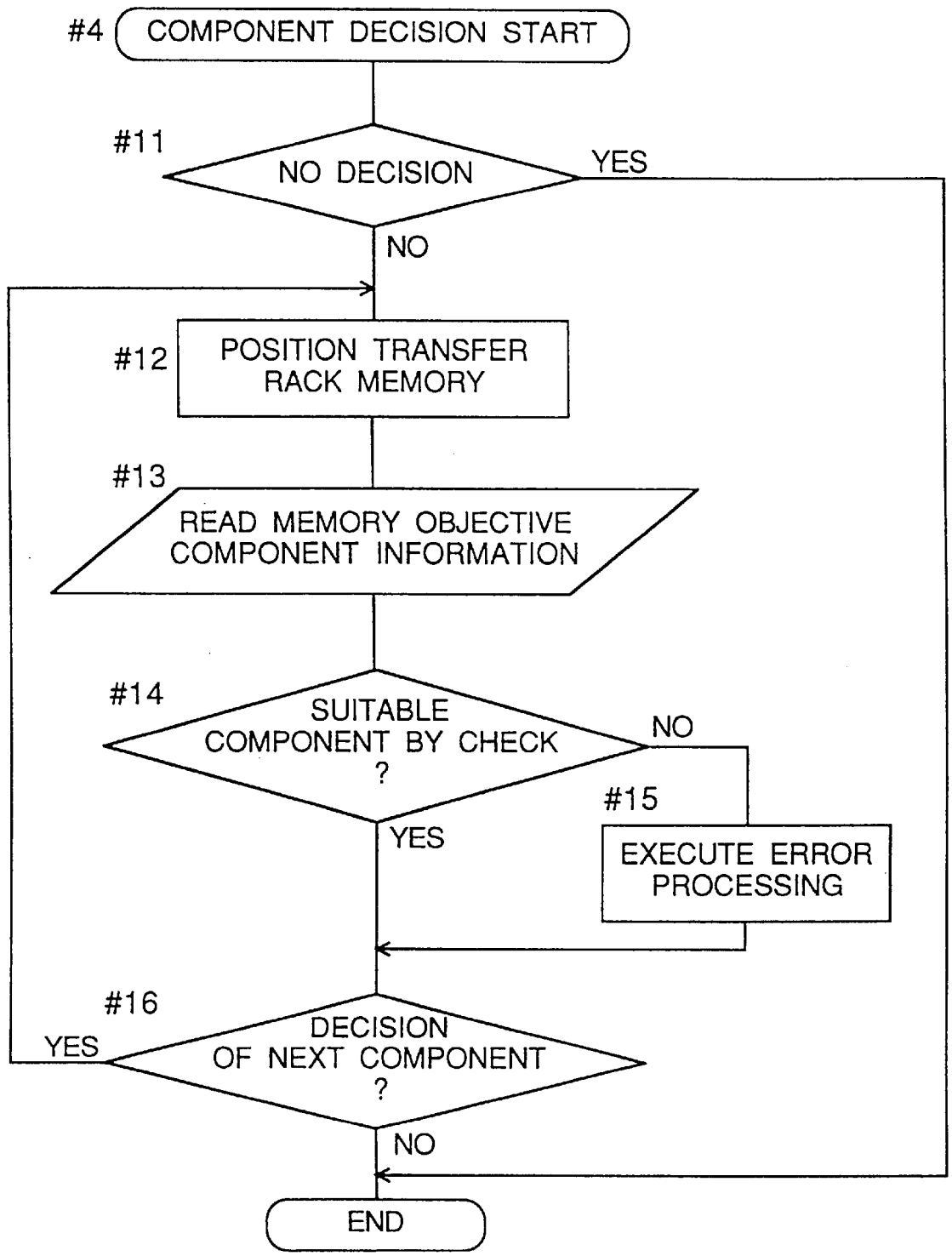
FIG. 23 is a flowchart of a component propriety decision subroutine of FIG. 22.

In step #3, the selected operation mode is decided and the program flow proceeds to a component decision subroutine of step #4. As shown in FIG. 23, the component decision subroutine of step #4 is to execute control of step #12 and subsequent steps only in the case where decision of component is executed in step #11. In step #12, according to the position control of the transfer rack 15 positioned on the transport stand 9 of the component supply cassette 14, a memory 104 provided at the transfer rack 15 is subjected to positioning with the reading/writing device 105 provided at the component supply section 8, and the program flow proceeds to step #13.

In step #13, component information of the component to be subjected to decision according to the operation mode, i.e., whether it is the component relevant to all the component supply cassettes 14 or the component relevant to the designated component supply cassette 14 is read from the memory 104. Then, in step #14, the read component information and a preset list of required components are cross-referenced to each other to decide whether or not the objective components after the collective change are proper or improper.

The mounter 2 of the first embodiment has a component inspecting device 222 comprising an illuminating device and a recognition camera in combination for the purpose of deciding the appropriateness or inappropriateness of electronic components held by the nozzles 7 or chucks as well as of their direction. Data for this inspection is created from the component text data B by the data processor 203, and included in the mounting data C. This allows the control system 102 to receive this data via the data processor 208 and to inspect the appropriateness or inappropriateness of components of the device 222 by taking the data as the criteria for component decision. Accordingly, inspection data proper for to-be-mounted components can also be obtained automatically, so that more proper inspection of mounting components can be attained with the necessary labor and time unchanged, and that correct component mounting can be ensured.

The component supply cassettes 14 can be treated and replaced in units of a specified number collectively by the transfer rack 15, facilitating the replacement and replenishment of components. Further, accommodated component information of the component supply cassettes 14 is provided collectively in the memory 104 or the like provided to the transfer rack 15, so that they can be read at one place by the reading/writing device 105, taking less time for reading process and therefore improving the productivity. Since the memory 104 is readable and writable, the mounting conditions at the mounter 2 can be written so as to be usable as a material for component control matching the mounting conditions.

With the microswitch 101 provided as a detection device (detector) for detecting the loading/unloading of component supply cassettes 14, when the control system 102 has decided from detection of a loading/unloading of the component supply cassettes 14 that a replacement of components has occurred, the accommodated component information on the component supply cassettes 14 is read so that the appropriateness or inappropriateness of the components is decided. Thus, it is enabled to prevent such occurrences that the mounter 2 continues operating even with the components mis-replace, resulting in a trouble, or that time and mounting operation are wasted.

In particular, when the reading of accommodated component information is effected on all the component supply cassettes 14 in the unit of collective replacement that has replaced the predecessor, all the cases can be treated simply without deciding which component supply cassettes have been replaced out of the component supply cassettes of the collective replacement.

The control system 102 preferably has internal or external storage device which has stored therein substitute component data of substitute components as to equivalent components or compatible other-company components that can be substituted for the to-be-mounted components. With such an arrangement, if a component has been decided to be inappropriate, it can be decided whether or not a component is a corresponding substitute of the component, based on the substitute component data. So, even when a substitute component is used at an exhaustion of components, the decision as to whether or not the mounting component is appropriate can properly be made responsive to this. Thus, it becomes possible to prevent such trouble that use of a substitute component may be decided as an improper component.

The storage medium 212 according to the first embodiment of the present invention stores both the component text data B and the image data IM corresponding to various kinds of components as described hereinabove, and can be used also as a component electronic catalog for displaying information on various types of components according to a specified search procedure, as in the conventional case. Both the image data IM and component text data B stored in the storage medium 212 can be read out for every same component by the reading device 201 in a predetermined search operation, supplied as a video signal D to a display 213 of the data processor 203 and displayed on the same screen. In addition, the component text data b can be output to other devices through an output operation.

Since the image data IM and component text data B stored in the storage medium 212 are displayed for every same component on the same screen of the display 213 by the search operation, the search and selection among various kinds of components is enabled. Also the component text data B can be utilized for processing of various data because the data can be output to other devices if necessary.

When the above storage medium 212 storing the image data IM and component text data B is outside the apparatus as component electronic catalog 212 the first embodiment, various data can be input independently of the data processor 203 which is an apparatus for forming the mounting data, and changed or added easily. Moreover, the storage medium can be used in common in various mounters 2.

In the case where the data of the storage medium 212 storing the component text data B are transmitted through communication, one storage medium 212 is commonly used among many mounters 2 without limits to the location. Furthermore, this is convenient to form, manage, change, or add the component text data B. The above communication is carried out by wire, radio, telephone line, optical communication or any other method not specifically determined.

Figure 31:
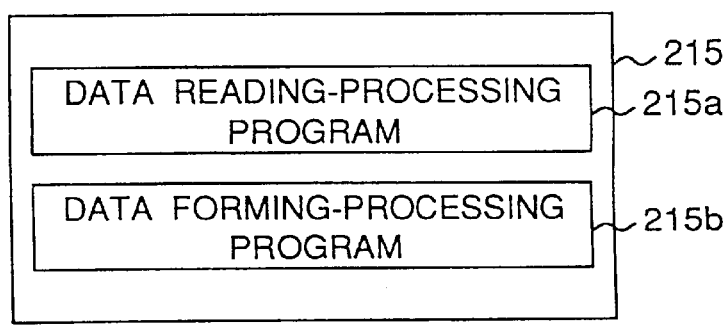
FIG. 31 is a block diagram of an example of contents stored in a storage medium which stores programs for forming the component mounting data by using the component electronic catalog.

Meanwhile, the data-processing program used in the data processor 203 can be stored in an external CD-ROM 215 as shown in FIG. 31 or other appropriate storage media. The stored contents of the program are a data-reading program file 215a and a data forming-processing program file 215b. The data reading-forming program file 215a relates to a program for reading out, by controlling the data reading device 201, the component text data b corresponding to the components to be mounted at the mounting positions from the component text data B necessary for mounting of components, e.g., shapes, dimensions, packing forms, colors, etc. of the components which is preliminarily formed together with the image data IM of components including the components to be mounted and stored in the storage device, for example, the storage medium 212 on the basis of the mounting position data A related to the mounting positions including mounting angles of the components to be mounted. The data-forming program file 215b relates to a program for forming, by controlling the data forming device 202, the mounting data C for the mounter 2 to receive and mount the components to be mounted to the respective mounting positions from the mounting position data A and the data including the component text data b read out by the data reading device 201 in correspondence with the mounting position data A. However, the stored contents of the program are not limited to the above, and the specific stored form may be selected freely.

In the above-described constitution of the present invention, data of various programs can be input, independently apart from the data processor 203 as the mounting data forming apparatus and changed, or added easily. The programs may be commonly used among mounters 2 of the same type.

The formation of the mounting data C will be discussed more specifically below.

Figure 32:
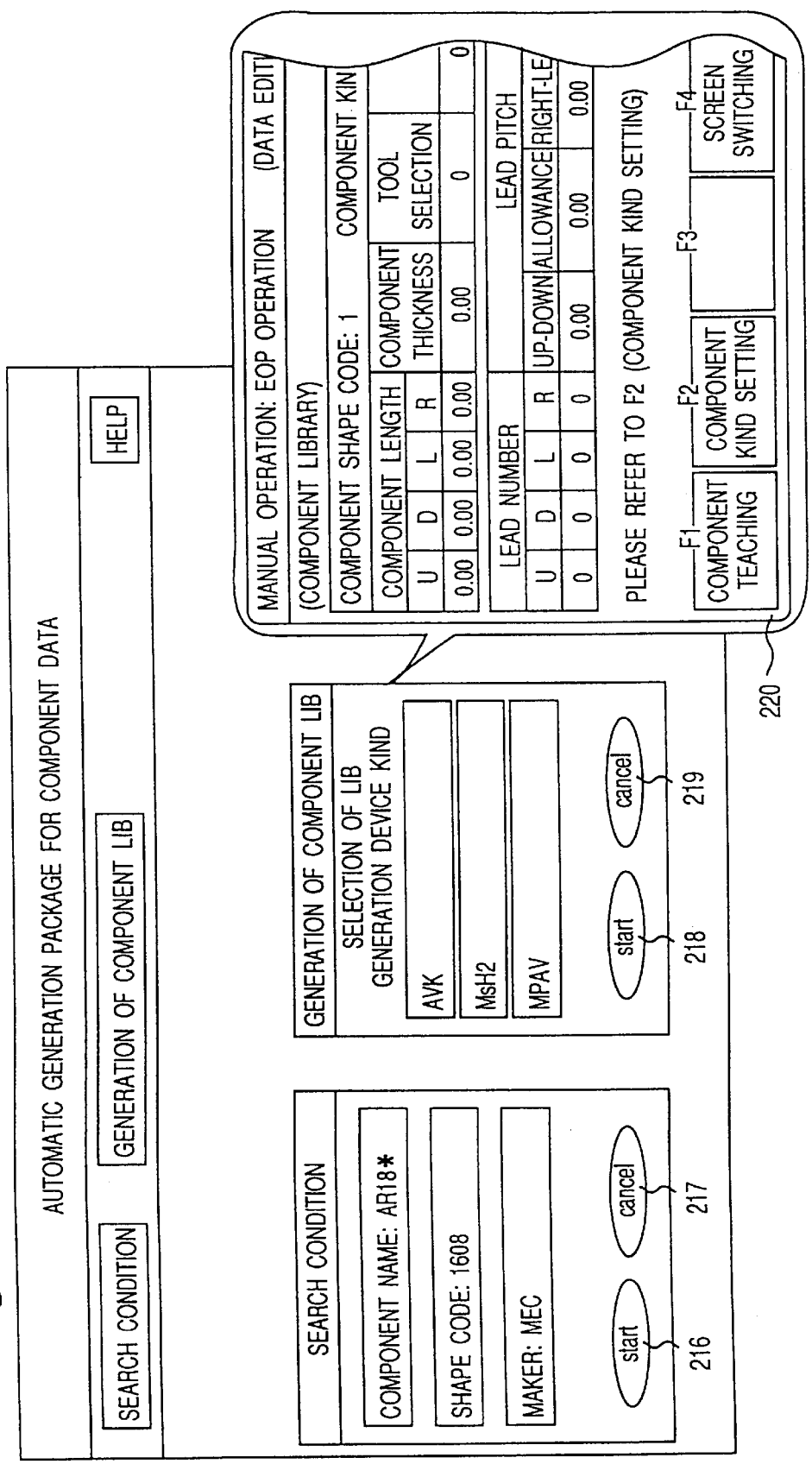
FIG. 32 is an example of an operational screen manipulated to automatically form the component library.

As representative examples of the mounting data C, there are described earlier the NC program indicating mounting positions of components, the component library for recognition of various electronic components, the arrangement of various electronic components at the component supply section, and the supply library relating to the supply of components, e.g., conditions of take-out positions when the components are supplied in trays. The supply library includes, for example, data indicating loading positions of many component supply cassettes set in a component supply apparatus when the apparatus supplies selected components to the mounter 2 while moving the cassettes in an axial direction of a supply shaft. Other necessary data are formed from the supply library. FIG. 32 is an operation screen of the display 213 in a mode generating the component library. The electronic components corresponding to the respective mounting positions in the position data A are searched by a start key 216 and a cancel key 217. A component library 220 corresponding to the type or model of a component library generation device set by a different start key 218 and a different cancel key 219, etc. is automatically formed based on the component text data b read from the component text data B correspondingly to each of the searched components and the position data A.

Other items to be taken into consideration when the components are mounted are the kind of nozzles and chucks holding the electronic components, a moving speed of a mounting head with the nozzles and chucks, required fall positions of the nozzles and chucks when the electronic components are mounted, that is, mounting heights of the components to the board, a moving speed of the board with the electronic components mounted, particularly, an acceleration thereof, and various allowances thereof. These various electronic components are accommodated, for example, in tapes or in trays so as to be automatically supplied to the mounter. Packing conditions including the supplied state of components as above and a storing pitch of the components in such a state should be also taken into consideration. According to the present invention, this kind of data alike can be automatically formed as the component library or other mounting data C. With component text data of such components, the mounting data C including the instruction data of the set position and the instruction data of the initial takeout position can be automatically formed.

Before the electronic components are mounted, whether the components are properly directed or proper components are selected is detected, based on which result the improper components are exchanged or improper directions of the components are corrected, etc. This inspection requires the component text data B related to another recognition of the electronic components, i.e., shapes, surface reflectivities, colors, hue, polarity marks of components, printed characters or color codes on the components, etc., and such inspection data as required by the component text data B can be automatically formed as the mounting data C in the present invention.

In some cases, inspection data for boards after the electronic components are mounted can be formed automatically and used by the mounter 2 itself or inspection machine accompanying the mounter 2.

If the component text data B includes data of codes of package materials, surface roughness, surface shapes and the like of electronic components and, shapes, dimensions, weight, etc. of components, and if the mounting data C is: for detecting whether to suck the electronic components by nozzles is optimum or to hold the components by chucks is optimum; the moving speed of the mounting head with the nozzles and chucks, suction powers of nozzles; the moving speed, especially acceleration of the board after the electronic components are mounted thereto; various allowances; and packing forms by tapes and trays, i.e., supplied states of components in the tapes and trays, specifically, the presence/absence of covers or push pins, the accommodating pitch of components in tapes and trays, a count of accommodating rows and a pitch of rows in each tray, the following mounting conditions can be set: the presence/absence of the detachment of the covers; the presence/absence of the movement of the push pins; and one push per one-pitch supply or one push per two-pitch supply depending on a difference of the supply pitch of the components, etc.

Concrete examples of the first embodiment of the present invention will be described hereinbelow. The component text data B relating to various electronic components as shown in FIG. 30 is divided to a component master file $B_1$, a component shape file $B_2$, a component special shape file $B_3$, a component characteristic master file $B_4$, a packing form file $B_5$, a component polarity file $B_6$, a reel data file $B_7$, etc. when the component text data B is stored in the storage medium 212. The data B may be divided in any other methods freely. For example, the component text data B may be classified into the component master file $B_1$; a component appearance file $B_{10}$; and a packaging file $B_{11}$. The component appearance file $B_{10}$ includes the component shape file $B_2$, the component special shape file $B_3$, the component characteristic master file $B_4$, and the component polarity file $B_6$. The packaging file $B_{11}$ includes the packing form file $B_5$ and the reel data file $B_7$. The component master file $B_1$ sets component names, codes of manufacturer' names, classification codes, kind codes, shape codes, and packing form codes of components as the most significant (highest order) data. The master data are called and displayed on the screen, so that contents of items are selected and displayed in accordance with a selection operation by the user.

The component kind codes are manually input individually for every kind of electronic components in the component kind data. Shape codes are manually input for every shape defined so as to manage the components by shapes in the shape codes.

A part of these examples will be briefly indicated below.

Data contents of the component shape file $B_2$ are shape codes, component kind codes, presence/absence of leads, body outer configurations LR, body edge shapes DU, body thicknesses, special body thicknesses, component heights, shape size allowances, electrode widths, electrode lengths, electrode heights, etc.

Data contents of the special shape file $B_3$ are shape codes, side numbers, special electrode dispositions, special electrode existence positions, special electrode widths, special electrode lengths, special electrode heights, special root electrode widths, special lead thicknesses, etc.

Data contents of the component characteristic master file $B_4$ are component names, package color codes, package material codes, etc.

Data contents of the packing form file $B_5$ are packing form codes, packing form kind codes, X-directional tray pitches, Y-directional tray pitches, X-directional counts of component rows, Y-directional counts of component rows, counts of accommodated components, tape widths, tape supply pitches, taping directions/supply directions, etc.

Data contents of the component polarity file $B_6$ are component names, presence/absence of polarities, polarity mark groups, polarity mark shape size 1, polarity mark shape size 2, polarity mark X coordinates, polarity mark Y coordinates, polarity mark angles, right-left symmetric/asymmetric components, etc.

Data contents of the reel data file $B_7$ are component names, packed counts, etc.

Hereinbelow are shown some examples of component kind codes set corresponding to kinds of components.

In the following, electronic components to be mounted on the surface of the board, e.g., angular chip resistors or the like are called chip components. Components having leads to be inserted into holes of the board, more specifically, components inserted in a sidewisely directed state such as resistors or the like are called axial components. On the other hand, components having leads to be inserted into the holes of the board are called radial components. The radial components are, for instance, aluminum electrolytic capacitors, etc. inserted in a lengthwisely directed state.

Kind codes of chip components are:
Isolator: ATC
Dielectric filter: BPP
Aluminum electrolytic capacitor: CAPALR
Cylindrical chip capacitor: CAPSYL
Film capacitor: CAPPULM
CC: CC
Connector: CNT
Mini diode: DIMINI
New mini power diode: DINMIHIPW
S mini diode: DISMINI
Multiplexer: EZFA
Receiving filter: EZFS
Filter: FLT
Noise filter: FLN Oscillation filter: FSA
Mini power IC: ICMINIPW
Mini IC: ICMINI
IF module: IF
LC filter: LCFLT
NL filter: NLFLT
Crystal filter: QFT
Kind codes of axial/radial/jumper components are:
R-beads core: R-BC
R-capacitor: R-CAP
R-three-terminal capacitor: R-CAP3
A-beads core: A-BC
Jumper wire: J-JUMPER Examples of shape codes set corresponding to kinds of components will be indicated below.

Hereinbelow, the unit of size in codes is uniformed for every kind of components, set by two digits of the actual size, for instance, 301515 when the component has a 3 mm length, a 1.5 mm width and a 1.5 mm height, and 201303 when the component has a 20 mm length, a 13.5 mm width and a 3.5 mm height.

Among the chip components:
Isolator: ATCB57 (ATC+shape symbol 1+height 2)
Dielectric filter: BPPB45 (BPP+shape kind 1+height 2)
Aluminum electrolytic capacitor: ALCB57 (ALC+shape symbol 1+height 2)
Cylindrical chip capacitor: 2125C (diameter 2+length 2+C)
Film capacitor: 4833FC13 (length 2+width 2+FC+height 2)
CC: CC014B101008 (CC+pin count 3+B+length 2+width 2+height 2)
New mini power diode: NMINIPWDIL315 (shape kind 5+components kind 2+L+lead count 1+height 2)
For the axial/radial/jumper components:
Beads core: 2545RBC28 (length 2+width 2+RBC+height 2)
Capacitor: 4532CAP32 (length 2+width 2+CAP+height 2)
Three-terminal capacitor: 1207CAPCN15 (length 2+width 2+CAPCN+height 2)
Packing form codes are as follows:
Paper tape (paper, adhesive paper): P0804OOO (the first digit P is a kind code of papers which becomes N in the case of adhesive papers. The second two digits 08 indicate a tape width of 8 mm and the succeeding two digits 04 indicate a tape supply pitch of 4 mm. The next two digits OO are a system reservation. The last digit 0 shows an angle of 0°.)

The angle code is 0 when the angle is 0°, 1 when the angle is 90°, 2 when the angle is 180°, and 3 when the angle is 360°.

Embossed tape: E0804081 (the first digit E is a kind code. The two digits 08 indicate a tape width of 8 mm and the following two digits 04 indicate a tape supply pitch of 4 mm. Further, the next two digits 08 show an emboss depth. The last digit 1 is the angle code of 90° as mentioned above.)

Matrix tray: T1020OO1 (the first digit T is a kind code. The second two digits 10 are a count of rows in the Y direction, the next two digits 20 are a count of rows in the X direction, and the next two digits OO are a sequential number assigned under the management of the operator when the tray pitch is different. The last digit 1 is the angle code.)

Stick: S08OOOO2 (the first digit S is a kind code, the following four digits OOOO are a system reservation, and the last digit 2 is the angle code.)

Bulk: BOOOO3 (the first digit B is a kind code, the four digits OOOO indicate a system reservation, and the last digit 3 is the angle code.)

As cut leads are called names of components having leads cut. Codes for the cut leads are not specifically defined in the first embodiment, and selected and registered corresponding to the components concerned. The cut lead code may be set freely so long as it has 20 or fewer characters. However, the component with the cutting number of 0 is set to be CUT0000.

Because of a small amount of data related to electrode shapes, electrodes are classified simply as:

Integral type: 1

Gull wing type: 2

J lead type: 3

Flat lead type: 4

Separated type: 5

Insertion type: 6

Butt lead type: 7

Volume type: 8

The shape names of electrodes are input for recording through a keyboard. It does not matter if the shape names are input by Chinese characters.

Figure 33A:
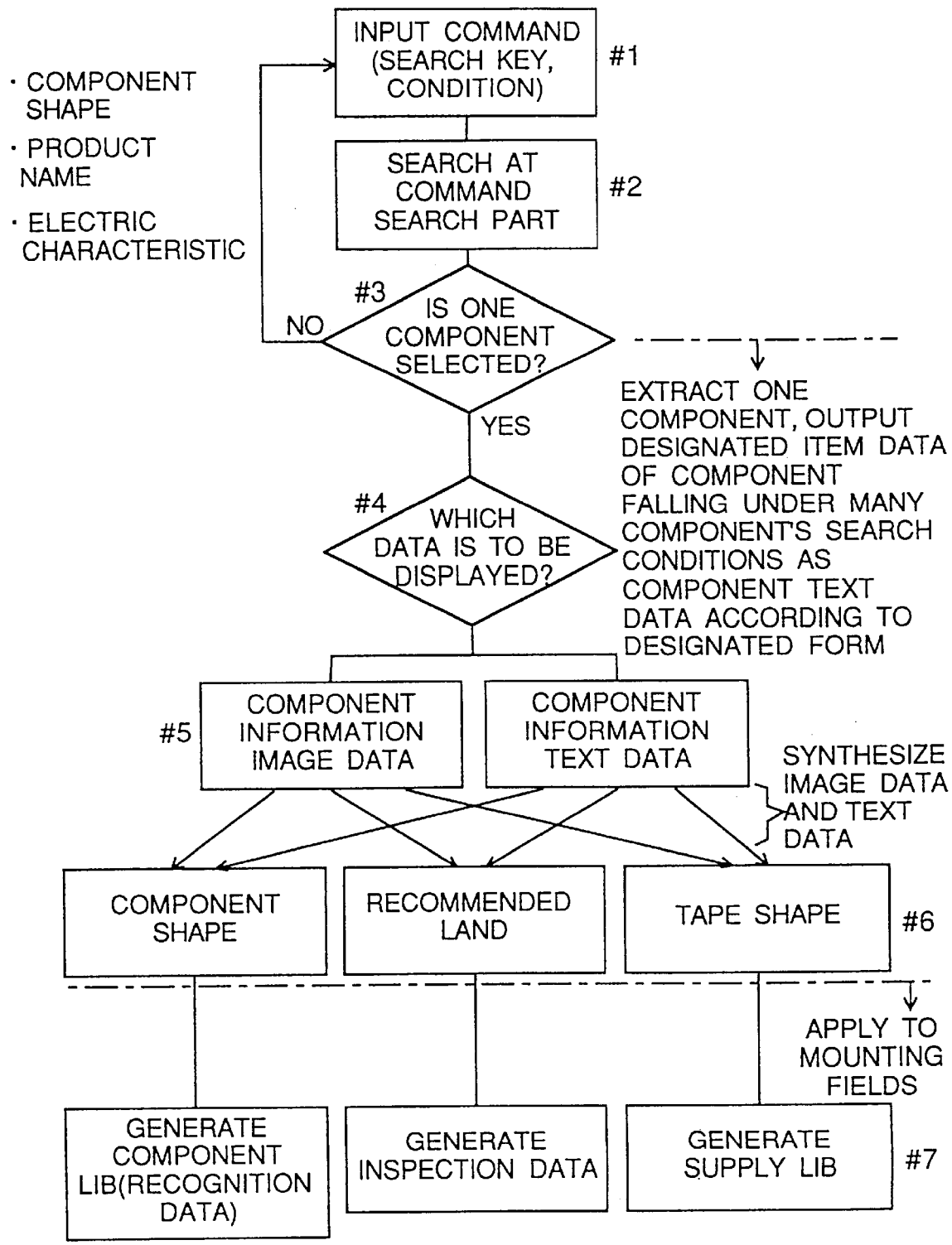
FIG. 33A is a flow chart showing search procedures when the component electronic catalog of the system in FIG. 1 is utilized for a screen search.

A case where the storage medium 212 storing the component text data B and image data IM is subjected to screen search and utilized will be described below. A flow chart of FIG. 33A shows search procedures in the first embodiment.

When the data processor 203 is started in a read mode to read out the component electronic catalog, a search guide screen appears on the display 213, sequentially showing guides for the search according to predetermined search procedures. Data of the component master file $B_1$ are shown as the first screen to be searched. A required one among the master items related to the component displayed on the screen is selected by moving the cursor. Termination of the selection is input through an OK key on the screen, whereby the display screen is changed and less significant data related to the selected item are shown thereon.

Figure 33B:
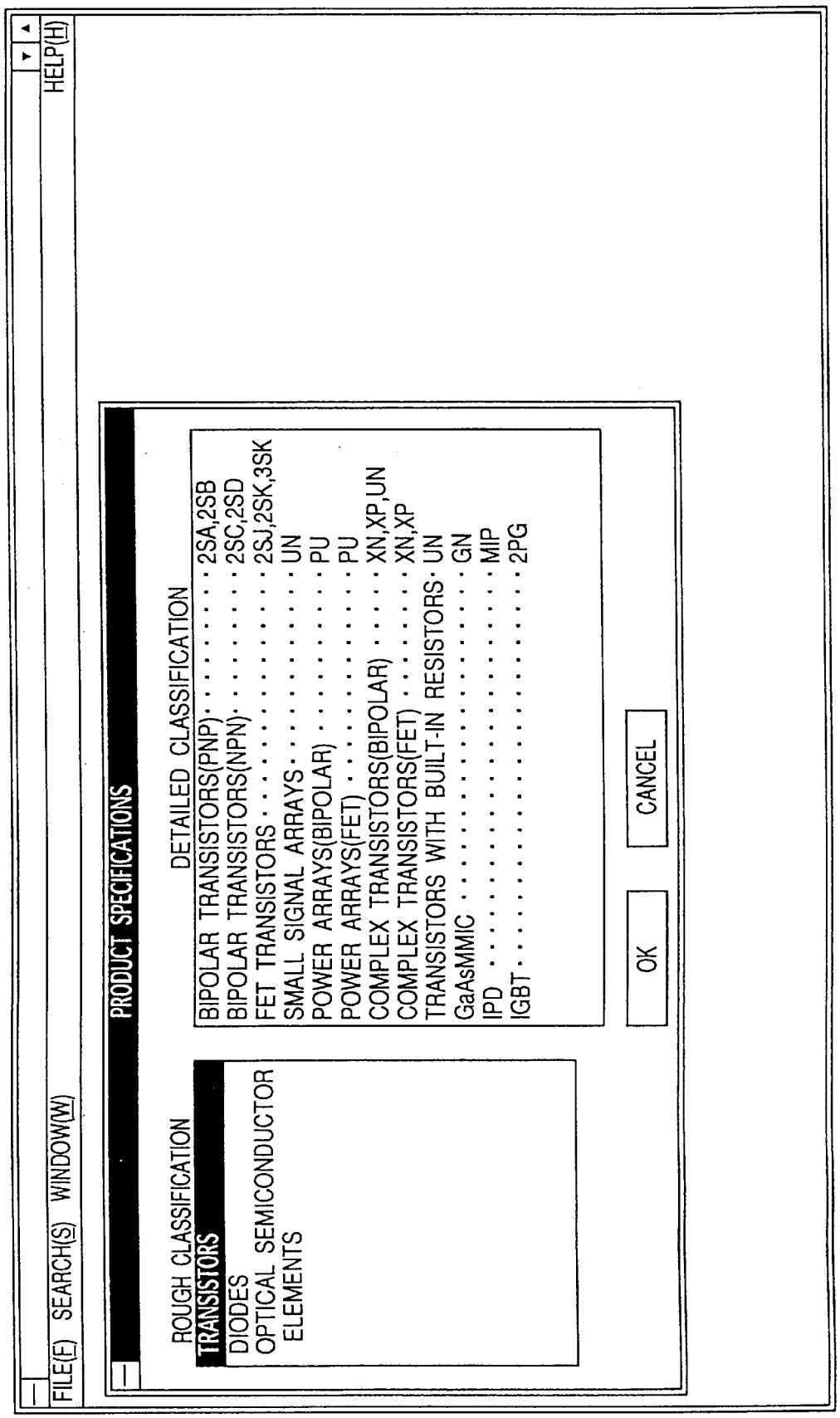
FIG. 33B is a screen in the middle of the search for electronic components meeting needs in accordance with the flow chart of FIG. 33A.

Supposing that the selected master item is a component classification code, component items in a rough classification group of components are displayed on the screen as the less significant screen. In response to the OK key operation after the selection, the screen is changed to a still less significant screen based on the selection. As a result, rough classification data of semiconductors, i.e., item data of transistors, diodes, and optical semiconductor elements, and detailed classification data of transistors selected by the cursor among the rough classification, namely, detailed classification component items such as bipolar transistors (PNP) . . . 2SA, 2SB, etc. are displayed on the screen, as shown in FIG. 33B. When the cursor is moved to a different item in the rough classification data, for example, diodes, the display screen of the detailed classification data is changed from one related to transistors to one related to diodes.

Figure 33C:
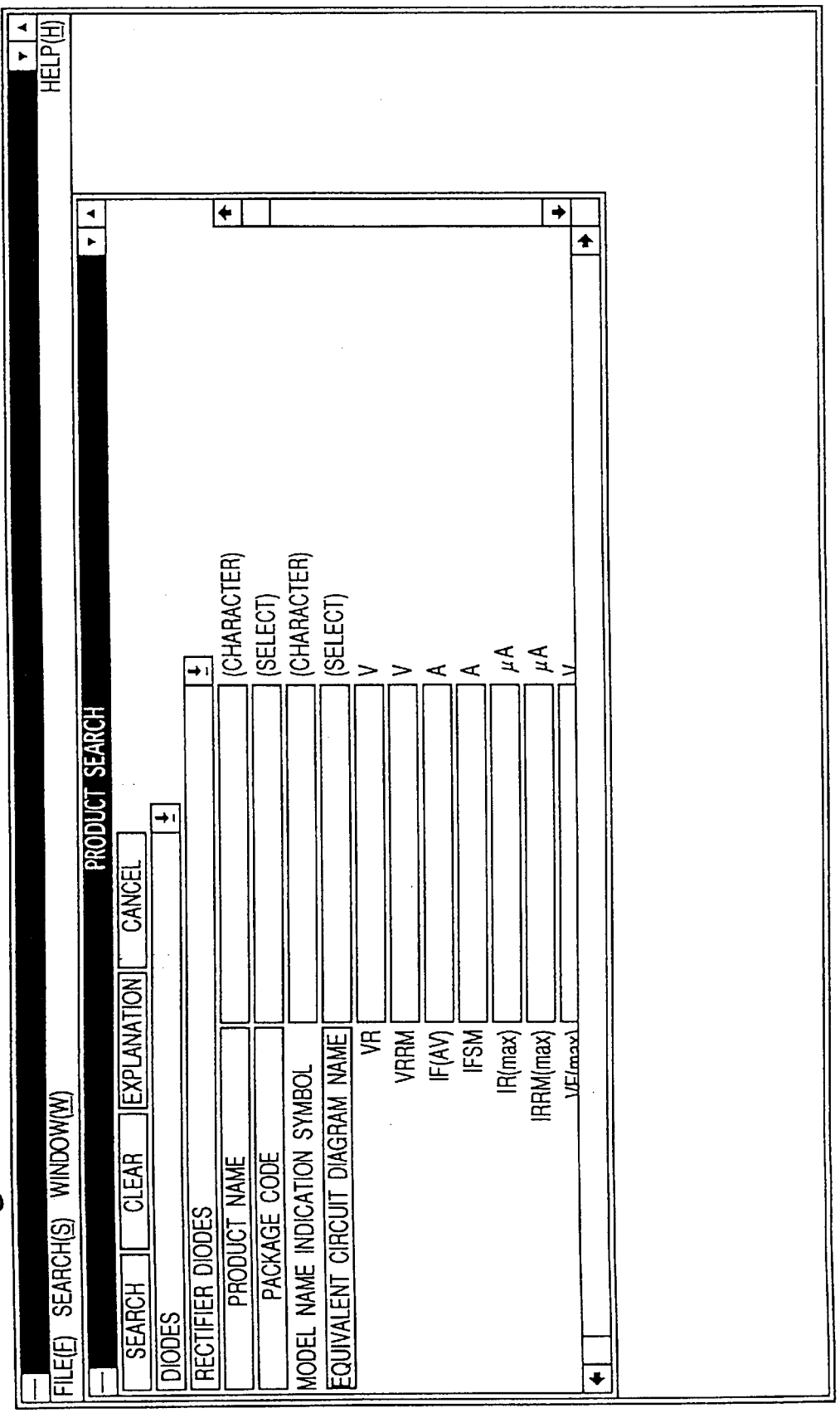
FIG. 33C is a search screen when a specific kind of rectifier diodes is selected on the screen of FIG. 33B.
Figure 33D:
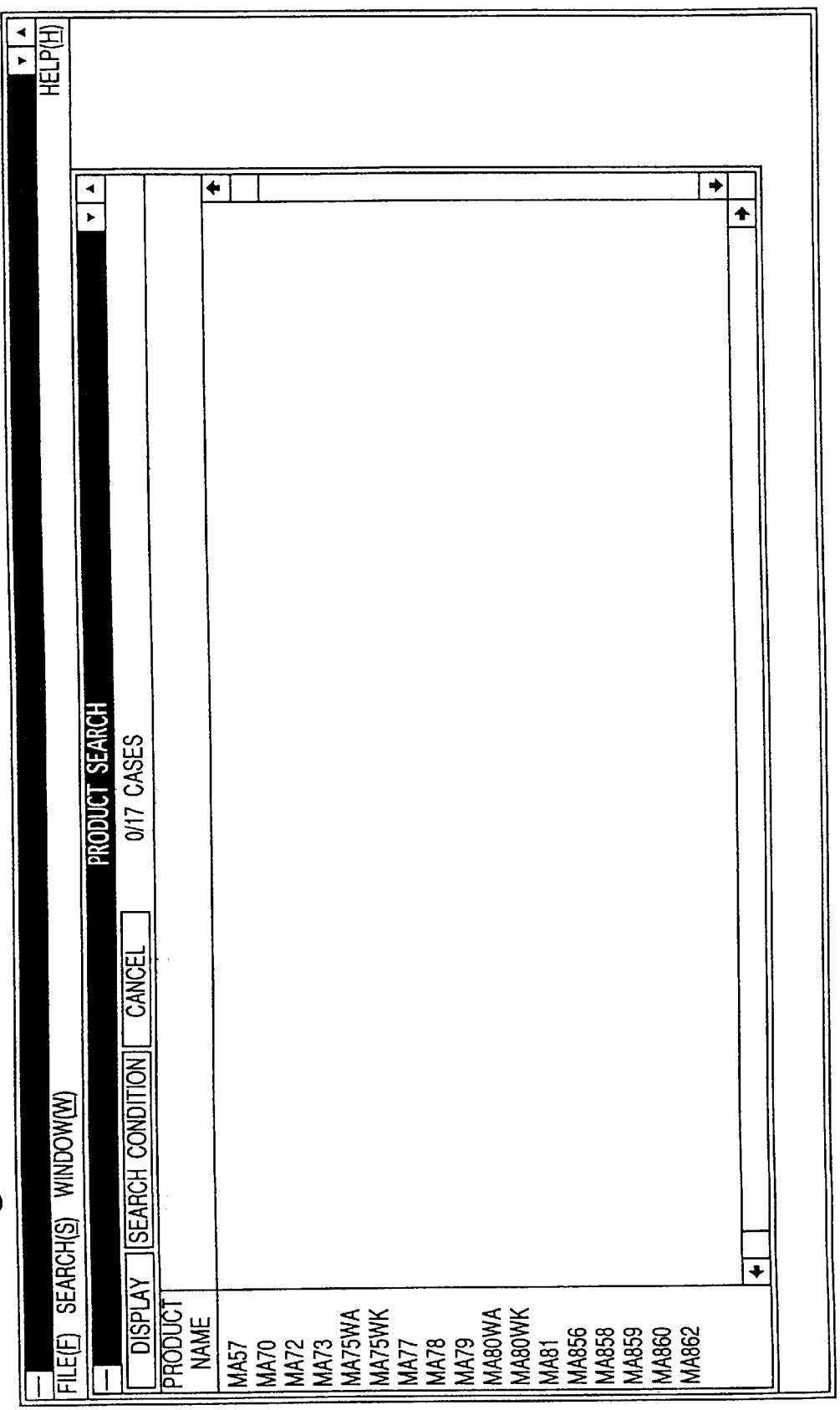
FIG. 33D is a search screen showing the minimum classification group of rectifier diodes of the specific kind displayed on the screen of FIG. 33C.

Upon selection of a rectifier diode in the detailed classification data, the whole screen is changed to a screen related to the selected diode, and an explanatory screen of FIG. 33C is displayed when an item for explanation is selected. If the screen is returned to the search screen, a final selection screen of FIG. 33D is displayed.

Figure 33E:
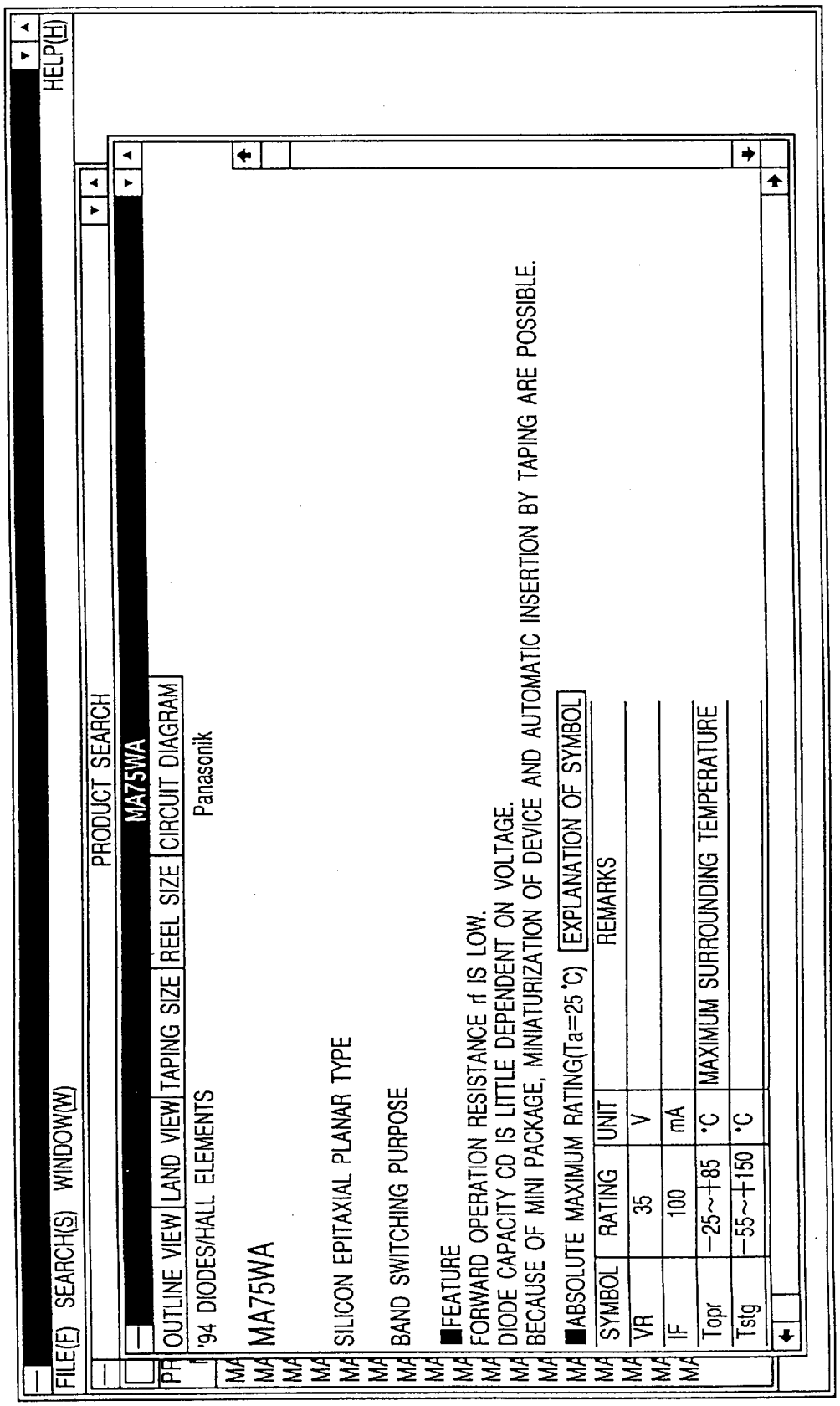
FIG. 33E is an explanatory screen of one rectifier diode selected on the screen of FIG. 33D.

At this occasion, if a rectifier diode (code MA75WA) as the example, meeting the need is selected, in other words, one electronic component is selected, basic data of various kinds related to the selected electronic component are indicated on the screen as in FIG. 33E. This completes operations at steps #1–#3 in the flow chart of FIG. 33A.

Thereafter, a screen to be displayed next is selected on the screen of FIG. 33E which results from the operation in step #3, in accordance with an aim to obtain component data for selecting a component satisfying the need or forming the mounting position data A of the selected component or the like. For example, an outline view, a recommended land, a tape shape, etc. is selected. An operation at step #4 is finished here.

Figure 33F:
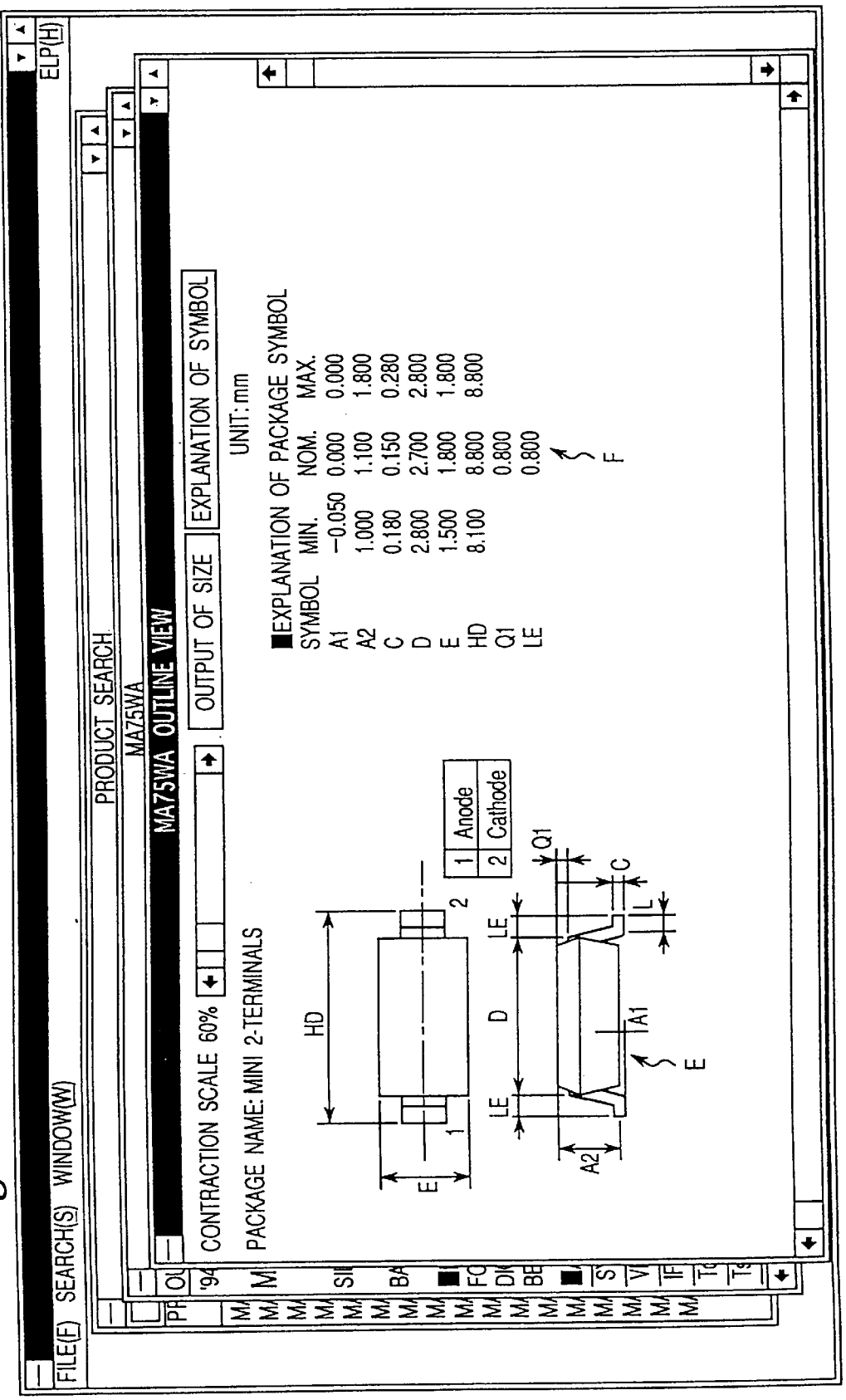
FIG. 33F is a screen of an outline view of the rectifier diode due to the final search displayed on the screen of FIG. 33D.

In selecting the outline view through the operation at step #4, the image data IM corresponding to the outward shape of the selected electronic component and the component text data B corresponding to the size of the selected electronic component are read out from the storage medium 212 and synthesized at step #5, thereby to obtain a screen display as shown in FIG. 33F. The screen displays an outline view E with dimension lines of the electronic component and a component text data F of dimensions corresponding to the dimension lines at the same time. When an output of size is selected on this display screen, the component text data F can be output elsewhere.

Figure 34:
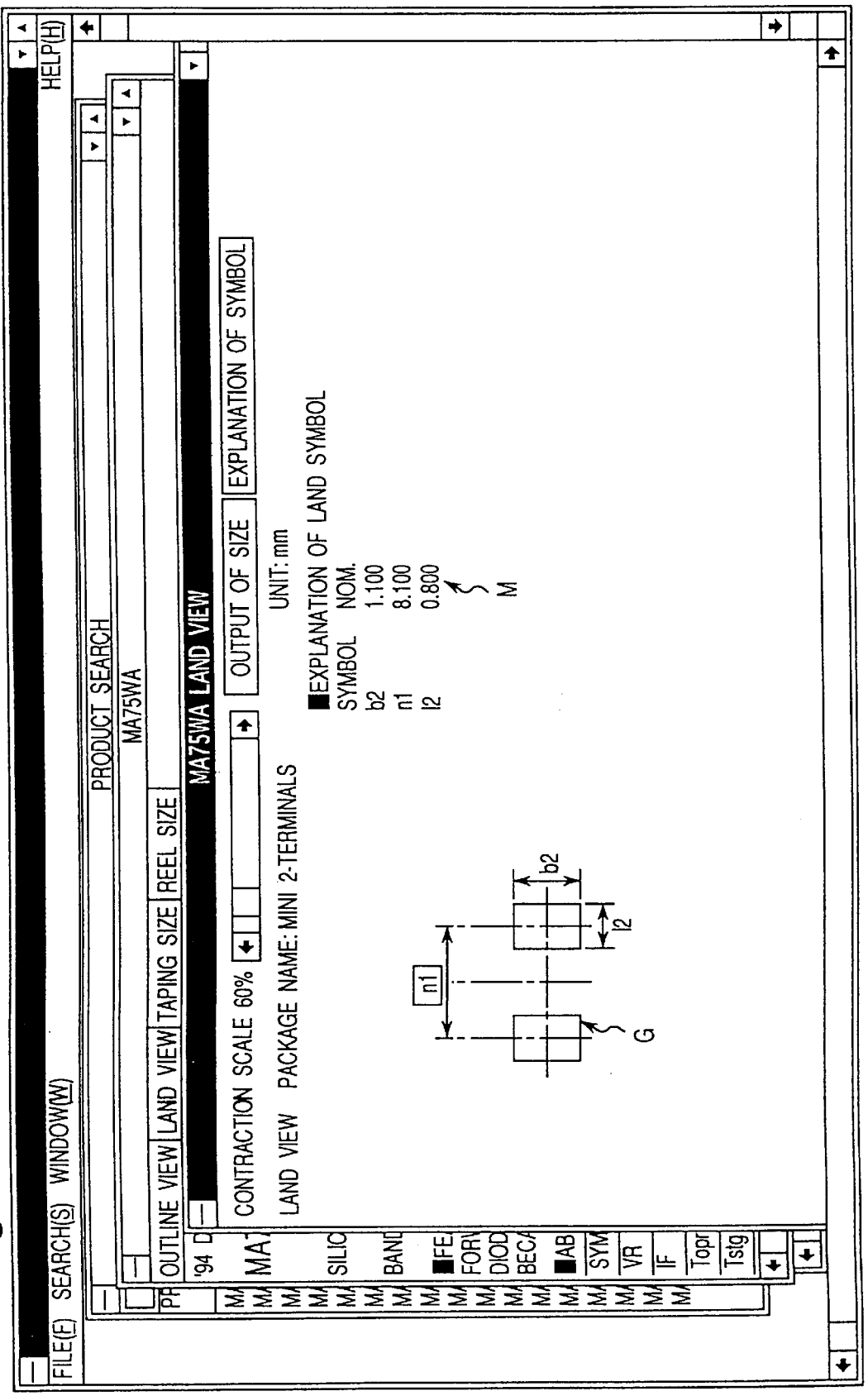
FIG. 34 is a screen showing a land view of the rectifier diode due to the final search displayed on the screen of FIG. 33D.

When a land view is selected through the operation at step #4, the image data IM corresponding to the land shape of the selected electronic component and the component text data B corresponding to the land size of the selected electronic component are read out from the storage medium 12 and synthesized at step #5, thereby to obtain a screen display as indicated in FIG. 34. The screen simultaneously displays an outline view G with dimension lines of the land and a component text data M of dimensions corresponding to the dimension lines on the screen. If an output of size is selected on the screen, the above component text data N can be output elsewhere.

Figure 35:
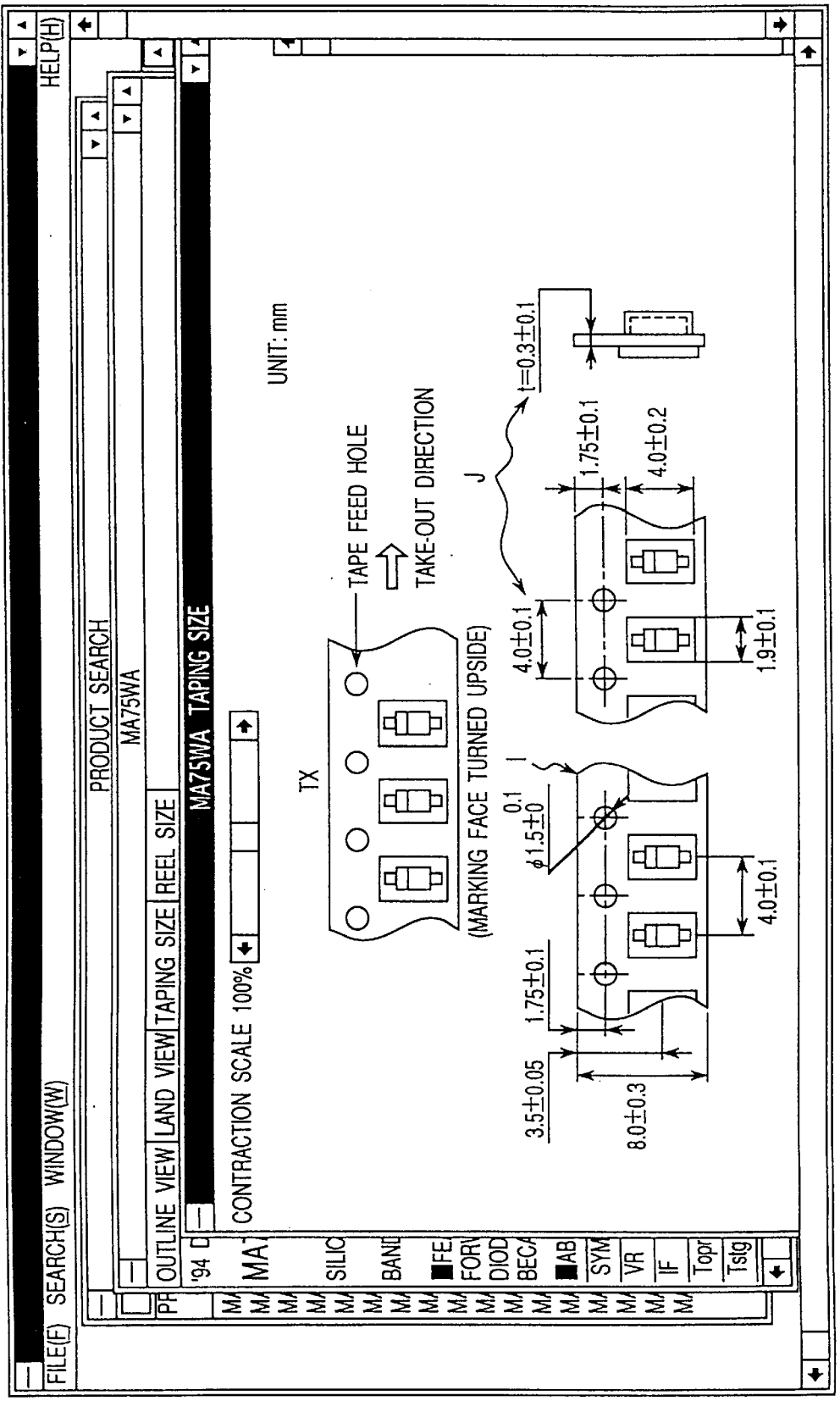
FIG. 35 is a screen showing a taping size of the rectifier diode due to the final search displayed on the screen of FIG. 33D.

When a taping size is selected through the operation at step #4, the image data IM corresponding to the taping shape of the selected electronic component and the component text data B related to the taping size of the selected electronic component are read out from the storage medium 212 and synthesized, which is displayed on the screen as shown in FIG. 35. A form view I of a taping with taping dimension lines and a component text data J of dimensions corresponding to the dimension lines are displayed on the screen.

After the mounting position data A are formed by a device for CAD or the like, various kinds of mounting data C shown at step #6 can be automatically generated by the data processor 203 from the mounting position data A and the component text data B stored in the storage medium 212.

Figure 36A:
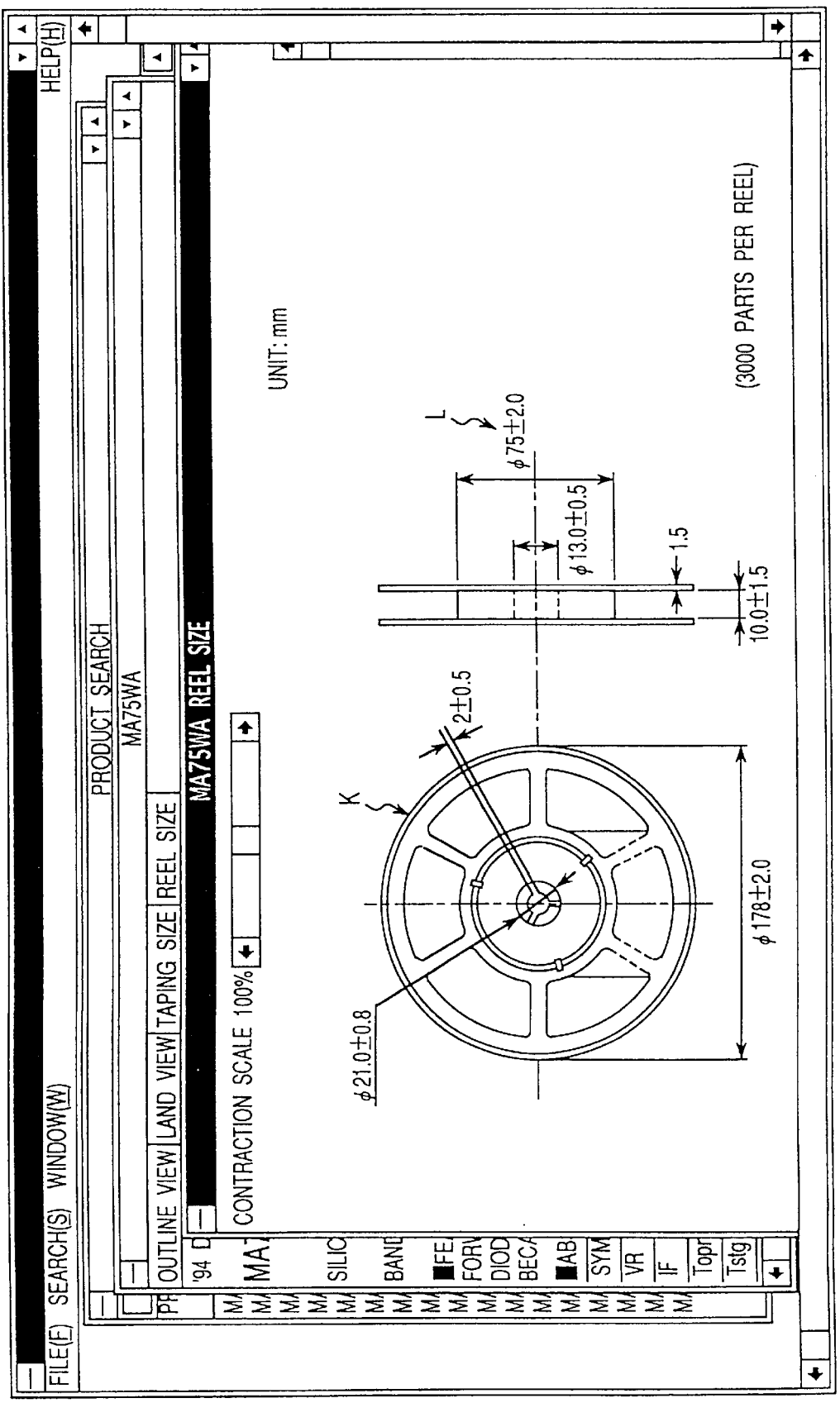
FIG. 36A is a screen showing a reel size of the rectifier diode due to the final search displayed on the screen of FIG. 33D.

When a reel size is selected on the screen of FIG. 33E, the image data IM and component text data B of a reel of the selected electronic component are read out from the storage medium 212 and combined to obtain a screen display as shown in FIG. 36A. The screen shows a drawing K of the reel and a component text data L corresponding to the dimension lines in the drawing K.

While mounting of the electronic components proceeds at the mounter 2 in accordance with the generated mounting data, it may happen that some of the electronic components are detected to need maintenance or are production-suspended components, which brings about the necessity of replacing the components with other electronic components. If the company lacks replacement components, interchangeable or compatible electronic components of other companies may be employed in some cases.

Therefore, it is preferred to store and manage data of replacement components corresponding to the components requiring maintenance or being suspended their production, and also data of compatible components of other companies in a case where the replacement components are not available.

Figure 36B:
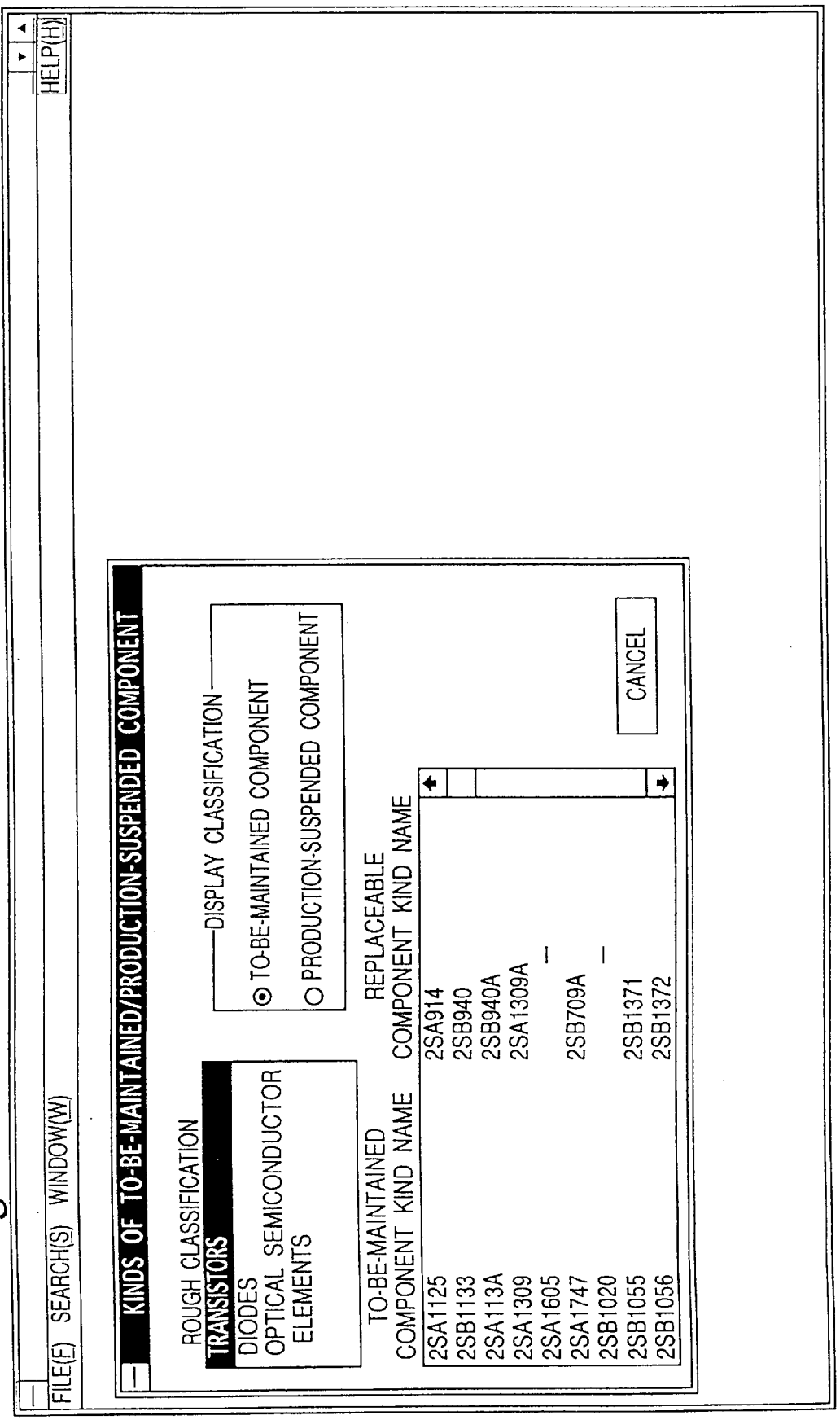
FIG. 36B is a screen showing a rough classification and a detailed classification of kinds of to-be-maintained and production-suspended components in the control system of FIG. 1 forming the mounting data.
Figure 36C:
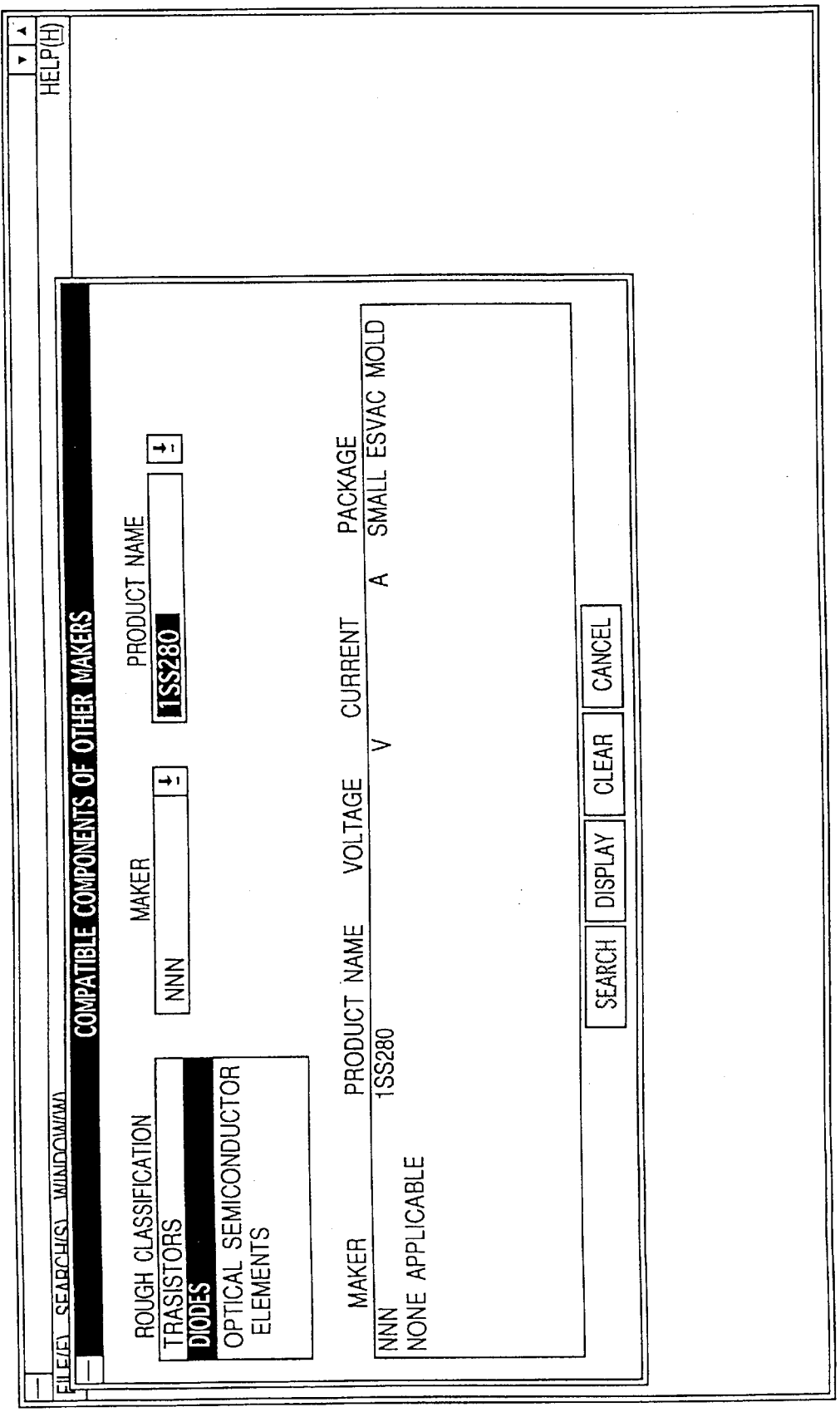
FIG. 36C is a screen showing a list of compatible components of other companies used in the control system of FIG. 1 forming the mounting data.

In the first embodiment of the present invention, comparative data of the to-be-maintained/production-suspended components and replacement components and of compatible components of other companies are similarly stored as the component text data B, to be searched while displayed on screens as shown in FIGS. 36B and 36C.

If the component text data B are designed to include data of component shapes, electric capacities, characteristics, characteristics of mounters, plane graphs, replacement components, compatible components of other companies, and component costs, it can be automatically performed at the forming time of the mounting data C to detect the presence/absence of interferences of adjacent components when mounted to the board and determine necessary insulation distances based on the data of component shapes, electric capacities, and characteristics as in the flow chart of FIG. 33A, whereby the necessary minimum arrangement interval is set automatically and the optimum recommended land shape for the electronic component is set automatically.

A data grouping-processing for determining the mounting order and arrangement to mount electronic components more quickly can be executed as well if data of characteristics of mounters and plane graphs are utilized.

Further, when data of replacement components, compatible components of other companies, and costs are included, data processing to select and mount components of the lowest cost is achieved. In addition, if the replacement components or compatible components are different from original components in shape or color, the components would be recognized as improper at the mounting time, that is, an error treatment would be started. To avoid such a disadvantage, a process for rewriting inspection data for forming inspection programs along with the mounting data can be automatically executed.

If the component text data B includes codes representing shape features, e.g., a state that connection bumps at the lower face of the component are projected, etc., the mounting heights, the pressing amounts, or the pressing pressures when the component is mounted to the board according to the mounting data forming program can be automatically determined.

If the component text data B includes as numerical value data, shapes and dimensions of components, colors and hue, reflectivities, the presence/absence and states of leads and cut leads, polarity marks, printed characters on the components such as 1005CR, 10Ω or the like, color codes, surface roughness, and surface materials, it can be automatically determined from the shape and dimensions of the component whether the component is to be recognized at the mounting time by a reflection method or by a transmission method. More specifically, although a large-size component is easy to correctly recognize because it is reflected clearly even by the transmission method, a small-size component is not fit to the transmission method because the shadow of a nozzle sucking the small component is reflected, hindering the recognition of the small component except the outward shape thereof. Not only the outer shape, but leads at the lower surface of the small component can be recognized in the reflection method, and moreover it does not obstruct the recognition even if a nozzle of a large diameter is used to mount the small component. Therefore, the transmission method is employed for large electronic components, while the reflection method is used for small electronic components, thereby to prevent inspection failures.

The amount and the type of illumination light for recognizing the components can be automatically changed from the data of colors and hue, reflectivities, surface roughness, and surface materials. A mirror surface has a high luminance and therefore cannot be recognized due to a reflecting light if an intense light is cast thereto. If the surface of the component is dark, the component cannot be recognized with a weak light. The kind and amount of illumination light are changed optimumly in accordance with the surface state of the component.

The mounting direction of the component is confirmed and corrected from the presence/absence and states of leads and cut leads and polarity marks. Besides, the mounting component is confirmed from the printed characters and color code, etc. on the component. Improper components are thus automatically refrained from being mounted.

If the component text data B includes data of a plurality of packing forms acceptable in components of the same kind, when the mounting data is to be formed, available supply methods or supply methods making the mounting cycle shortest can be automatically determined in accordance with the model or capability of a component supply mechanism from the plurality of packing form data, e.g., tapings, trays, stocks and the like and characteristic data of mounters 2.

When each component supply cassette for every kind of electronic component loaded in the mounter 2 has a memory for management of the cassette and component and the memory can be used, if shape codes indicating dimensions, colors, and polarities of components and supply codes of packing forms, supply pitches, and supplying directions, etc. are written in the memory, whether the component and the cassette correspond to each other can be detected when the component is set to the cassette, thereby to prevent erroneous setting.

In conjunction with that, when the whole data of various kinds of electronic components stored in the memory 104 of each component supply cassette 14 are read out at the control system 102 of the mounter 2 loading the cassette, the arrangement of the components in the component supply unit 8 can be recognized and in addition, the arrangement library, component library, and the supply library including the component mounting data C covering the read all components can be generated in accordance with the mounting data forming program supplied to the control system 102, and the components can be mounted with the use of the mounting data C. In addition, the control system 102 can also lend itself to forming the mounting data C by transmitting the read component text data B or the like to the data processor 203 in the first embodiment.

If the component text data B includes shape data such as data of lengths, widths, and heights of components, the volumes or weights of components can be calculated from the shape data, nozzles and chucks for handling the components can be selected based on the obtained data of the volumes or weights, the moving speed of the head equipped with the nozzles and chucks can be set, the moving speed of the table, particularly the acceleration of the table can be set, and various kinds of allowances can be set all automatically.

Further, if package color codes, component shapes, recommended land shapes of components, surface materials of components, surface reflectivities thereof (reflectivities for every portion of the component if reflectivities are different at both end portions of the component and a central portion of the component), polarity marks, printed characters or color codes on the surfaces of components, etc. are included in the component text data B, the inspection program for inspecting mounted various components can be automatically generated correspondingly to components of the mounting data.

It becomes consequently unnecessary to select and set electronic components meeting the needs, different from when the mounting data are formed. Kinds of components and inspection data for every kind are obtained by simulating the component mounting data.

When the component text data B includes component shapes, especially, lengths, widths, and heights and, information of leads, lead data required for visual inspection can be automatically set in the inspection program based on the component text data B.

When the component text data B includes temperature characteristics of all the electronic components to be mounted to the same board, a process to set temperature conditions at the mounting time can be automatically carried out by the component mounting data forming program. That is, specifically, in the case where electronic components are mounted at both surfaces of the board, the electronic components of higher heat-proof properties are set to be mounted at a first surface than at a second surface of the board which is processed after the first surface.

If the electronic components of higher heat-proof properties mounted to the first surface of the board are bonded by reflow soldering at a high melting point and, the electronic components of lower heat-proof properties mounted to the second surface are bonded by reflow soldering at a low melting point, it is eventually prevented that the electronic components mounted earlier to the first surface drop subsequent to melting of the solder when the electronic components mounted to the second surface are soldered, or the electronic components of lower heat-proof properties are damaged when mounted and soldered at the second surface. Further, by using these temperature characteristic data, a condition program for setting an optimum temperature profile for the reflow soldering equipment can be automatically formed by the data formation processing device 202, in which case the task and time for the reflow soldering equipment to specially form the program and moreover such occurrences that errors are caused from the additional data formation can be avoided.

If the component text data includes data as to whether components are moisture-absorptive thereby to require burning or cold storage, conditions how to treat the components at the mounting time can be automatically set along with the mounting data.

Furthermore, it is also possible that, in order to write various types of information into the memory 104 or the like or update written contents by using the reading/writing device 105, the control system 102 manages various types of mounting-component information as to mounting components such as count of used components mounted by the mounter 2, amount of remaining components, and conformity or inconformity of components, as well as component mounting information as to the component mounting such as a component holding rate and a to-board mounting rate by a chuck or suction nozzle with respect to a total number of components to be supplied, and can make the reading/writing device 105 work prior to a removal of a component supply cassette 14 to write the mounting-component information or the component mounting information into the storage device or to update written contents at a time point of the removal of the component supply cassette 14.

Like this, if the control system 102 manages various types of mounting-component information as to mounting components such as count of used components mounted by the mounter, amount of remaining components, and conformity or inconformity of components, as well as component mounting information as to the component mounting such as a component holding rate and a to-board mounting rate by a chuck or suction nozzle with respect to a total number of components to be supplied, and makes the reading/writing device 105 work prior to a removal of a component supply cassette 14 to write the mounting-component information or the component mounting information into the storage device or to update written contents at a time point of the removal of the component supply cassette 14, then the component supply cassettes are enabled to have various types of component information as to the to-be-mounted components such as number of used components to be mounted, amount of remaining components, and their conformity or inconformity, as well as various types of information as to the component mounting such as a component holding rate and a to-board mounting rate by a chuck or suction nozzle with respect to the total number of components that have been supplied. In this case, the various types of information can be used as references for the mounting of the next components so as to lend the information itself to the decision as to differences between the catalog data of components and the actual dimensions of components and the like, making conveniences for the comprehensive management of to-be-mounted components and their mounting state, by enabling more appropriate component supply or by enabling more appropriate mounting with the mounting conditions corrected or changed as well as for various types of countermeasures based on the management.

When the component supply cassettes 14 are loaded and unloaded individually, such data management may be applied by providing the memory 104 to each of the component supply cassettes 14 so that the component supply cassettes 14 can be managed individually.

(Second Embodiment)

Figure 37A:
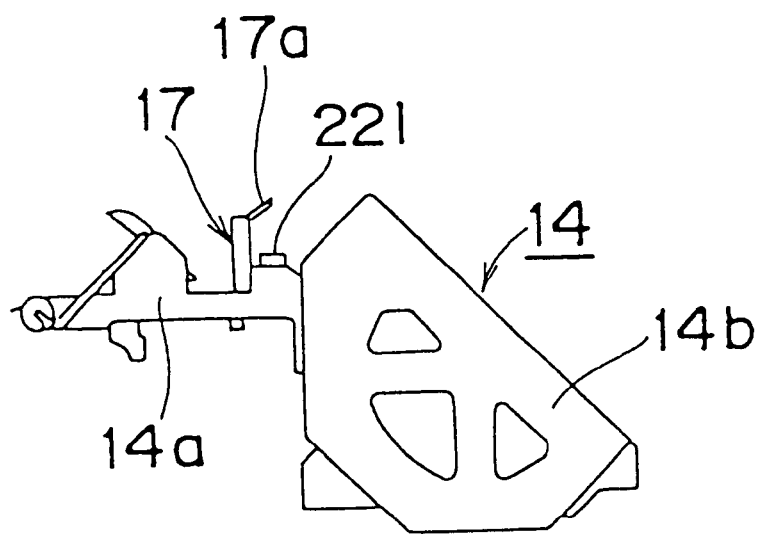
FIGS. 37A and 37B are a side view of the component supply cassette with accommodated component information memory, which shows a second embodiment of the present invention, and a flow chart of the component appropriateness decision subroutine using the accommodated component information.

This second embodiment includes a component supply cassette 14 having a conventionally used electrical or optical or other appropriate readable/writable memory 221 as shown in FIG. 37A fixedly attached thereto wherein the component supply cassette 14 is equipped to the transfer rack 15 as shown in the first embodiment.

Figure 37B:
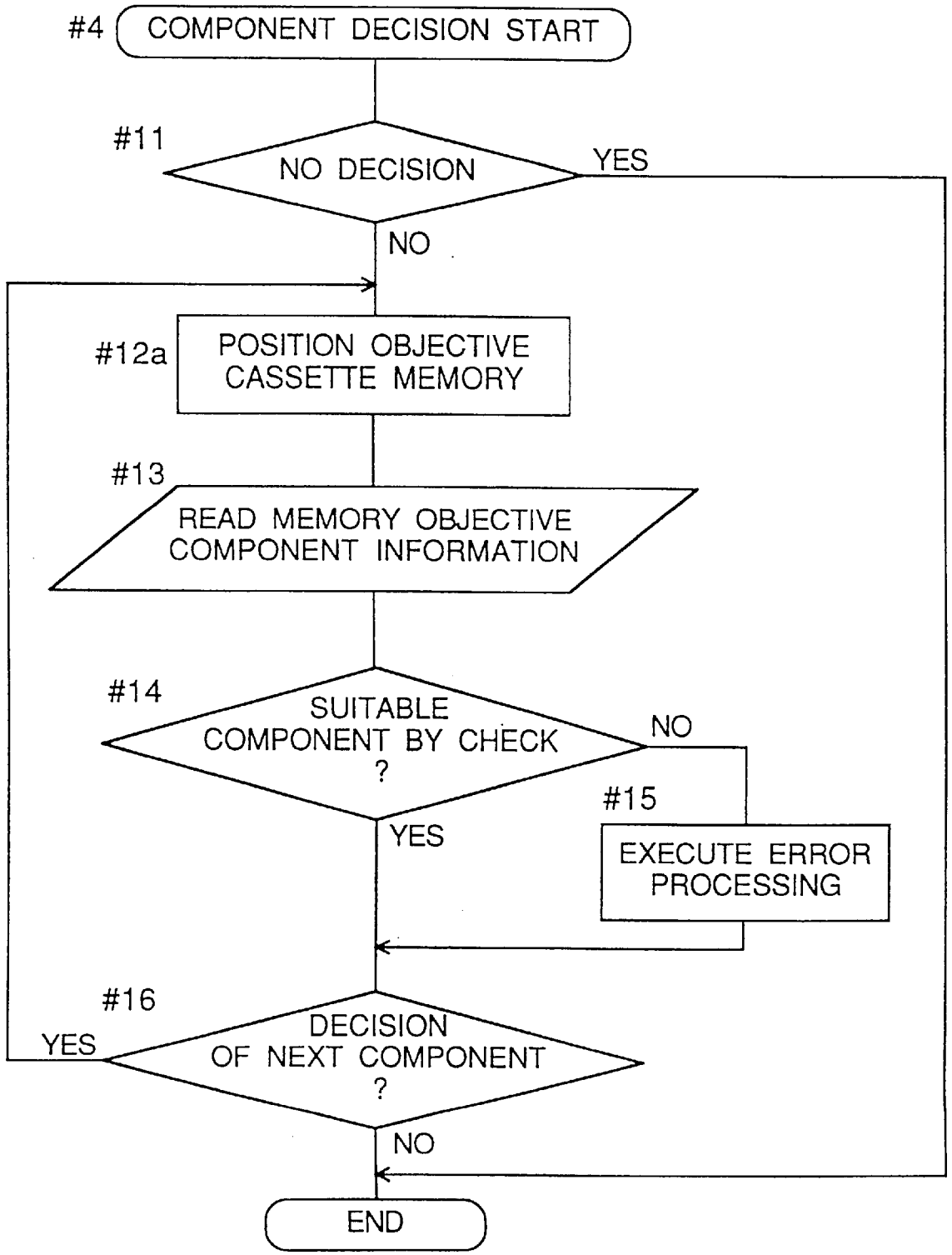

FIG. 37B shows the flow chart for component discrimination in the second embodiment.

The point that the memory 221 of the component supply cassette 14 is positioned at step #12a is the only difference from the first embodiment in which the memory of the transfer rack 15 is positioned at step #12.

This second embodiment has an advantage that the conventional component supply cassette 14 with a memory can be utilized as it is, where because collective replacement of components by the transfer rack 15 and collective setting of the memories 221 accompanying this are achieved even with the use of the conventional component supply cassettes 14. It is more convenient to use the conventional component supply cassettes 14 with a memory by individually loading and unloading them. However, the invention can of course be applied to mounters in which the component supply cassettes 14 are individually loaded or unloaded.

(Third Embodiment)

Figure 38A:
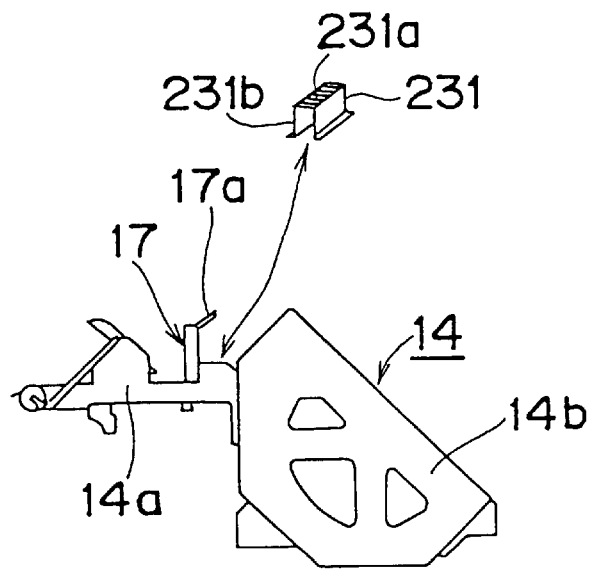
FIGS. 38A and 38B are side views of the component supply cassette having accommodated component information of the loading/unloading type, which shows a third embodiment of the invention.

In this third embodiment, accommodated component information element 231 which includes accommodated component information and which can be loaded and unloaded, may be equipped to the component supply cassette 14 as shown in FIG. 38A. In this case, each time electronic components are accommodated in the component supply cassette 14, the accommodated component information element 231 for these electronic components can be loaded to the component supply cassette 14 so as to lend itself to the reading of component information by the mounter or the like. Still, with such loading/unloading type accommodated component information element 231, one set of the accommodated component information element is only required to carry accommodated component information of one kind, so that a simple component information display form can be adopted, inexpensively. In this third embodiment, the accommodated component information element 231 is provided by displaying a bar code 231a on the top surface of an accommodated component carrier 231b comprising a bifurcated spring member. The display of this bar code 231a may be either directly printed or implemented by applying a printed sheet. The accommodated component information element 231 is fitted in such a way that the bifurcated portions of the carrier 231b sandwich the top side of the component supply unit 14a of the component supply cassette 14. The way of fitting for loading and unloading may be set freely.

Figure 38B:
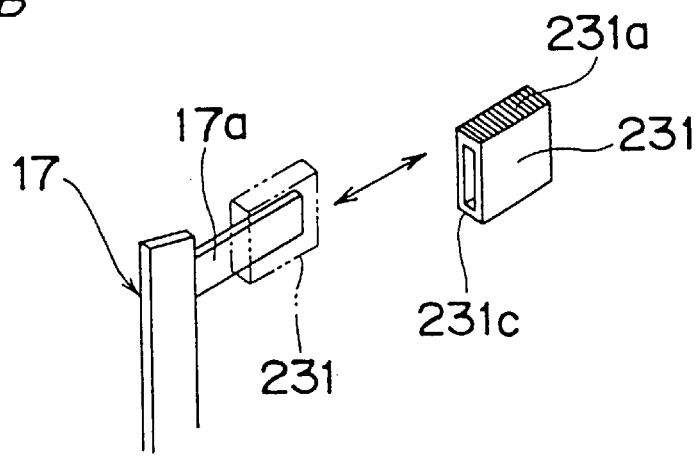

Referring to FIG. 38B, the accommodated component information element 231 is a bar code 231a which is displayed by using, as a carrier, a resin casing 231c that is overlaid so as to be loadable and unloadable to the fixing lever 17a of the component supply cassette 14. In this case, there can be provided advantages that a functional effect similar to that of FIG. 38A can be exerted and besides that special carriers for the accommodated component information element 231 is no longer necessitated.

(Fourth Embodiment)

Figure 39:
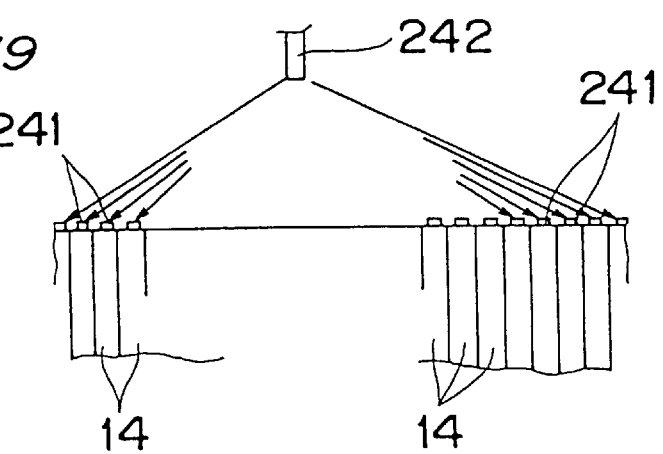
FIG. 39 is a rear side view schematically showing a component supply cassette with an optical memory as well as an infrared reading device, which show a fourth embodiment of the invention.

The storage medium carrying the accommodated component information element of each component supply cassette 14 as shown in FIG. 39 is an optical memory 241 that is readable by infrared communication. Since the storage contents of the optical memory 241 given to each component supply cassette 14 loaded to the mounter can be read sequentially by an infrared communication device 242 located at one place, neither the infrared communication 242 nor the component supply cassette 14 needs to be moved device to read the accommodated component information of each component supply cassette 14. Thus, the accommodated component information can be read out in short time, contributing to an improvement in the productive efficiency.

(Fifth Embodiment)

Figure 40A:
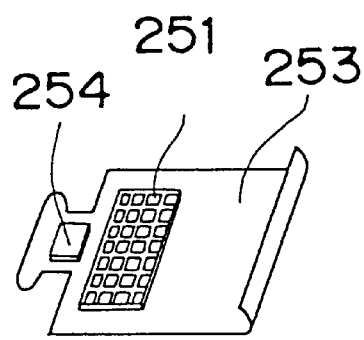
FIGS. 40A, 40B, 40C, and 40D are perspective views showing two management states when components are supplied by trays accommodated in the tray rack, which shows a fifth embodiment of the invention.
Figure 40B:
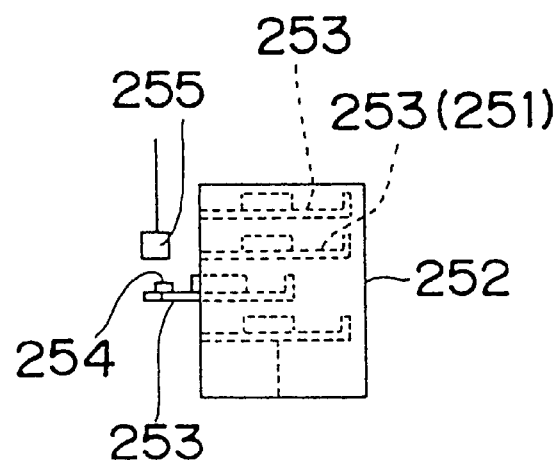
Figure 40C:
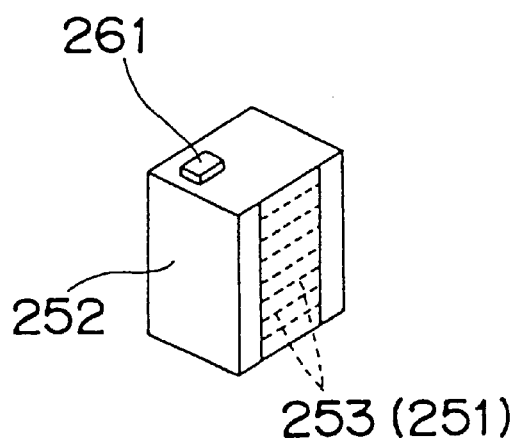
Figure 40D:
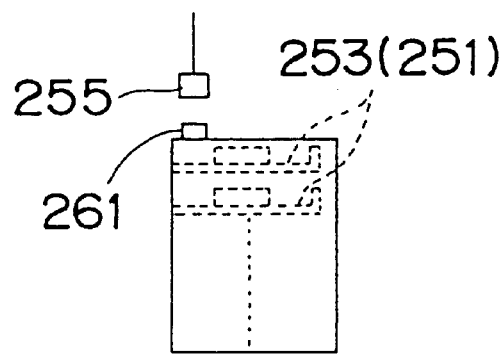
Figure 41:
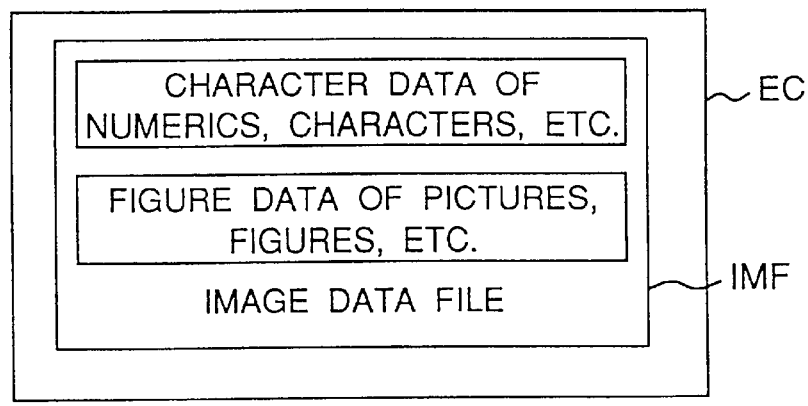
FIG. 41 is a block diagram of an example of contents stored in a conventional component electronic catalog.
Figure 42:
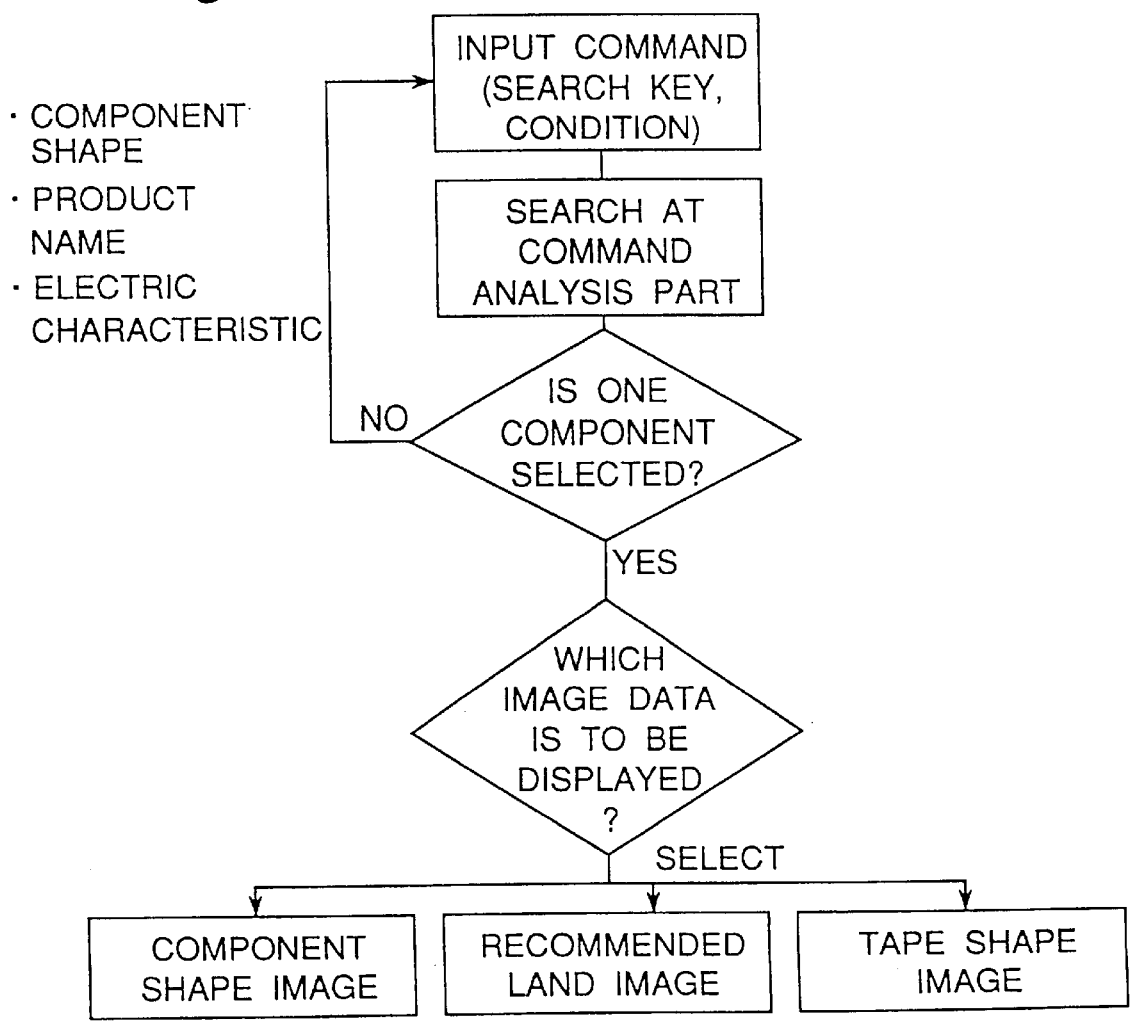
FIG. 42 is a flow chart of a conventional method for forming mounting data.
Figure 44:
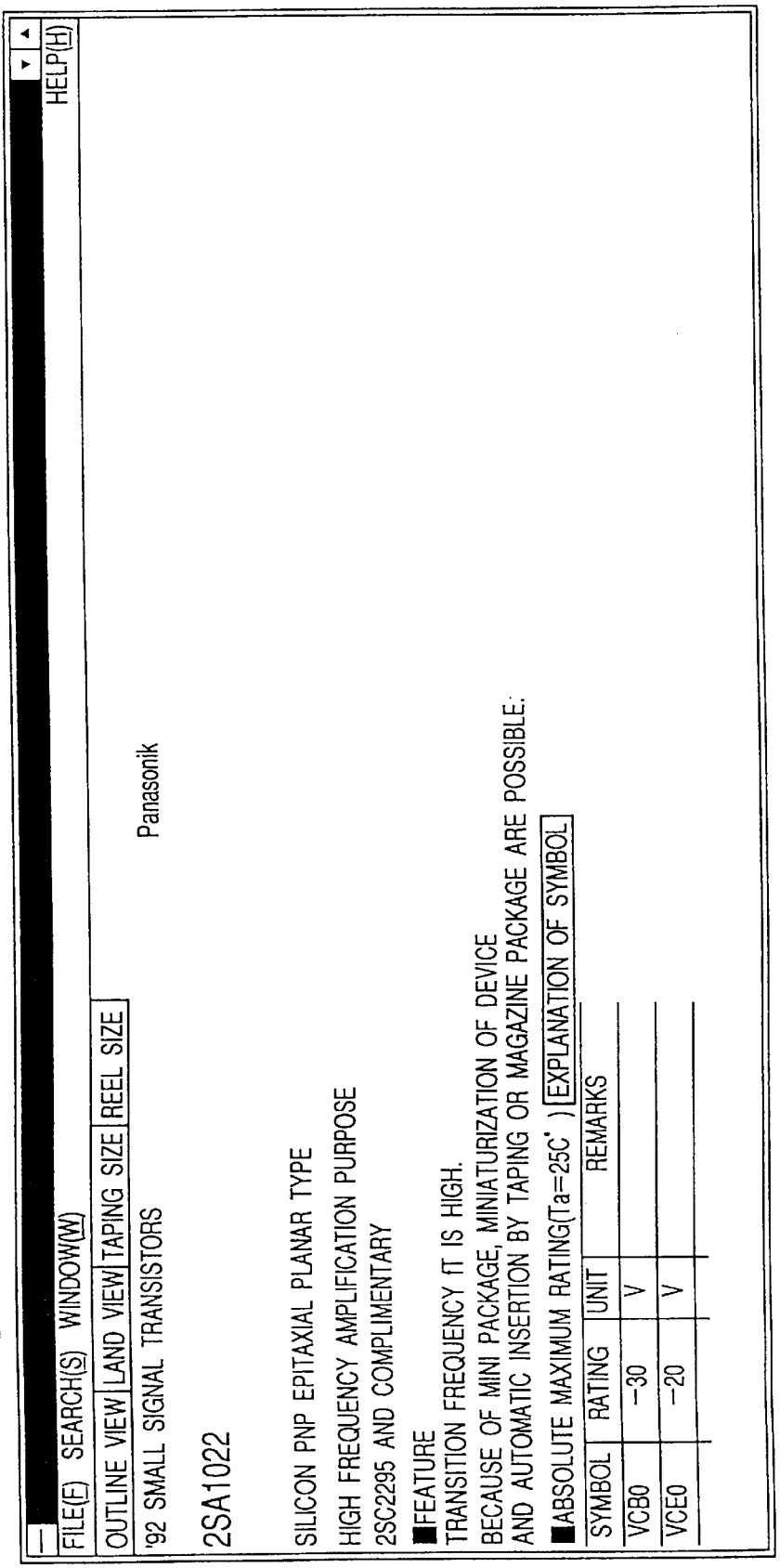
FIG. 44 is a initial explanation screen of a transistor selected on the screen of FIG. 43.
Figure 45:
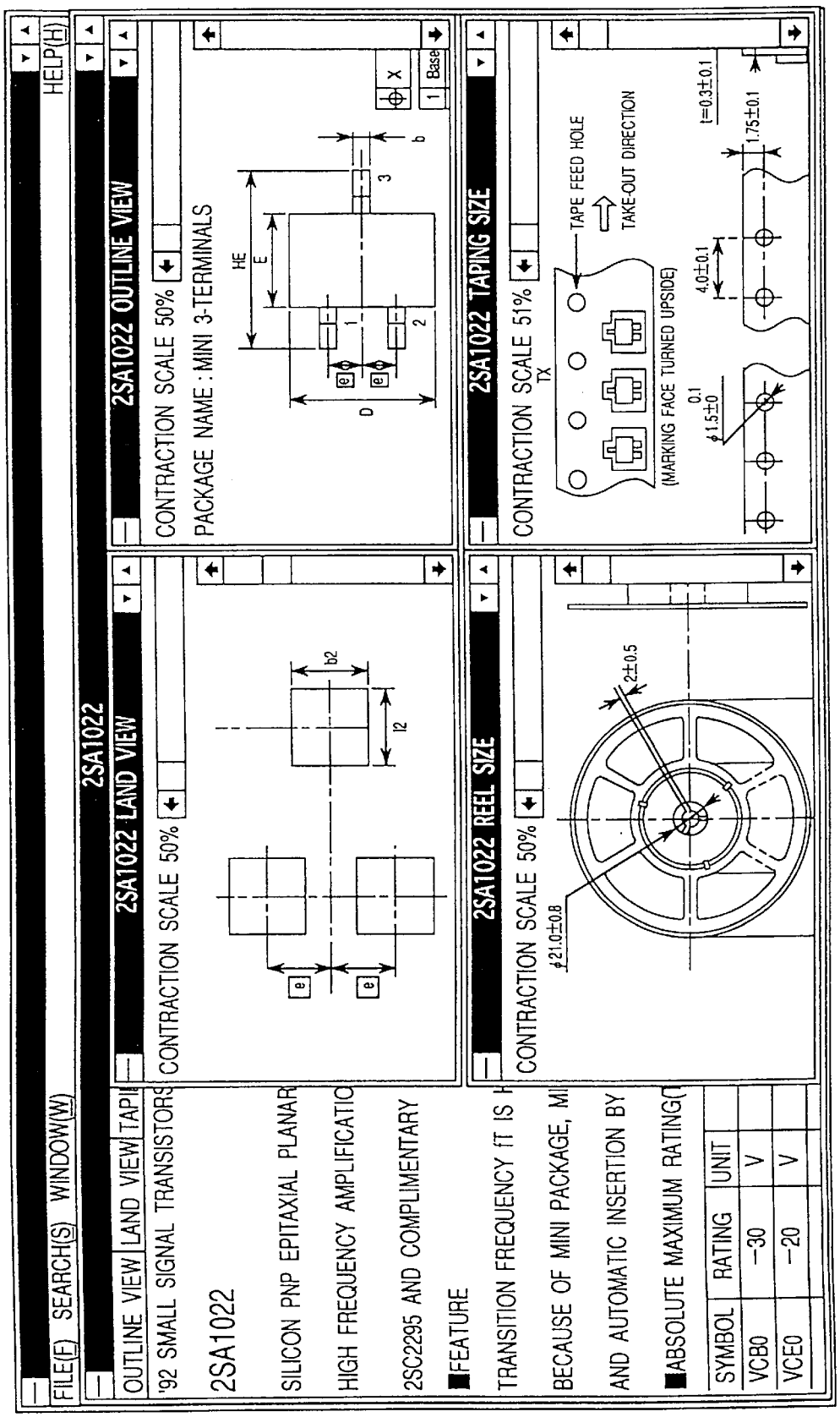
FIG. 45 is a window display screen showing a list of display items in the rough classification of the transistor displayed in FIG. 43 and selectable on the screen of FIG. 43.
Figure 46:
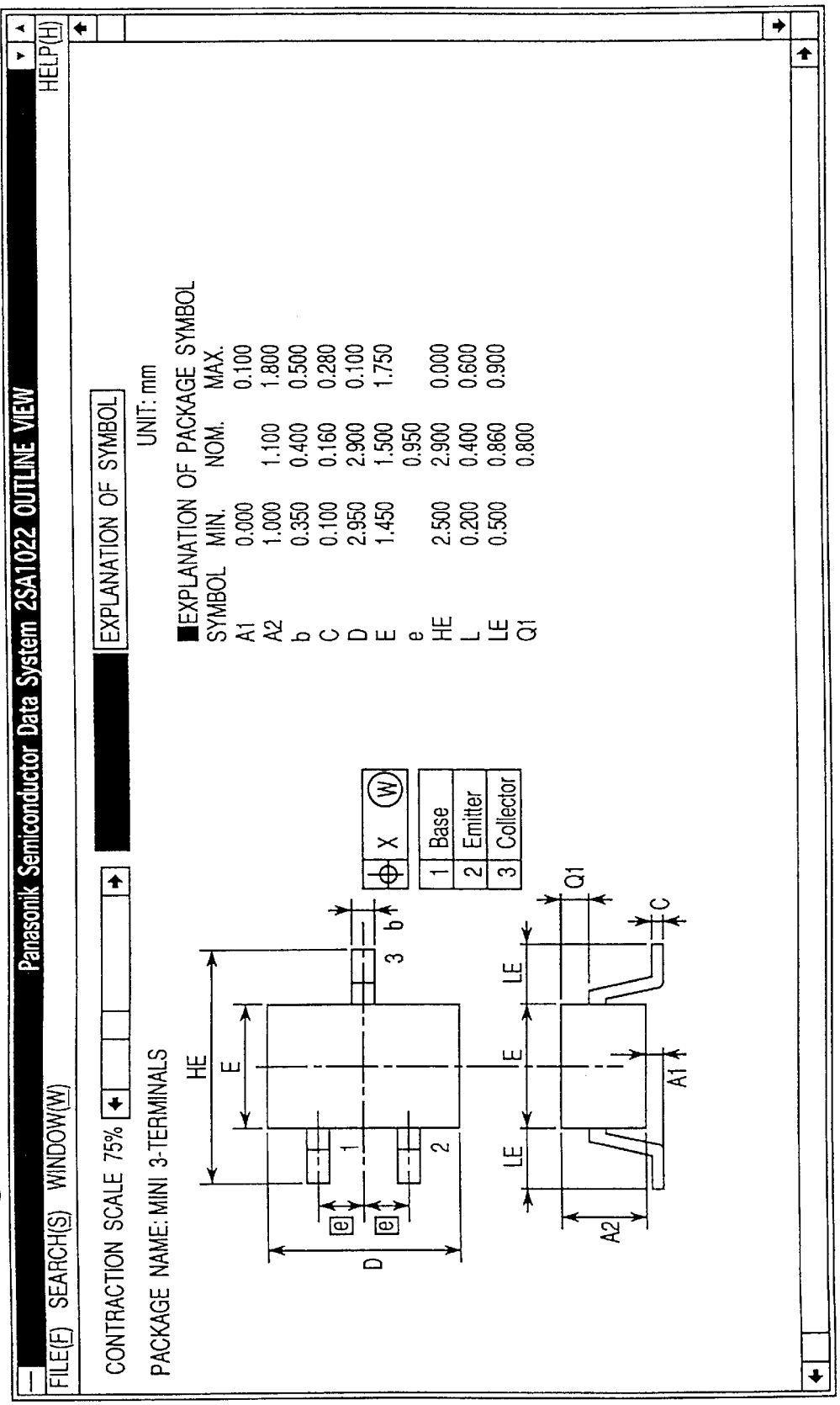
FIG. 46 is a display screen of an outline view of the transistor selected on the screen of FIG. 43.
Figure 47:
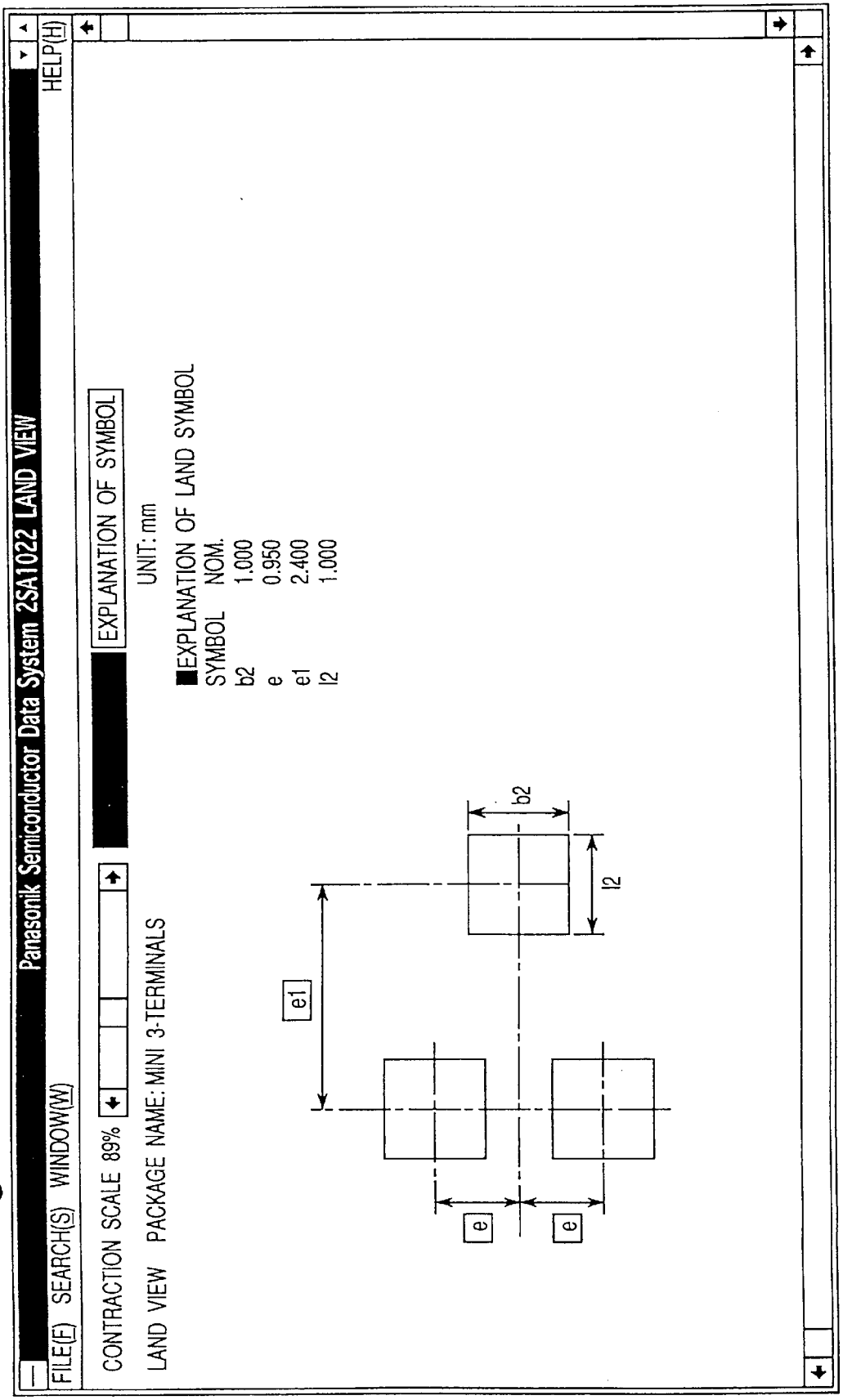
FIG. 47 is a display screen of lands of the transistor selected on the screen of FIG. 43.
Figure 48:
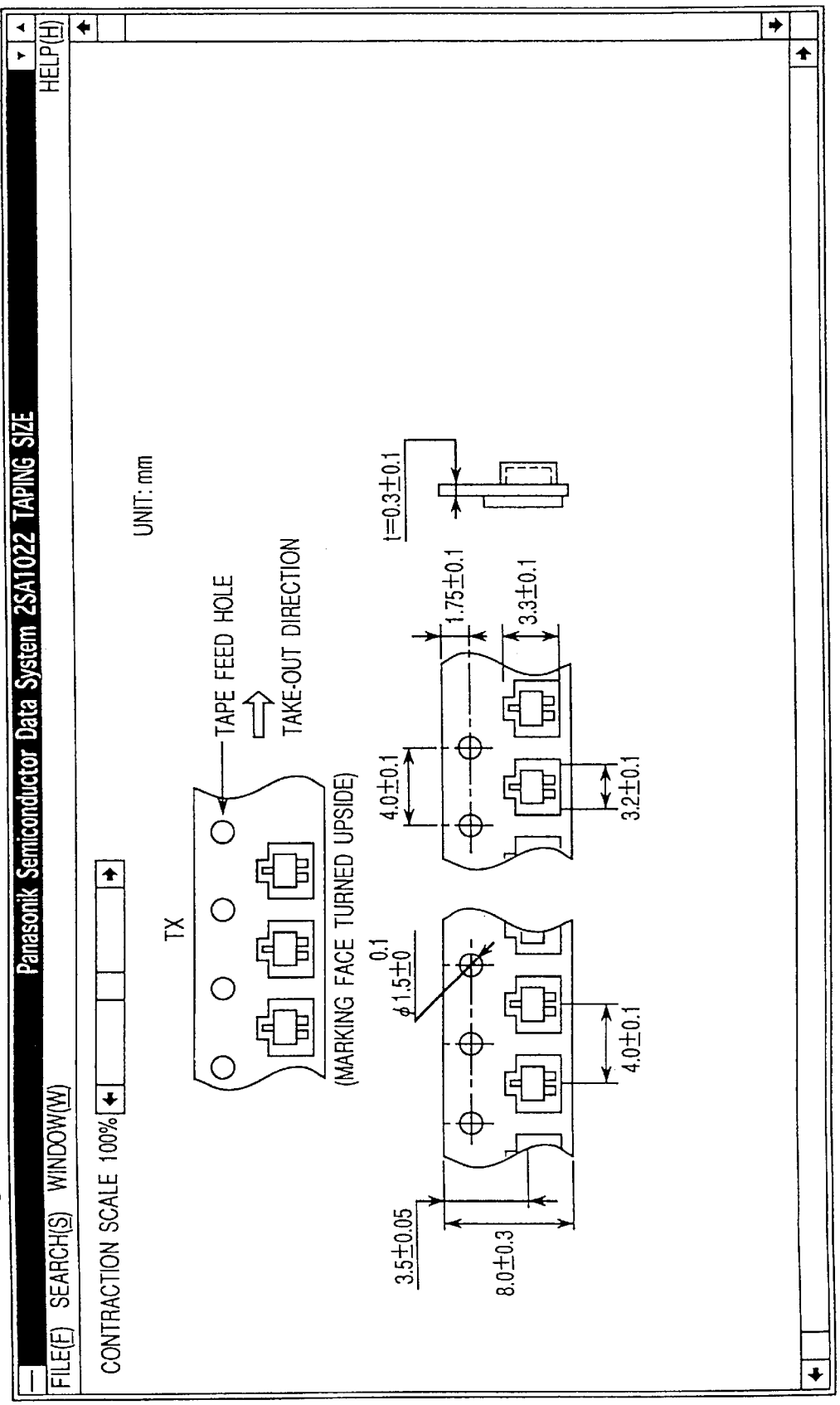
FIG. 48 is a display screen of a taping size of the transistor selected on the screen of FIG. 43.
Figure 49:
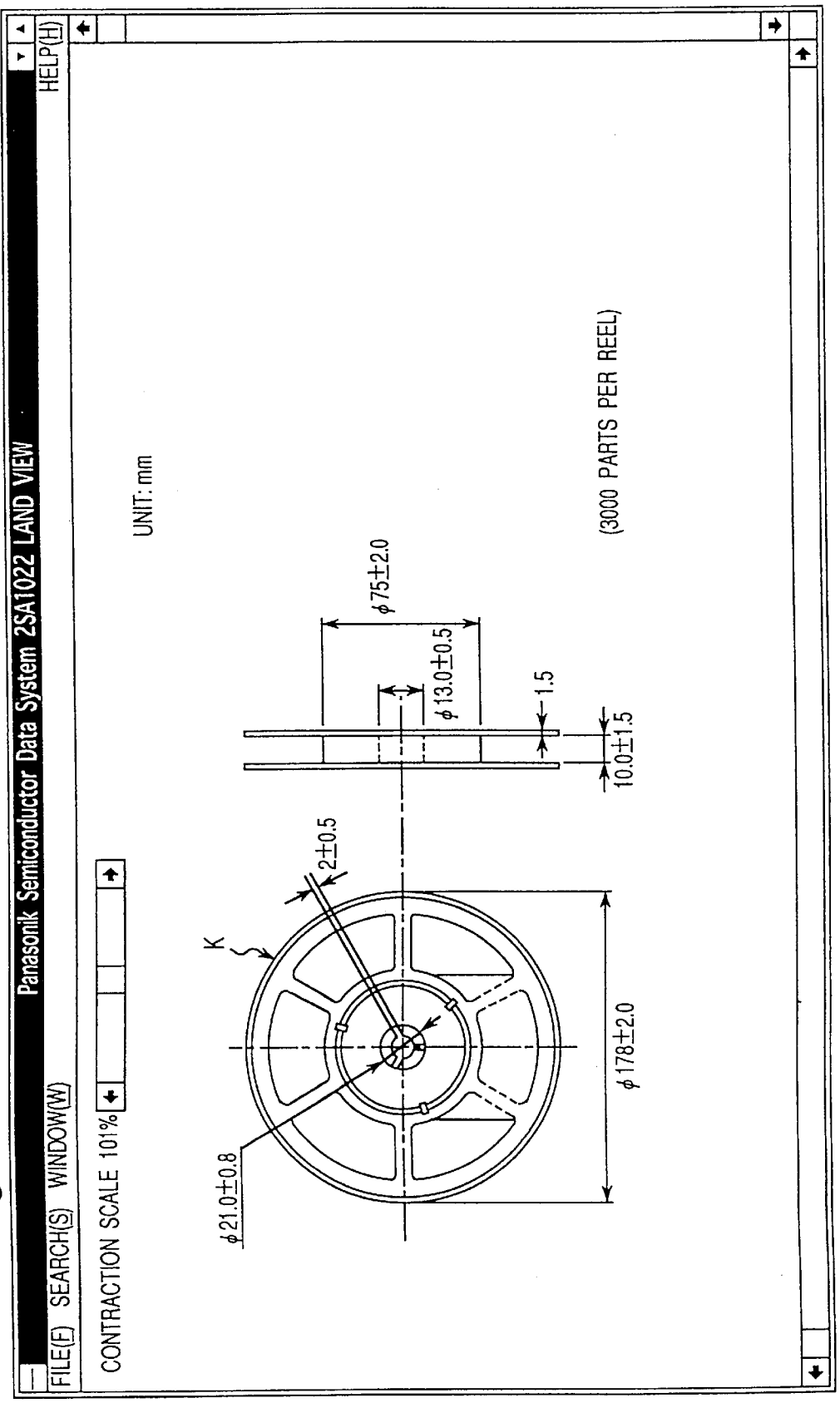
FIG. 49 is a display screen of a reel size of the transistor selected on the screen of FIG. 43.
Figure 50:
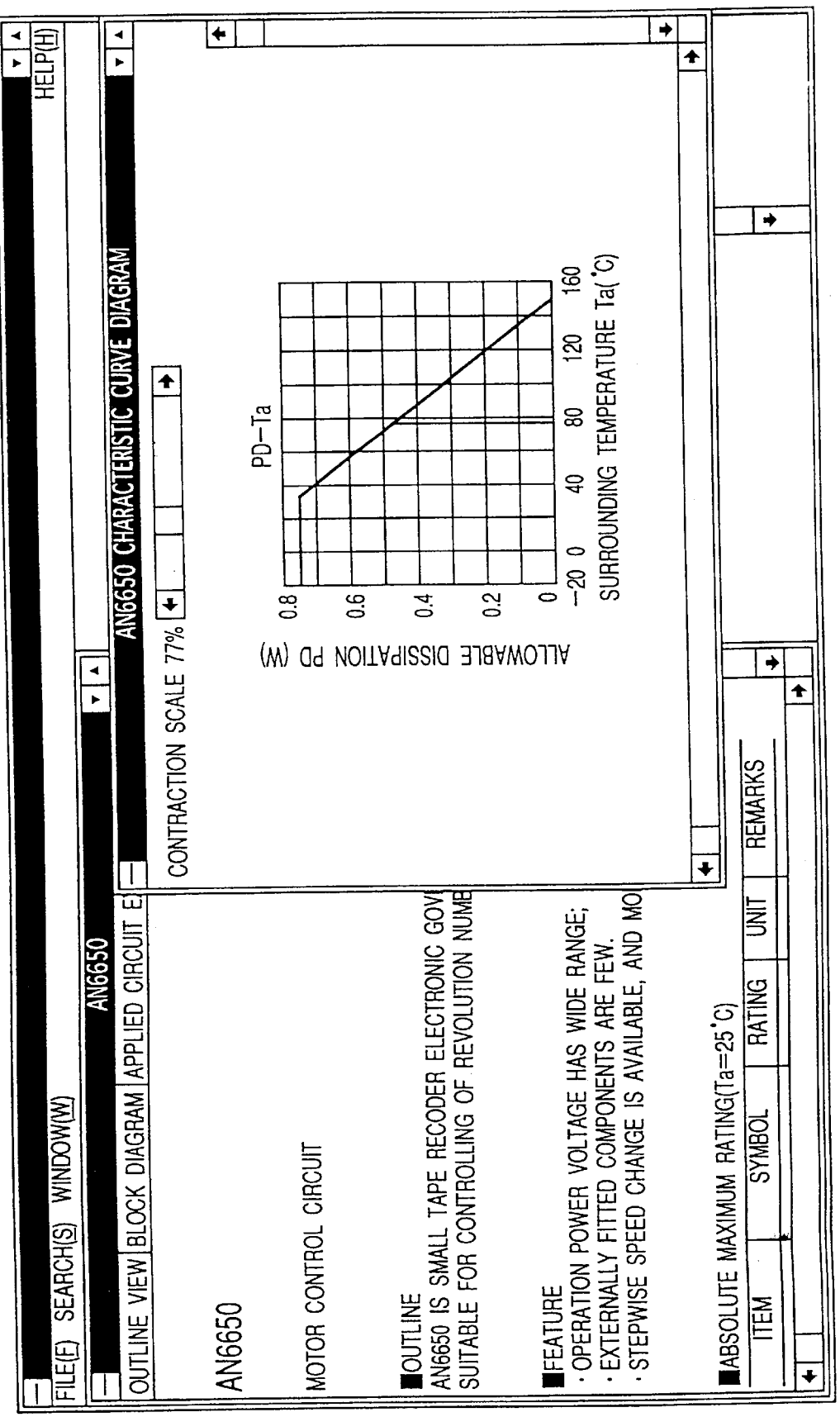
FIG. 50 is a window display screen showing data related to a characteristic curve as the characteristic curve is selected on a initial explanation screen when a motor control circuit as a different electronic component is searched.
Figure 51:
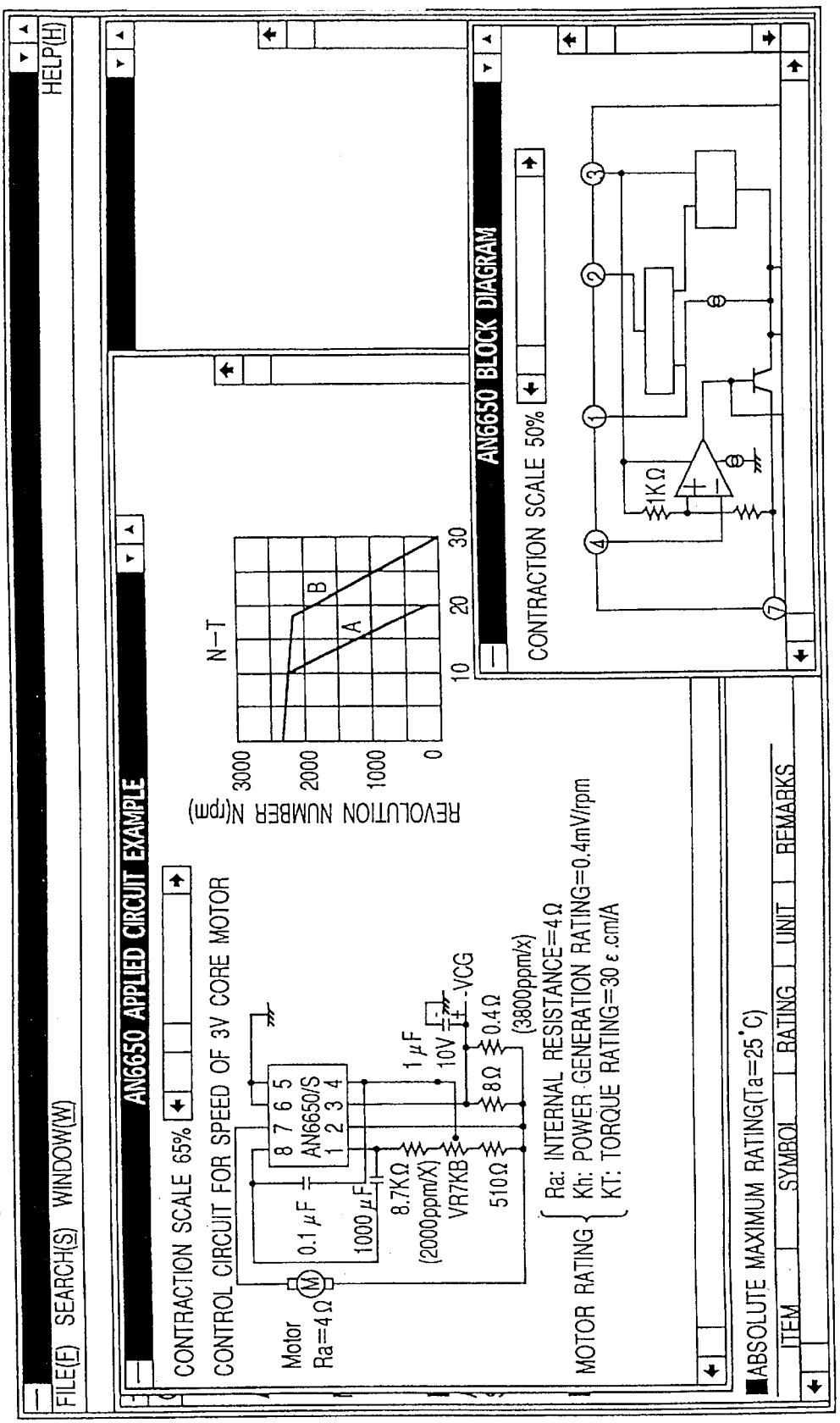
FIG. 51 shows not only a window display screen of an example of an applied circuit selected with priority on the initial explanation screen of FIG. 50, but a window display screen of a selected block diagram.

This fifth embodiment shows an example of component management in the case where electronic components accommodated in a tray 251 are supplied to the mounter as shown in FIGS. 40A–40D. In FIGS. 40A, 40B, there is provided a memory 254 from and into which accommodated component information of components accommodated in trays 251 supported by tray plates 253 is read and written by an electrical or optical reading/writing device 255 or the like, where the tray plates 253 individually support the trays 251 of a tray rack 252 so that the trays 251 can be put in and out in a plurality of stages. With this arrangement, for the selection of the tray 251 that supplies components to the mounter, information stored in the memory 254 can be read by the reading/writing device 255, by which it can be decided whether or not the tray 251 is a necessary one. Also, in a state that the tray rack 252 is loaded to the component supply unit of the mounter for component supply, mounting history as to the components accommodated in each tray 251, which is previously stored in the memory 254, as in the case described in the first embodiment, can be made usable for various types of management. In FIGS. 40C, 40D, there is provided a memory 261 that stores information related to the electronic components accommodated in the trays 251 accommodated in the tray rack 252 so that the information can be read and written collectively. In this case, the management of accommodated components in the trays 251 accommodated in the tray rack 252 can be achieved collectively.

In addition, the memory 254 provided to each tray 251 and the memory 261 provided to the tray rack 252 may also be used in combination. This can be applied also to the relationship between the component supply cassette 14 and the transfer rack 15 as described in the first embodiment.

(Sixth Embodiment)

In this sixth embodiment, as shown in FIGS. 40E–40F, the functions of the data reading device 201 and data forming device 202 are incorporated into the data processor 208 provided in the mounter 2. The data reading device 201 also reads machine data M from the data file 212 which has stored therein the characteristics of the mounter 2, and forms mounting data C with considerations of even the characteristics of the mounter 2, by using the machine data M along with the mounting position data A and component text data B similar to the case of the first embodiment.

Thus, the mounting data fitting the characteristics of the mounter can be formed for realizing more adequate mounting of components. Besides, a special data processor is not needed between the CAD system 211 for forming the mounting position data A for components and the data processor 208 of the mounter 2 because the data reading device 201 and the data forming device 202 are the data processor 208 of the mounter 2. Accordingly, the number of associated devices for forming the mounting data C can be reduced and the mounting data C into which the characteristics of the mounter 2 are incorporated can be conveniently formed with the mounter 2 itself.

According to the embodiments, mounting data for supplying components to a conventional mounter and mounting them to specified mounting positions, such as an NC program relating to the mounting positions of components, a component library relating to component recognition such as configurations, dimensions, and colors of components, and a supply library relating to component supply state in a supply unit can be formed through automatic data processing by using the component text data necessary for the mounting of various components stored together with image data in the component electronic catalog, without manual input of component data. Thus, the labor and time required for forming the mounting data can be reduced significantly.

According to the embodiment, in addition to the above, mounting data fitting even the characteristics of the mounter can be formed so that more adequate mounting of components is realized.

According to the embodiments, in addition, inspection data adequate for to-be-mounted components can also be automatically obtained, so that more proper inspection of mounting components can be attained with the necessary labor and time unchanged, and that correct component mounting can be ensured.

According to the embodiments, in addition, data out of the image data and numerical data for individual components are displayed in units of identical components on the same screen, thus lending themselves to the search and selection of components in a variety of types through the search operation. Moreover, the numerical data can be outputted to other equipment, as required, lending themselves to various types of data processing.

According to the embodiments, in addition, the input of various data can be done separately from and independently of the apparatus for forming mounting data so that changes and additions of data can be done readily. Moreover, the catalog can be shared among various mounters.

According to the embodiments, in addition, there can be advantages that the use of one storage device is not limited by the place where the mounter has been installed and that the one storage device can be shared among a large number of mounters. Additionally, the apparatus is convenient for the formation, management, change, and addition of data.

According to the embodiments, in addition, a special data processor is not needed between the data processing device for forming mounting position data for components and the control system of the mounter, so that the number of associated devices for forming the mounting data can be reduced. Besides, the mounting data into which the characteristics of the mounter are incorporated can be conveniently formed with the mounter itself.

According to the embodiments, in addition, the same functional effects as those unique to the embodiment can be exerted.

According to the embodiments, in addition, the same functional effects as those unique to the embodiments can be exerted.

According to the storage medium of the embodiments, the input of various programs for forming mounting data can be done separately from and independently of the apparatus for forming mounting data so that changes and additions of programs can be done readily. Moreover, the medium can be shared among the mounters of the same type.

According to the component mounting method and apparatus of the embodiments, various types of components can be automatically mounted by forming, through automatic data processing, mounting data for supplying the components to a conventional mounter and mounting them to specified mounting positions, the mounting data being exemplified by an NC program relating to the mounting positions of components, a component library relating to component recognition such as configuration, dimensions, and colors of components, and a supply library relating to component supply state such as arrangement of the components in a supply unit, and by using the resulting mounting data for operation control of the mounter. Thus, it is no longer necessary for persons to input various types of component text data necessary for the formation of mounting data for individual to-be-mounted components each time new circuit boards are fabricated, so that product type changes can be achieved in quite short time and that the productivity is improved.

According to the embodiments, in addition, inspection data proper for the to-be-mounted components can further be automatically obtained, so that more proper inspection of mounting components can be attained with the necessary labor and time unchanged, and that correct component mounting can be ensured.

According to the embodiments, in addition, even when a substitute component is used at an exhaustion of components, the decision as to whether or not the mounting component is appropriate can properly be made automatically responsive to this. Thus, it becomes possible to prevent such trouble that use of a substitute component may be decided as an improper component.

According to the embodiments, in addition, the accommodated component information carried by the individual component supply cassettes equipped to the mounter is automatically read by the reading device, and the control device automatically decides whether or not component-side conditions such as the components to be supplied by these component supply cassettes as well as their arrangement, comply with the component conditions set in the mounting data. Thus, it is enabled to prevent such occurrences that the mounter continues operating even with the components mis-placed, resulting in a trouble, that time and mounting operation are wasted, or that produced electronic circuit boards are faulty so as to be repaired or abolished, which would cause a production loss.

According to the embodiments, in addition, the component supply cassettes are treated and loaded/unloaded by the transfer rack collectively in the units of the specified number of component supply cassettes, giving a convenience for the replacement and resupply of components. Besides, the accommodated component information as to the individual component supply cassettes is collectively provided in the transfer rack and can be read at one place, so that the reading does not much time, contributing to an improvement in the productivity.

According to the embodiments, in addition, when a loading/unloading of replaced component supply cassettes is detected by the detector, the control device decides based on the detection whether or not the component supply cassette has been replaced with another, where if it has been replaced, the accommodated component information on the newly loaded component supply cassette is read. Thus, it is enabled to prevent such occurrences that the mounter re-operates as components have been mis-exchanged, resulting in a trouble, or that time and mounting operation are wasted.

According to the embodiments, in addition, when the component supply cassettes have been collectively replaced in the units of a specified number, the accommodated component information on all the component supply cassettes that have been collectively replaced. Thus, it is enabled to simply cope with all the cases, without discriminating which component supply cassettes have been replaced out of those that have been collectively replaced.

According to the embodiments, in addition, each time a component supply cassette is accommodated, bar codes corresponding to the component are provided to the component supply cassette. Thus, proper accommodated component information can be given to the component supply cassette simply without requiring any special device.

According to the embodiments, in addition, even if the components to be accommodated in the component supply cassette, the accommodated component information stored in the storage device may be rewritten responsive to newly loaded components. Thus, it is unnecessary to replace the device for carrying accommodated component information each time, conveniently.

According to the embodiments, in addition, the storage contents of the optical memory carried by the component supply cassette loaded to She mounter can be read sequentially by the infrared communication means located at one place. Thus, it is unnecessary to move either the reading device or the individual component supply cassettes, so that the reading can be accomplished in short time, contributing to an improvement in the productive efficiency.

According to the embodiments, in addition, by controlling various replenishment components as well as various types of carriers carrying accommodated component information corresponding to the replenishment components, each time components are accommodated in a component supply cassette, the carrier carrying component information corresponding to these components can be attached to the component supply cassette, so that changes of accommodated components or the like can be treated simply and reliably.

According to the embodiments, in addition, the component supply cassette can be made to carry various types of component information related to to-be-mounted components such as the number of used components, amount of remaining components, and conformity or inconformity of components, related well as various types of information as to the component mounting such as a component holding rate and a to-board mounting rate by a chuck or suction nozzle with respect to the total number of supplied components. Then it becomes possible to lend the various types of information to the next component mounting in determining any differences between catalog data and actual dimensions of components and the like so that more proper component supplying can be achieved, or to correct or change mounting conditions so that more proper component supplying can be achieved, allowing comprehensive control of to-be-mounted components as well as their mounted state conveniently.

According to the embodiments, in addition, a condition program that sets an optimum temperature profile for reflow-soldering of the to-be-mounted components can be formed with the data processing function of the data processor, only by including temperature characteristic data of various components in the component text data related to the to-be-mounted components. Thus, in such a case where reflow-soldering is involved in the component mounting, labor and time required to specially form the temperature files for the reflow-soldering work can be saved, and moreover any causes of trouble due to mis-input of data or the like in such separate formation of the profiles can be avoided.

The entire disclosure of Japanese Applications No. 8-12132 filed on Jan. 26, 1996, No. 8-11555 filed on Jan. 26, 1996, No. 8-11641 filed Jan. 26, 1996, No. 7-249741 filed on Sep. 27, 1995 (corresponding to International Application No. PCT/JP96/02800 filed on Sep. 27, 1996) including specifications, claims, drawings, and summaries are incorporated herein by reference in their entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

We claim:

1. A method of forming mounting data for use in controlling a component-mounting operation of a mounter, and for use with to-be-mounted components, and an electronic component-catalog having image data of various types of components and component text data necessary for component mounting including component configurations and dimensions stored therein, said method comprising:

reading component text data, corresponding to to-be-mounted components of individual mounting positions, from the electronic component-catalog according to mounting-position data related to the to-be mounted components of the individual mounting positions, wherein the mounting position data includes mounting angles for the individual mounting positions; and forming mounting data, for controlling the component-mounting operation of the mounter, according to the mounting-position data and the component text data corresponding to the to-be-mounted components.

2. A method as claimed in claim 1, further for use with components in a component supply unit, wherein the mounting data includes an NC program related to the mounting positions of the to-be-mounted components, a component library related to component recognition including configurations and dimensions of each of the to-be-mounted components, and a supply library related to component supply states including an arrangement of the components in the component supply unit.

3. A method as claimed in claim 1, wherein the mounting data is formed based on characteristic data of the mounter.

4. A method as claimed in claim 1, wherein the mounting data includes inspection data for accurate component mounting.

5. A method as claimed in claim 1, wherein the component text data includes data necessary for the component mounting including packing forms and colors of components.

6. A method as claimed in claim 1, wherein the component text data stored in the electronic component-catalog is data necessary for component mounting of various types of components, said method further comprising:

automatically data-processing the mounting-position data related to the to-be-mounted components of the individual mounting positions of a planned circuit before said reading of component text data;

finding the component text data corresponding to the to-be-mounted components of the individual mounting positions from the data of the various types of components stored in the electronic component-catalog, wherein said finding and said reading of component text data is performed according to the automatic data-processing of the mounting position data related to the to-be-mounted components of the individual mounting positions;

wherein said forming of mounting data is performed according to the mounting-position data and the found and read component text data corresponding to the to-be-mounted components of the individual mounting positions.

7. An apparatus for forming mounting data for use in controlling a component-mounting operation of a mounter, and for use with to-be-mounted components, said apparatus comprising:

an electronic component-catalog having image data of various types of components and component text data necessary for component mounting including component configurations and dimensions stored therein;

a data reader operable to read component text data corresponding to to-be-mounted components of individual mounting positions from the component text data stored in said electronic component-catalog according to mounting position data related to the to-be mounted components of the individual mounting positions, wherein the mounting position data includes mounting angles for the to-be-mounted components; and a data forming device operable to form mounting data, for controlling the component-mounting operation of the mounter, according to the mounting position data and the component text data read by said data reader in connection with the to-be-mounted components corresponding to the mounting position data.

8. An apparatus as claimed in claim 7, further for use with a display screen and other equipment, wherein said data reader is operable to read both the component text data and the image data corresponding to various types of components from said electronic component-catalog, in accordance with a search operation that displays the component text data and image data on the display screen, and to output the component text data to the other equipment with an output operation.

9. An apparatus as claimed in claim 8, wherein the component text data includes data necessary for the component mounting including packing forms and colors of components.

10. An apparatus as claimed in claim 7, wherein said electronic component-catalog is detachably connected to said apparatus.

11. An apparatus as claimed in claim 10, wherein said electronic component-catalog is operable for information transfer by communication.

12. An apparatus as claimed in claim 7, wherein said data reader and said data forming device are a data processor located in the mounter.

13. An apparatus as claimed in claim 7, wherein said data forming device is operable to form the mounting data based on characteristic data of the mounter.

14. An apparatus as claimed in claim 7, wherein said data forming device is operable to form, as the mounting data, inspection data for accurate component mounting.

15. An apparatus as claimed in claim 7, wherein:
the component text data stored in said electronic component-catalog is data necessary for component mounting of various types of components;
said data reader is further operable for automatically data-processing the mounting-position data related to the to-be-mounted components of the individual mounting positions of a planned circuit before reading the component text data, finding the component text data corresponding to the to-be-mounted components of the individual mounting positions from the data of the various types of components stored in said electronic component-catalog according to the automatic data-processing of the mounting position data related to the to-be-mounted components of the individual mounting positions; and
said data forming device is operable to form the mounting data according to the mounting-position data and the found and read component text data corresponding to the to-be-mounted components of the individual mounting positions.

16. A computer program embodied on a computer readable medium, for use with a computer, to-be-mounted components, a mounter having a component-mounting operation, and an electronic component-catalog having image data of various types of components and component text data necessary for component mounting including component configurations and dimensions stored therein, said computer program comprising:
a data reading program for instructing the computer to read component text data corresponding to to-be-mounted components of individual mounting positions from the component text data stored in the electronic component-catalog according to mounting position data related to the to-be mounted components of the individual mounting positions, wherein the mounting position data includes mounting angles for the to-be-mounted components; and
a data forming program for instructing the computer to form mounting data, for controlling the component-mounting operation of the mounter, according to the mounting position data and the component text data, read by the instruction of said data reading program, in connection with the to-be-mounted components corresponding to the mounting position data.

17. A method for mounting components for use with a mounter, to-be-mounted components, a board, and an electronic component-catalog having image data of various types of components and component text data necessary for component mounting including configurations and dimensions of components stored therein, said method comprising:
reading component text data, corresponding to to-be-mounted components of individual mounting positions, from the electronic component-catalog according to mounting-position data related to the to-be mounted components of the individual mounting positions, wherein the mounting position data includes mounting angles for the individual mounting positions;
forming mounting data according to the mounting-position data and the component text data for instructing the mounter to receive a supply of components and mount the components to specified mounting positions; and
automatically mounting the components sequentially to the specified mounting positions of the board by controlling operation of the mounter based on the formed mounting data.

18. A method as claimed in claim 17, further for use with components in a component supply unit, wherein the mounting data includes an NC program related to the mounting positions of the to-be-mounted components, a component library related to component recognition including configurations and dimensions of each of the to-be-mounted components, and a supply library related to component supply states including an arrangement of the components in the component supply unit.

19. A method as claimed in claim 17, wherein the mounting data includes inspection data for correct component mounting, said method further comprising inspecting the to-be-mounted components based on the inspection data.

20. A method as claimed in claim 17, wherein the component text data stored in the electronic component-catalog is data necessary for component mounting of various types of components, said method further comprising:
automatically data-processing the mounting-position data related to the to-be-mounted components of the individual mounting positions of a planned circuit before said reading of component text data;
finding the component text data corresponding to the to-be-mounted components of the individual mounting positions from the data of the various types of components stored in the electronic component-catalog, wherein said finding and said reading of component text data is performed according to the automatic data-processing of the mounting position data related to the to-be-mounted components of the individual mounting positions;
wherein said forming of mounting data is performed according to the mounting-position data and the found and read component text data corresponding to the to-be-mounted components of the individual mounting positions.

21. An apparatus for mounting components for use with to-be-mounted components, said apparatus comprising:
a mounter;
a memory operable to store component text data necessary for component mounting including component configurations and dimensions;
a data reader operable to read component text data corresponding to to-be-mounted components of individual mounting positions from the component text data stored in said memory according to mounting position data related to the to-be mounted components of the individual mounting positions, wherein the mounting position data includes mounting angles for the to-be-mounted components;

a data forming device operable to form mounting data, according to the mounting position data and the component text data read by said data reader in connection with the to-be-mounted components corresponding to the mounting position data, for instructing said mounter to receive a supply of components and mount the components to specified mounting positions; and a controller operable to control operations of said mounter upon reception of the mounting data from said data forming device.

22. An apparatus as claimed in claim 21, wherein said controller includes an internal or external storage device which is operable to store substitute component data of substitute components including equivalent components or compatible other-company components that can be substituted for the to-be-mounted components, wherein said controller is operable to decide whether a component is a corresponding substitute, based on the substitute component data, when a component has been decided to be inappropriate.

23. An apparatus as claimed in claim 21, further comprising:

a component supply cassette having a supply of components and accommodated component information related to the supply of components; and a reading device operable to read the accommodated component information from said component supply cassette;

wherein said mounter is operable to receive the supply of components from said component supply cassette and said controller is operable to decide appropriateness or inappropriateness of the supply of components, placed components, or component arrangement, according to the information read by said reading device.

24. An apparatus as claimed in claim 23, further comprising:

a plurality of said component supply cassette, wherein said component supply cassettes are replaceable in units of a specified number of component supply cassettes; and a transfer rack operable to handle component supply cassettes in an amount equal to the specified number of component supply cassettes and including the accommodated component information on said transfer rack, and the accommodated component information is related to the supply of components of said component supply cassettes handled by said transfer rack.

25. An apparatus as claimed in claim 23, further comprising a detector operable to detect a loading or unloading of said component supply cassette, wherein said controller is operable to read the accommodated component information from said component supply cassette and decide whether the supply of components is appropriate or inappropriate when said detector detects a loading of said component supply cassette.

26. An apparatus as claimed in claim 25, further comprising:

a plurality of said component supply cassette, wherein said component supply cassettes are replaceable in units of a specified number of component supply cassettes;

wherein said controller is operable to read the accommodated component information from all of the component supply cassettes of a unit of component supply cassettes that has been loaded as a replacement.

27. An apparatus as claimed in claim 23, wherein the accommodated component information is indicated by bar codes.

28. An apparatus as claimed in claim 27, further comprising a carrier operable to be loaded onto said component supply cassette and unloaded from said component supply cassette, wherein the accommodated component information is carried by said carrier.

29. An apparatus as claimed in claim 23, further comprising a readable/writable storage medium, wherein the accommodated component information is information stored in said readable/writable storage medium.

30. An apparatus as claimed in claim 29, wherein said readable/writable storage medium is an optical memory operable to be read by infrared communication.

31. An apparatus as claimed in claim 29, further comprising:

a writing device operable to write various types of information into said readable/writable storage medium and to update written contents of said readable/writable storage medium;

wherein said controller is operable to manage various types of performance information including a number of used components mounted by said mounter, an amount of remaining components, and conformity or non-conformity of components, and component mounting information related to the component mounting operation of said mounter including a component holding rate and a to-board mounting rate by a chuck or suction nozzle with respect to a total number of components to be supplied, and said controller is further operable to instruct said writing device, prior to a removal of the component supply cassette, to write the performance information or the component mounting information into said readable/writable storage medium or to update the written contents at a time of removal of the component supply cassette.

32. An apparatus as claimed in claim 21, wherein the component text data includes temperature characteristics of components, and said data forming device is operable to automatically form a condition program, that sets an optimum temperature profile for reflow-soldering the to-be-mounted components, from the temperature characteristics of the individual to-be-mounted components.

33. An apparatus as claimed in claim 21, wherein:

the component text data stored in said electronic component-catalog is data necessary for component mounting of various types of components;

said data reader is further operable for automatically data-processing the mounting-position data related to the to-be-mounted components of the individual mounting positions of a planned circuit before reading the component text data, finding the component text data corresponding to the to-be-mounted components of the individual mounting positions from the data of the various types of components stored in said electronic component-catalog according to the automatic data-processing of the mounting position data related to the to-be-mounted components of the individual mounting positions; and said data forming device is operable to form the mounting data according to the mounting-position data and the found and read component text data corresponding to the to-be-mounted components of the individual mounting positions.

* * * * *

UNITED STATES PATENT AND TRADEMARK OFFICE
CERTIFICATE OF CORRECTION

PATENT NO.   :   6,002,650
DATED        :   December 14, 1999
INVENTOR(S)  :   Takeshi KURIBAYASHI et al.

It is certified that error appears in the above-identified patent and that said Letters Patent is hereby corrected as shown below:

In the Assignee, change "Matsushita Electric Co., Ltd." to --Matsushita Electric Industrial Co., Ltd.--.

Signed and Sealed this

Nineteenth Day of September, 2000

Attest:

Q. TODD DICKINSON

*Attesting Officer*     *Director of Patents and Trademarks*